US005395721A

United States Patent [19]

Kato et al.

[11] Patent Number: 5,395,721

[45] Date of Patent: Mar. 7, 1995

[54] ELECTROPHOTOGRAPHIC MATERIAL FOR COLOR PROOFING

[75] Inventors: Eiichi Kato; Sadao Osawa, both of Shizuoka, Japan

[73] Assignee: Fuji Photo Film Co., Ltd., Kanagawa, Japan

[21] Appl. No.: 24,770

[22] Filed: Mar. 2, 1993

[30] Foreign Application Priority Data

| | | | |
|---|---|---|---|
| Mar. 2, 1992 | [JP] | Japan | 4-044447 |
| Jul. 1, 1992 | [JP] | Japan | 4-174383 |

[51] Int. Cl.$^6$ .......... G03G 13/01

[52] U.S. Cl. .......... 430/49; 430/126

[58] Field of Search .......... 430/49, 96, 905, 126

[56] References Cited

U.S. PATENT DOCUMENTS

| | | | |
|---|---|---|---|
| 4,600,669 | 7/1986 | Ng et al. | 430/47 |
| 4,686,163 | 8/1987 | Ng et al. | 430/47 |
| 4,952,475 | 8/1990 | Kato et al. | 430/96 |
| 4,954,407 | 9/1990 | Kato et al. | 430/96 |
| 4,968,572 | 11/1990 | Kato et al. | 430/96 |
| 5,066,559 | 11/1991 | Elmasry et al. | 430/111 |
| 5,134,051 | 7/1992 | Kato et al. | 430/96 |
| 5,154,997 | 10/1992 | Kato et al. | 430/96 |
| 5,254,422 | 10/1993 | Kato et al. | 430/96 |

FOREIGN PATENT DOCUMENTS

| | | |
|---|---|---|
| 4833183 | 10/1973 | Japan . |
| 63-217354 | 9/1988 | Japan . |
| 1112264 | 4/1989 | Japan . |
| 1211766 | 8/1989 | Japan . |
| 1281464 | 11/1989 | Japan . |
| 0311347 | 1/1991 | Japan . |

*Primary Examiner*—John Goodrow

*Attorney, Agent, or Firm*—Sughrue, Mion, Zinn, Macpeak & Seas

[57] ABSTRACT

An electrophotographic material for color proofing which comprises a substrate, a photoconductive layer and a transfer layer in this order, wherein said photoconductive layer comprises a polymer (P) which contains at least one polymer segment (x) containing not less than 50% by weight of units having fluorine atom(s) and/or silicon atom(s) and at least one polymer segment (Y) containing units having photosetting and/or thermosetting group(s); a polymer (Q) which contains not less than 30% by weight of units represented by the formula I $$—CH(a_1)—C(a_2)(COOR_3)—$$

wherein $a_1$ and $a_2$ each represents independently a hydrogen atom, $R_3$ represents a hydrocarbon group; and contains at least one polar group such as $—PO_3H_2$, $—SO_3H$, —COOH; and a polymer (R) containing at least one unit having photo and/or thermosetting group(s), the polymer (P) is present at least in the region near the surface facing said transfer layer, and the surface of said photoconductive layer which contacts with the transfer layer has tack strength of not more than 150 gram•force.

17 Claims, 1 Drawing Sheet

ELECTROPHOTOGRAPHIC MATERIAL FOR COLOR PROOFING

BACKGROUND OF THE INVENTION

The present invention relates to an electrophotographic material for color proofing, in particular an improvement in a photoconductive layer of the electrophotographic material for color proofing (hereinafter, sometimes referred to as a light-sensitive material).

PS plates have dominantly been used for multicolor printing because of their excellence in quality, printing durability, dimensional stability and resistance to contamination. PS plates are formed by applying a photosensitive layer containing a diazo resin or o-quinone diazide as a main component onto an aluminum substrate whose surface has been treated to improve hydrophilic property thereof. The PS plates are exposed to UV rays through a color-separated and half tone film, developed to remove the photosensitive layer in non-image areas to reveal the surface of the hydrophilic aluminium plate, whereby, printing plates are obtained. A multicolor image can be obtained by mounting each printing plate prepared by the above process for each color on a printing machine and printing using an ink corresponding to each color on a sheet of same printing paper.

After it is confirmed that a series of processes of editing, plate making and printing such as input of characters, layout, color designation, etc., are conducted as designated, and that there is no difference between color tone reproduction, etc. obtained and one designated by an orderer, necessary corrections are made, and then regular printing is conducted. This step is called press correction. The former is called "first proof", and it is conducted for the purpose of checking each process in a printing company as mentioned above. The latter is called "second proof", and it is conducted to obtain an acceptance by the orderer. The second proof is conducted in almost the same manner as one for regular printing, including the kind of inks and printing paper to be used. The resultant proof has almost the same quality as one of printed matter obtained in regular printing. Proof printing using regular printing paper to be used in regular printing is called "regular correction".

Color designation and tone reproduction of a color photograph should be confirmed and corrected for each color. Especially, the proof for the orderer is generally conducted several times repeatedly. Heretofore, proof printing has been conducted using a color separated and half tone film to be used in regular printing, and a PS plate which is relatively low in cost and printing durability, for example, with the proof press, whose mechanism is similar to a press machine, of the name of "the flat bed four color proof press" made by DAINIPPON SCREEN Co., Ltd. The method mentioned above is called "press proof", which is not convenient, since it takes much time to prepare, and requires skill for operation, and is difficult to keep quality constant.

There have been proposed some methods for color proofing which do not use the proof press having a mechanism similar to one of a press machine, and therefore are easier to conduct and stable in printing. They are preferably used because of the advantages such as easier operation and stability after being used repeatedly. It is called "off press proof", and typical manners and systems thereof are disclosed in Bulletin of the Printing Society of Japan 24, No. 3, page 32 (1989). Examples of the systems include systems available in the trade names of "COLOR ART" by Fuji Photo Film Co.,Ltd., "CROMALIN" by Dupont., and "MATCHPRINT" by 3M. The systems use a color separated film, but do not use the proof press mentioned above.

The color separated film is generally prepared using a color scanner. The scanner reads data from original, and conducts color separation, formation of half tone, and tone reproduction control to output digital data. A silver halide film is scan-exposed with laser beams modulated by the digital data, developed, fixed and dried to obtain a positive or negative color separated film for multi color printing.

Recently, an electronic plate making system called "total color scanner" has been developed and been utilized. The system conducts procedures up to retouching or plate collecting therein and therefore the system requires first proof capable of examining a resultant quality, more rapidly than that heretofore in use. If resultant qualities such as a manner, a layout, quality of color separation for some patterns, tone reproduction are judged with a :ress correction method heretofore in use, efficiency of the system will be seriously lowered, since it takes a long time for output to color separation film and the preparation of press proof or off press proof as prior art proofing.

Since an image data in the system is available as a digital information, some direct digital color proof systems which do not use proofing heretofore in use have been proposed. Details thereof are described in "Printing Information", April, page 2 et seq.(1991). Examples of such systems include a silver halide system, an electrostatic toner system (a wet electrophotographic system), an ink-jet system and a thermal sublimation transfer system.

Among them, the wet electrophotographic system is especially excellent in precision, image quality and tone reproduction and advantageous for the reason that any type of paper can be used for the system so that regular paper correction can be conducted, since, in the system, a photoconductive element is charged, exposed to laser beam and developed with every color toner comprising a pigment having four colors, i.e. cyan, magenta, yellow and black dispersed in an electrical insulating liquid, and then, the resulting toner image is transferred.

However, it is quite difficult to transfer a toner image from the surface of the photosensitive plate directly to regular paper. Japanese Patent laid open application (hereinafter reffered to as "J. P. KOKAI") No. Hei 2-272469 discloses a technique which has solved such problems, but includes several steps.

There have been proposed to provide a releasable transfer layer on the surface of the photosensitive element, to form a toner image on the transfer layer and to transfer the image together with the transfer layer to regular paper in J. P. KOKAI Nos. Sho 61-174557 (Japanese Patent publication Hei 2-43185), Hei 1-112264, Hei 1-281464, and Hei 3-11347. Among them, the system disclosed in J.P. KOKAI No. Sho 61-174557 is only practically used. However, in the system, photoconductive layer is exposed to light through a transparent substrate (a polyethylene terephthalate film), and therefore, the system requires that the photoconductive layer is also transparent. In addition, it is not reusable, Therefore, the system is expensive.

J.P. KOKAI Nos. Hei 1-112264 and Hei 1-281464 disclose an image forming method or a color printing method which uses a photosensitive paper comprising a photosensitive element on which a releasable layer and an adhesive layer are applied in order, and which is characterized in that a toner image is developed and transferred to regular paper with the releasable layer.

However, it is difficult to form such a photosensitive layer uniformly with a practical size and it is also difficult to transfer a toner image without damage.

The same will apply to the method disclosed in J.P. KOKAI No. Hei 3-11347 which uses a recording medium wherein a releasable overcoating layer is applied onto a photoconductive layer.

In addition to the problem of reduced quality of the image due to defect of transfer of the toner image as explained above, the problem of reduced quality of the image due to defect occuring while a toner image is electrophotographically formed, especially, due to lowering of electrostatic properties is desired to be solved.

We have studied properties of electrophotographic materials comprising a known photoconductive layer under various environmental condition for imaging (e.g. higher or lower temperature, or higher or lower humidity), and have found that electrophotographic properties of the materials (especially dark charge retention property and photosensitivity) were lowered, and the materials could not provide stable and good images in some cases.

When electrophotographic materials for color proofing which can cope with a direct digital system are exposed with semiconductor laser beams by a scanning exposure method, they are required to have higher electrophotographic properties such as electrostatic properties, especially dark charge retention property and photosensitivity, since longer exposure time is necessary and exposure intensity is limited in such a process in compared with a conventional overall simultaneous exposure system using visible lights.

When the above mentioned known electrophotographic materials which is known were used in such a system, quality of resultant images were lowered. Namely, in the resultant images, background contamination occured, fine lines disappeared, and batter of characters occured.

SUMMARY OF THE INVENTION

An object of the present invention is to provide an electrophotographic material for color proofing wherein the problem mentioned above is solved.

Another object of the present invention is to provide a proof without color drift and with excellent precision and image quality easily and constantly.

A further object of the present invention is to provide a photoconductive layer which is easily prepared with low cost and has stable electrophotographic properties.

A still further object of the present invention is to provide a method for preparing a color proofing wherein a toner image is easily transferred with a simple transfer apparatus, and a proof can be prepared on any type of transfer paper.

A still further object of the present invention is to provide an electrophotographic material for color proofing which can provide clear and good images even if imaging is conducted in unusual environment such as higher or lower temperature, or higher or lower humidity.

A still further object of the present invention is to provide an electrophotographic material for color proofing which can provide a color proof having stable and excellent quality of images irrespective of kinds of sensitizing dyes used in the photoconductive layer, and can provide excellent electrostatic properties even when it is scan-exposed using semiconductor laser beams.

The problems mentioned above are solved by using an electrophoto 1. An electrophotographic material for color proofing which comprises a substrate, a photoconductive layer and a transfer layer in this order, and is used for preparing a color proof in a process wherein at least one color toner image is electrophotographically formed on the transfer layer and then transferred together with said transfer layer to a sheet material to prepare the color proof, wherein said photoconductive layer comprises a polymer (P) selected from the group consisting of the following polymers ($P_1$), ($P_2$), ($P_3$) and ($P_4$); a polymer (Q) selected from the group consisting of the following polymers($Q_1$) and ($Q_2$); and a polymer (R) containing at least one unit having photo and/or thermosetting group(s), the polymer (P) is present at least in the region near the surface facing said transfer layer, and the surface of said photoconductive layer which contacts with the transfer layer has tack strength of not more than 150 gram•force, which is measured by Pressure Sensitive Tape and Sheet Test of JIS Z0237-1980, the polymer ($P_1$):

a linear block copolymer which contains at least one polymer segment (X) Containing not less than 50% by weight of units having fluorine atom(s) and/or silicon atom(s) and at least one polymer segment (Y) containing units having photosetting and/or thermosetting group(s);

the polymer ($P_2$):

a star type copolymer which contains at least three AB type block copolymer chains consisting of a polymer segment (X) containing not less than 50% by weight of units having fluorine atom(s) and/or silicon atom(s) and a polymer segment (Y) containing units having photosetting and/or thermosetting group(s), and said block copolymer chains are bonded through an organic group (Z);

the polymer ($P_3$):

a graft copolymer which contains at least one polymer segment (X) containing not less than 50% by weight of units having fluorine atom(s) and/or silicon atom(s) and at least one polymer segment (Y) containing units having photosetting and/or thermosetting group(s);

the polymer ($P_4$):

an AB type or ABA type block copolymer which contains at least one polymer segment (X) containing not less than 50% by weight of units having fluorine atom(s) and/or silicon atom(s) and at least one polymer segment (Y) containing units having,-photosetting and/or thermosetting group(s), wherein at least one said polymer segment (X) is the following graft type polymer segment (X'), at least one said polymer segment (Y) is the following graft type polymer segment (Y'), or at least one said polymer segment (X) is the following graft type polymer segment (X') and at least one said polymer segment (Y) is the following graft type polymer segment (Y'): The graft type polymer segment (X'): a polymer segment which has a weit-average molecular weight of $1\times10^3\sim2\times10^4$, and contains at least one macromonomer segment ($M_A$) which contains not less than 50% by weight of units having fluorine atom(s) and/or silicon atom(s);

the graft type polymer segment (Y'): a polymer segment which has a weit-average molecular weight of $1\times10^3\sim2\times10^4$, and contains at least one macromonomer segment ($M_B$) which does not contain units having fluorine atom(s) and/or silicon atom(s);

the polymer ($Q_1$):

a homopolymer or a random copolymer which has a weight-average molecular weight of $1\times10^3\sim2\times10^4$; contains not less than 30% by weight of units represented by the formula I $$—CH(a_1)—C(a_2)(COOR_3)—$$

wherein aand $a_2$ each represents independently a hydrogen atom, a halogen atom, a cyano group or a hydrocarbon group, $R_3$ represents a hydrocarbon group; and contains at least one polar group selected from the group consisting of $—PO_3H_2$, $—SO_3H$, —COOH, $—PO(OH)(R_1)$ wherein $R_1$ is a hydrocarbon group or $—OR_2$ ($R_2$ is a hydrocarbon group), and a residue of a cyclic anhydride, the polymer ($Q_2$):

a linear block copolymer which has a weight-average molecular weight of $1\times10^3\sim2\times10^4$; and contains at least one segment (M) containing not less than 30% by weight of units of said formula I and at least one segment (N) having at least one polar group selected from the group consisting of $—PO_3H_2$, $—SO_3H$, —COOH, $—PO(OH)(R_1)$ wherein $R_1$ is a hydrocarbon group or $—OR_2$ ($R_2$ is a hydrocarbon group), and a residue of a cyclic anhydride.

A photoconductive layer of the present invention may be any layer wherein a photoconductive compound is dispersed in a binder or a binder resin. Namely, there may be used a single layer type consisting of only one layer or a multilayer type (or function separated type) comprising a charge generating layer containing a photoconductive compound dispersed therein and a charge transporting layer. It is most important in the present invention that the polymer (P) is distributed in the region near the surface facing the transfer layer, and the surface has improved releasability.

In the function separated type photoconductive layer, the charge transporting layer which contacts with the transfer layer may contain the polymer (P) and the polymer (R), and the charge generating layer may contain the photoconductive compound and the polymer (Q). Otherwise, in the function separated type photoconductive layer, the charge transporting layer which contacts with the transfer layer may contain the polymer (P), the polymer (Q), the polymer (R) and the photoconductive compound.

The polymer (P) is preferably contained in the layer which contacts with the transfer layer in an amount of 1 to 30% by weight based on the total weight of the layer.

The polymer (Q) is preferably contained in the layer containing the photoconductive compound in an amount of 1 to 100 parts by weight, preferably 3 to 50 parts by weight per 100 parts by weight of the photoconductive compound.

The polymer (R) is preferably contained in the layer which contacts with the transfer layer in an amount of 5 to 99.1% by weight based on the total weight of the layer.

Binder or binder resin is defined in the specification of the present application, as a resin forming a matrix in which a photoconductive compound is dispersed, including the polymer (P), the polymer (Q), and the polymer (R), and other resins which may optionally be present in the photoconductive layer.

Preferably, the photoconductive layer of the present invention contains photosetting and/or thermosetting agent. The photosetting and/or thermosetting agent is defined in the specification of the present application, as a compound, an oligomer or polymer which can be cured by at least one of light and heat, or a crosslinking agent.

The present invention further relates to a process for forming a color proof wherein at least one color toner image is electrophotographically formed on the electrophotographic material for color proofing which comprises a substrate, a photoconductive layer and a transfer layer in this order, and then transferred together with said transfer layer to a sheet material to prepare the color proof.

Figure 1:
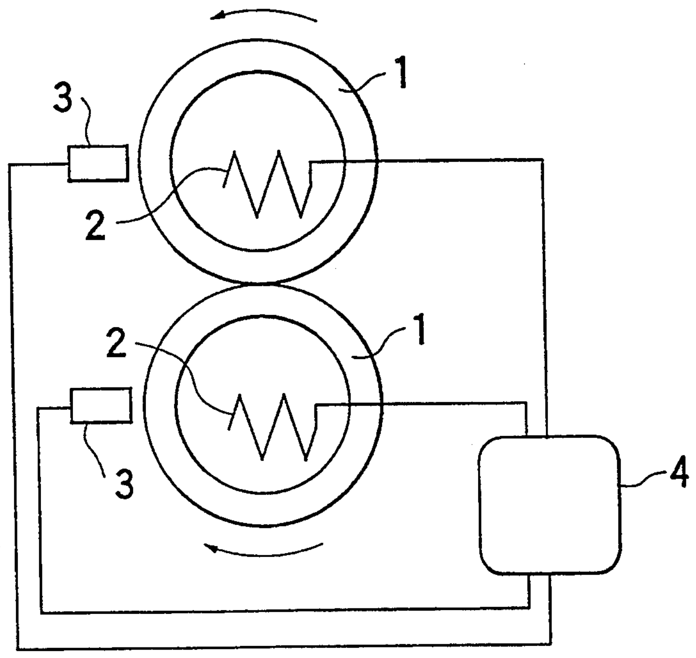
FIG. 1 illustrates schematically a heat transfer apparatus used in the present invention.

1 is a metalic roller coated with a rubber; 2 is a build-in heater; 3 is a means for detecting a surface temperature; 4 is a temperature Controller.

DETAILED EXPLANATION OF THE INVENTION

The presence of the polymer (P) in the region near the surface facing the transfer layer imparts the releasability to the photoconductive layer so that the transfer layer can easily be peeled-off from the photoconductive layer.

When the composition for formation of the photoconductive layer containing the polymers (P), the polymers (Q) and the polymers (R) is applied to the substrate, the polymer (P) migrates to the top surface of the layer, and is condensed there to impart the releasability to the surface. Further, the polymer (P) is orientated putting the segment (X) toward the transfer layer and putting the segment (Y) toward inside of the photoconductive layer, since segment (Y) has high compatibility with the polymer (R). Thus, the segment (X) provides the releasability to the surface. The segment (Y) keeps the polymer (P) near the surface in cooperation with the polymer (R). In other words, an anchor effect is attained by the polymer (P) and the polymer (R).

In addition, since the polymer (R) and the segment (Y) of the polymer (P) contain photo and/or thermosetting groups, and preferably, the photoconductive layer contains the photo and/or thermosetting agent, both the polymer (p) and the polymer (R) are cured by light or heat and the above mentioned orientation of the polymer (P) can be fixed.

As the result, when the transfer layer is coated on the photoconductive layer, migration of the polymer (P) to the transfer layer is inhibited to keep the interface between the transfer layer and the photoconductive layer clear.

Accordingly, when the electrophotographic material for color proofing of the present invention is used for preparing a color proof, a multi-color toner image formed electrophotographically is transferred together with the transfer layer to a sheet material to prepare the color proof.

Further, a solvent used for coating a transfer layer may be selected depending on kinds of a thermoplastic resin used in the transfer layer. However, since some solvents have high solvating ability with binders of the photoconductive layer, they affect adversely the dispersion of the polymer (P) in the photoconductive layer resulting in lowering of electrophotographic properties such as background contamination and deterioration of image quality.

The above problem is solved by crosslinking of binders in the photoconductive layer of the present invention to impart solvent resistance thereto.

Since the layer containing the photoconductive compound contains the polymer (Q) as a binder, the photoconductive compound can be finely divided and dispersed uniformly in the layer. Further, even when the photoconductive compound is spectrally sensitized by a sensitizing dye, the polymer (Q) can interact with the photoconductive compound sufficiently irrespective of the kind of the sensitizing dye. In particular, in the system of the present invention, the photoconductive compound can also interact sufficiently with a sensitizing dye for semiconductor laser beams, whereas it cannot interact with the dye in electrophotographic materials using conventional binder resins.

Although the present invention is not restricted by any theories, the above effect seems to be attained by the fact that the polymer (Q) is adsorbed on the surface of the photoconductive compound particles without disturbing the interaction between the sensitizing dye and the photoconductive compound, and keeps the dye coating on the surface of the photoconductive compound particles in good condition. As the result, it seems that electrophotographic properties can be kept good and stable even when the environment condition changes significantly, for example to higher or lower temperature, or higher or lower humidity.

When the photoconductive layer is the single layer type, a photoconductive compound, the polymer (Q), the polymer (R), and a small amount of the polymer (P) are present together in one layer. In such multi-components layer, the polymer (Q) can also interact with the photoconductive compound sufficiently without being disturbed by the polymer (R) to impart excellent electrostatic properties to the layer. The polymer (P) can also migrate to the top surface of the layer to impart excellent releasability to the surface of the layer.

The releasability of the photoconductive layer of the present invention was evalueted by tack strength measured by Pressure Sensitive Tape and Sheet Test of JIS Z0237-1980. The tack strength may be not more than 150 gram•force (g·f), preferably not more than 100 g·f, especially not more than 50 g·f in order to obtain good releasability of the photoconductive layer.

Pressure Sensitive Tape and Sheet Test of JIS Z0237-1980 is conducted using the electrophotographic material for color proofing of the present invention wherein the transfer layer is not formed as the test plate and a pressure sensitive tape of the 6 mm wide are used for measuring in a peeling rate of 120 mm/min. Tack strength is calculated by converting the value measured with the tape of the 6 mm wide to the value for a tape of the 10 mm.

The tack strength of the surface of the photoconductive layer after the transfer layer was formed and peeled off is equivalent to one of the surface of the photoconductive layer before the transfer layer is formed.

The substrate, the photoconductive layer, and the transfer layerof the electrophotographic materials for color proofing of the present invention will be detailed below.

(The substrate)

The substrate may be a known substrate. Preferably, the substrate is photoconductive. Examples of the photoconductive substrate include: a substrate made of metal, paper, or plastic, which is treated so as to get conductivity, for example, by being impregnated with a material having low insulation resistivity; a substrate wherein conductivity is imparted to the reverse side thereof (the opposite side to the side on which the photosensitive layer is applied), and at least one coating is applied thereon, for example, in order to inhibit curling; a substrate wherein a water proof adhesive layer is applied on the surface thereof; a substrate wherein at least one precoat layer is optionally applied on the latter substrate; and a substrate which is a laminate on paper of a plastic sheet having conductivity on which a material such as aluminium has been vapor-deposited.

Examples of a conductive substrate or a substrate to which conductivity is imparted are described in the following references: Yukio Sakamoto, Electrophotographics,14, (No. 1), pages 2–11, (1975); Hiroyuki Moriga, Chemistry of special papers, Polymer Publishers (1975); M. F. Hoover, J. Macromol. Sci. Chem. A-4 (6), 1327–1417 (1970).

(The photoconductive layer)
(The polymer (p))

The polymer (P) is selected from the group consisting of the polymers $(P_1)$, $(P_2)$, $(P_3)$ and $(P_4)$. All of them are block copolymers comprising the segment (X) and the segment (Y).

Preferably, the segment (X) contains not less than 80% by weight, especially not less than 90% by weight of the units having fluorine atom(s) and/or silicon atom(s) based on the total weight of the segment (X). Preferably, the segment (Y) contains 1 to 60% by Weight, especially 5 to 40% by weight of the units having the photo and/or thermosetting group(s) based on the total weight of the segment (Y).

The ratio by weight of the segment (X) to the segment (Y) in the polymer (P) may be 5–95 to 95–5, preferably 10–90 to 90–10.

The unit having fluorine atom(s) and/or silicon atom(s) may preferably contain at least three fluorine atoms if it does not contain a silicon atom. It may preferably contain at least two silicon atoms if it does not contain a fluorine atom. Further it may contain at least one fluorine atom and at least one silicon atom, if it contains both of fluorine and silicon atoms.

(The polymer $(P_1)$)

The following illustrates the polymer $(P_1)$.

The polymer $(P_1)$ is a linear block copolymer which contains at least one polymer segment (X) containing not less than 50% by weight of units having fluorine atom(s) and/or silicon atom(s) and at least one polymer segment (Y) containing units having photosetting and/or thermosetting group(s);

The polymer $(P_1)$ may be any type of linear block copolymers, such as AB type block copolymer (such as (X)-(Y)) or multi blocked polymer thereof, ABA type block copolymer ((such as (X)-(Y)-(X) or (Y)-(x)-(Y)).

Weight-average molecular weight of the polymer ($P_1$) may be $5\times10^3$ to $1\times10^6$, preferably $1\times10^4$ to $5\times10^5$. Weight-average molecular weight of segment (X) in the polymer ($P_1$) may be not less than $1\times10^3$.

(The polymer ($P_2$))

The following description illustrates the polymer ($P_2$).

The polymer ($P_2$) is a star type copolymer which contains at least three AB type block copolymer chains consisting of at least one polymer segment (X) containing not less than 50% by weight of units having fluorine atom(s) and/or silicon atom(s) and at least one polymer segment (Y) containing units having photosetting and/or thermosetting group(s), and said block copolymer chains are bonded through an organic group (Z).

The segments (X) and (Y) may be present in AB block polymer chain of the star type copolymer ($P_2$) in any order. Namely, the polymer ($P_2$) may have the following formulae:

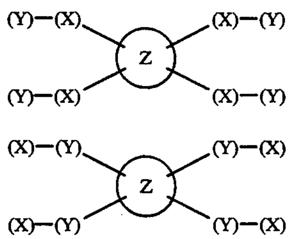

(Z is the organic group (Z), (X) is the segment (X), and (Y) is the segment (Y)).

At most fifteen, preferably not more than ten of AB type block copolymers may be linked to the organic group (Z).

Weight-average molecular weight of the polymer ($P_2$) may be $5\times10^3$ to $1\times10^6$, preferably $1\times10^4$ to $5\times10^5$. Weight-average molecular weight of the segment (X) in the polymer ($P_2$) is preferably not less than $1\times10^3$.

The organic group (Z) may be any type of molecules having molecular weight of not more than 1000. Examples of the organic groups include hydrocarbon groups having not less than three valency such as the following groups.

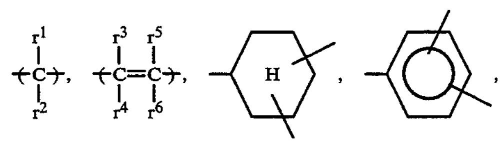

($r^1$ to $r^6$ each represents independently a single bond, a hydrogen atom or a hydrocarbon group, provided that at least one of $r^1$ and $r^2$ and at least one of $r^3$ to $r^6$ represent a single bond or a group having a valency of not less than 2.

These hydrocarbon groups may be present either solely or in combination. In the latter case, the organic group (Z) may further contain linking group(s) such as —O—, —S—, —N($r^7$)—, —COO—, —CON($r^7$)—, —$SO_2$—, —$SO_2N(r^7)$— ($r^7$ each represents independently a hydrogen atom or a hydrocarbon group), —NHCOO—, —NHCONH—, and a residue of a heterocyclic group having hetero atom(s) such as an oxygen atom, a sulphur atom and a nitrogen atom (such as thiophene, pyridine, pyran, imidazole, benzimidazole, furan, piperidine, pyrazine, pyrrole, piperazine ring).

Examples of the linking groups further include a combination of the above mentioned linking groups and a group selected from the group consisting of groups of the following formulae. However, the organic group (Z) is not limited to those illustrated here.

(The polymer ($P_3$)

The following illustrates the polymer ($P_3$).

The polymer ($P_3$) is a graft copolymer comprising at least one polymer segment (X) containing not less than 50% by weight of units having fluorine atom(s) and/or silicon atom(s) and at least one polymer segment (Y) containing units having photosetting and/or thermosetting group (s);

Weight-average molecular weight of the polymer ($P_3$) may be $5\times10^3$ to $1\times10^6$, preferably $1\times10^4$ to $5\times10^5$. Weight-average molecular Weight of the segment (X) in the polymer ($P_3$) is preferably not less than $1\times10^3$.

The segments (X) and (Y) may be present in the polymer ($P_3$) in any order. Namely, the polymer ($P_3$) may have the following formulae:

—: the segment (X)   ⌒: the segment (Y)

(The polymer ($P_4$))

The following illustrates the polymer ($P_4$). The polymer ($P_4$) is an AB type or ABA type block copolymer comprising at least one polymer segment (X) containing not less than 50% by weight of units having fluorine atom(s) and/or silicon atom(s) and at least one polymer segment (Y) containing units having photosetting and/or thermosetting group(s), and,at least one of said polymer segment (X) is the following graft type polymer segment (X'), at least one of said polymer segment (Y) is the following graft type polymer segment (Y'), or at least one of said polymer segment (X) is the following graft type polymer segment (X') and at least one of said polymer segment (Y) is the following graft type polymer segment (Y'): The graft type polymer segment (X'): a polymer segment which has a weight-average molecular weight of $1\times10^3\sim2\times10^4$, and comprises at least one macromonomer segment ($M_A$) which contains not less than 50% by weight, preferably not less than 90% by weight of units having fluorine atom(s) and/or silicon atom(s); The graft type polymer segment (Y'): a polymer segment which has a weight-average molecular weight of $1\times10^3\sim2\times10^4$, and comprises at least one macromonomer segment ($M_B$) which does not contain units having fluorine atom(s) and/or silicon atom(s);

The segments (X) and (Y) may be present in the block copolymer ($P_4$) in any order. Namely, the polymer ($P_4$) may have the following formulae:

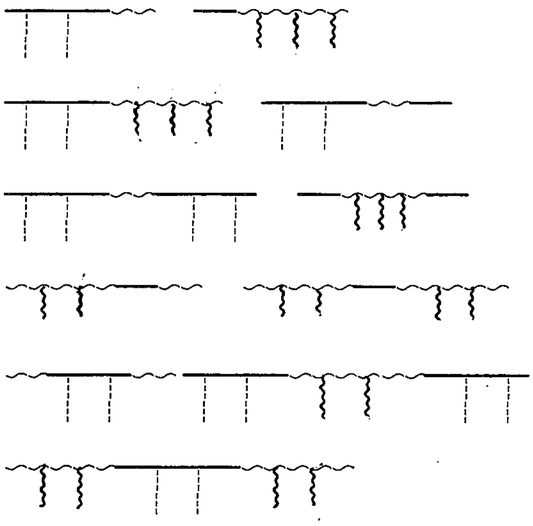

——: the segment (X)
⌒⌒: the segment (Y)
------: the macromonomer segment ($M_A$)
∿∿∿: the macromonomer segment ($M_B$)

The segment (X) may contain the macromonomer segment ($M_A$) in an amount of 1-50% by weight, preferably 3-30% by weight based on the total weight of the segment (x).

The segment (Y) may contain the macromonomer segment ($M_B$) in an amount of 1-50% by weight, preferably 3-30% by weight based on the total weight of the segment (Y).

Preferably, the macromonomer segment ($M_B$) contains the units having photo and/or thermosetting group(s) in an amount of 1-50% by weight, preferably 3-20% by weight based on the total weight of the macromonomer segment ($M_B$).

Weight-average molecular weight of the polymer ($P_4$) may be $5\times10^3$ to $1\times10^6$, preferably $1\times10^4$ to $5\times10^5$. Weight-average molecular weight of the segment (X) in the polymer ($P_4$) is preferably not less than $1\times10^3$.

The following illustrates the segment (X) and the segment (Y) more in detail.

The units having fluorine atom(s) and/or silicon atom(s) may contain substituent(s) having fluorine atom(s) and/or silicon atom(s). The substituent(s) may present in a main chain of the polymer (P), or may present in side chains thereof.

Examples of the substituent having fluorine atom(s) include: $—C_hF_{2h+1}$ (h is an integer of 1 to 18), $—(CF_2)_jCF_2H$ (j is an integer of 1 to 17), $—CFH_2$, mono-valent organic groups of the following formulae:

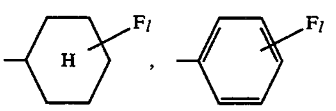

(l is 1 to 11) (l is 1 to 5)

$—CF_2—$, $—CFH—$ and di-valent organic groups of the following formulae:

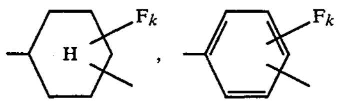

(k is 1 to 10) (k is 1 to 4).

Examples of the group having silicon atom(s) include mono-valent or di-valent organic groups of the following formulae:

$—Si(R_1)(R_2)(R_3)$ and $—Si(R_4)(R_5)—$.

$R_1$, $R_2$, $R_3$, $R_4$ and $R_5$ may be same or different, each represents a hydrocarbon group having 1 to 22 carbon atoms which can be substituted, an organic residue having fluorine atom(s) mentioned above, —OR' (R' represents a hydrocarbon group having 1 to 22 carbon atoms which can be substituted), or $—O-Si(R_1')(R_2')(R_3')$ ($R_1'$, $R_2'$ and $R_3'$ each represents independently the same meaning as defined for $R_1$ to $R_5$). Examples of $R_1$ to $R_5$, R', and $R_1'$ to $R_3'$ include: an alkyl group having 1 to 18 carbon atoms which can be substituted (such as methyl, ethyl, propyl, butyl, hexyl, octyl, decyl, dodecyl, hexadecyl, 2-chloroethyl, 2-bromoethyl, 2,2,2-trifluoroethyl, 2-cyanoethyl, 3,3,3-trifluoropropyl, 2-methoxyethyl, 3-bromopropyl, 2-methoxycarbonylethtyl, 2,2,2,2'2',2'-hexafluoroisopropyl), an alkenyl having 4 to 22 carbon atoms which can be substituted (such as 2-methyl-1-propenyl, 2-butenyl, 2-pentenyl, 3-methyl-2-pentenyl, 1-pentenyl, 1-hexenyl, 2-hexenyl, 4-methyl-2-hexenyl), an aralkyl group having 7 to 12 carbon atoms which can be substituted (such as benzyl, phenethyl, 3-phenylpropyl, naphthylmethyl, 2-naphthylethyl, chlorobenzyl, bromobenzyl, methylbenzyl, ethylbenzyl, methoxybenzyl, dimethylbenzyl, dimethoxy benzyl), an alycyclic group having 5 to 8 carbon atoms which can be substituted (such as cyclohexyl, 2-cyclohexyl, 2-cyclopentylethyl), or a substituted or unsubstituted aromatic group having 6 to 12 carbon atoms (such as phenyl, naphthyl, tolyl, xylyl, propylphenyl, butylphenyl, octylphenyl, dodecylphenyl, methoxyphenyl, ethoxyphenyl, butoxyphenyl, decyloxyphenyl, chlorophenyl, dichlorophenyl, bromophenyl, cyanophenyl, acetylpnehyl, methoxycarbonylphenyl, ethoxycarbonylphenyl, butoxycarbonylphenyl, acetoamidephenyl, propioamidephenyl, dodecyloylamidephenyl).

The substituent having fluorine atom(s) and the substituent having silicon atom(s) can be combined each other directly or through a linking group.

Examples of the linking group include di-valent groups such as —O—, —S—, $—NR_1—$, —SO—, $—SO_2—$, —COO—, —OCO—, —CONHCO—, —NHCONH—, $—CONR_1—$, $—SO_2NR_1—$, a di-valent aliphatic or aromatic group, or a combination of these di-valent groups. $R_1$ is the same meaning as defined above.

Examples of di-valent aliphatic groups include:

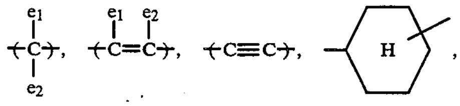

-continued

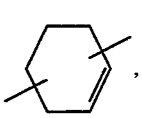, 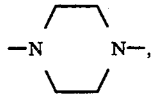, 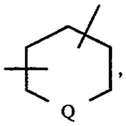,

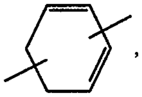, 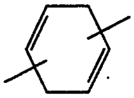

($e_1$ and $e_2$ each represents independently a hydrogen atom, a halogen atom (such as a chlorine atom and a bromine atom), or an alkyl group having 1 to 12 carbon atoms (such as methyl, ethyl, propyl, chloromethyl, bromomethyl, butyl, hexyl, octyl, nonyl and decyl), and Q represents —O—, —S—, or $—NR_{20}—$ wherein $R_{20}$ represents an alkyl group having 1 to 4 carbon atoms, $—CH_2Cl$ or $—CH_2Br$).

Examples of di-valent aromatic groups include: a residue of benzene, a residue of naphthalene, and a hetelocyclic group with 5 or 6 members (containing at least one hetelo atom selected from the group consisting of an oxygen atom, a sulfur atom, and a nitrogen atom). These aromatic groups may be substituted, for example, by a halogen atom (such as a fluorine, chlorine or bromine atom), an alkyl group having 1 to 8 carbon atoms (such as methyl, ethyl, propyl, butyl, hexyl, octyl), an alkoxy group having 1 to 6 carbon atoms (such as methoxy, ethoxy, propoxy, butoxy).

Examples of heterocyclic groups include furan, thiophene, pyridine, pirazine, piperazine, tetrahydrofuran, pyrrole, tetrahydropyran, 1,3-oxazoline rings.

The followings ((a-1)-(a-33)) are examples of the units having fluorine atom(s) and/or silicon atom(s). They should not be understood as limitation of the present invention.

In the examples, —Rf represent the following substituents. 1) $—C_nF_{2n+1}$, 2) $—CH_2C_nF_{2n+1}$, 3) $—CH_2CH_2C_nF_{2n+1}$, 4) $—CH_2(CF_2)_m\ CFHCF_3$, 5) $—CH_2CH_2(CF_2)_mCFHCF_3$, 6) $—CH_2CH_2(CF_2)_mCFHCF_2H$, 7) $—CH_2(CF_2)_mCFHCF_3$, 8) $—CH(CF_3)_2$,

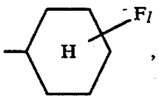, 9)

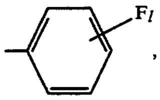, or 10)

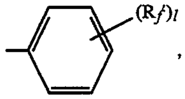, 11)

($R_f'$ represents the same as 1) to 8) defined above.)

In the above and bellow formulae, n is an integer of 1 to 18, m is an integer of 1 to 18, 1 is an integer of 1 to 5, and b is a hydrogen atom or a methyl group.

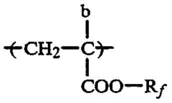 (a-1)

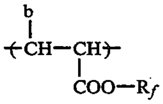 (a-2)

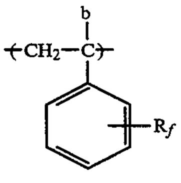 (a-3)

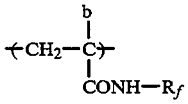 (a-4)

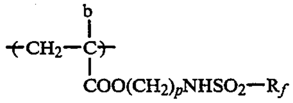 (a-5)

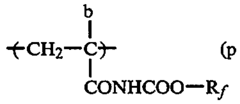 (p is an integer of 1 to 12) (a-6)

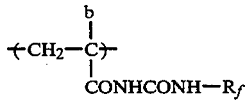 (a-7)

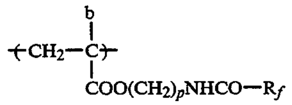 (a-8)

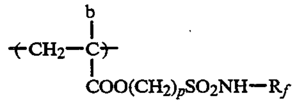 (a-9)

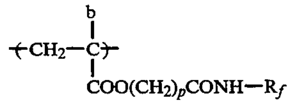 (a-10)

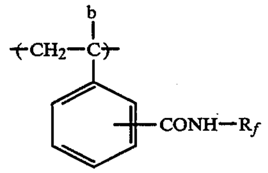 (a-11)

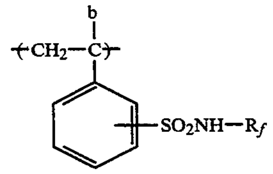 (a-12)

-continued
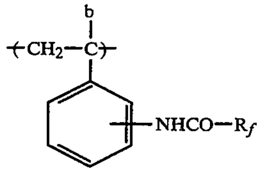
(a-13)
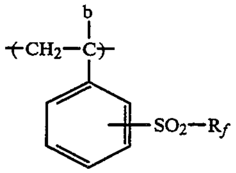
(a-14)
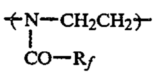
(a-15)
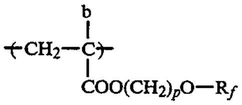
(a-16)
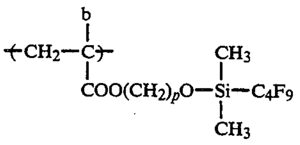
(a-17)
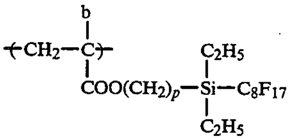
(a-18)
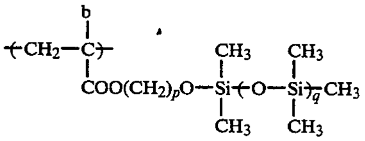
(a-19)
wherein q is an integer, of 1 to 20
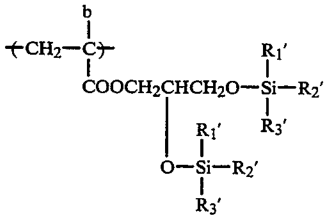
(a-20)
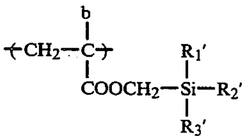
(a-21)
wherein $R_1'$, $R_2'$ and $R_3'$ are alkyl groups having 1 to 12 carbon atoms.
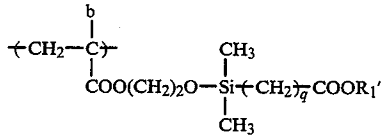
(a-22)
wherein q is an integer of 1 to 20
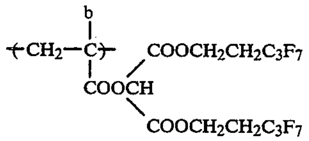
(a-23)
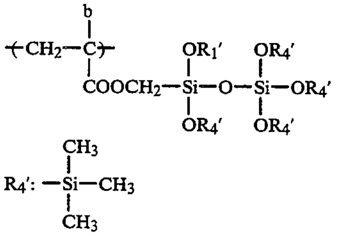
(a-24)
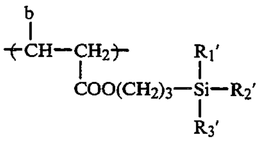
(a-25)
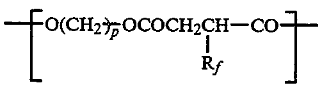
(a-26)
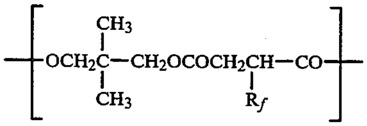
(a-27)
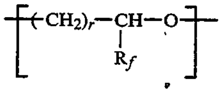
(a-28)
wherein r is an integer of 3 to 6
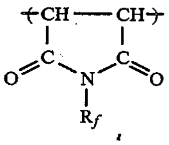
(a-29)
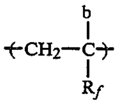
(a-30)
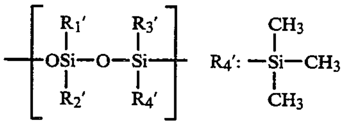
(a-31)
wherein $R_1'$, $R_2'$ and $R_3'$ are alkyl groups having 1 to 12 carbon atoms.

$$-(CH-CH)- \quad \text{(a-32)}$$
with $COOR_f$ on each CH $-(N(Rf)CH_2CH_2)-$ (a-33)

$-(N(CORf)CH_2CH_2)-$ (a-34)

The following illustrates the macromonomer segment $(M_A)$.

The macromonomer segment $(M_A)$ has a weight-average molecular weight of $1\times10^3$ to $2\times10^4$. A weight-average molecular weight of less than $1\times10^3$ results in too short graft parts causing lower effect of releasability of the photoconductive layer. A weight-average molecular weight of more than $1\times10^3$ results in lower reactivity with monomers corresponding to other units, which causes that desirable graft copolymer cannot be obtained.

The macromonomer segment $(M_A)$ may be one corresponding to a macromonomer which may contain the above mentioned units having fluorine atom(s) and/or silicon atom(s) mentioned for the segment (x). It may contain a group having polymerizable double bond represented by the following formula II in one end of a main chain thereof.

$$CH(a_1)=C(a_2)-V_1- \quad \text{(II)}$$

wherein $a_1$ and $a_2$ each represents independently a hydrogen atom, a halogen atom, a trifluoromethyl group, a cyano group, or a hydrocarbon group. $V_1$ represents —COO—, —OCO—, $-(CH_2)_{m'}$ OCO—, $-(CH_2)_{m'}$ COO— (m' is an integer of 1 to 3), —O—, $-SO_2-$, —CO—, $-CON(T^1)-$, $-SO_2N(T^1)-$, —CONHCOO—, —CONHCONH—, or $-C_6H_4-$, $T^1$ is a hydrogen atom, or a hydrocarbon group.

Examples of a hydrocarbon group as $T^1$ include: a substituted or unsubstituted alkyl group having 1 to 18 carbon atoms (such as methyl, ethyl, propyl, butyl, heptyl, hexyl, octyl, decyl, dodecyl, hexadecyl, octadecyl, 2-chloroethyl, 2-bromoethyl, 2-cyanoethyl, 2-methoxycarbonylethyl, 2-methoxyethyl, 3-bromopropyl, an alkenyl group having 4 to 18 carbon atoms which may be substituted (such as 2-methyl-1-propenyl, 2-butenyl, 2-pentenyl, 3-methyl-2-pentenyl, 1-pentenyl, 1-hexenyl, 2-hexenyl, 4-methyl-2-hexenyl), an aralkyl group having 7 to 12 carbon atoms which may be substituted (such as benzyl, phenethyl, 3-phenylpropyl, naphtylmethyl, 2-naphtylethyl, chlorobenzyl, bromobenzyl, methyl benzyl, ethyl benzyl, methoxy benzyl, dimethylbenzyl, dimethoxy benzyl), an alicyclic group having 5 to 8 carbon atoms which may be substituted (cyclohexyl, 2-cyclohexylethyl, 2-cyclopentylethyl), an aromatic group having 6 to 12 carbon atoms which may be substituted (such as phenyl, naphthyl, tolyl, xylyl, propylphenyl, butylphenyl, octylphenyl, dodecylphenyl, methoxyphenyl, ethoxyphenyl, butoxyphenyl, decyloxyphenyl, chlorophenyl, dichlorophenyl, bromophenyl, cyanophenyl, acetylphenyl, methoxycarbonylphenyl, ethoxycarbonylphenyl, butoxycarbonylphenyl, acetamidophenyl, propioamidophenyl, dodecyloylamidophenyl.

If $V_1$ is $-C_6H_4-$, the benzene ring may have substituent(s). The substituents may be a halogen atom (such as a chlorine and bromine atom), an alkyl group (such as methyl, ethyl, propyl, butyl, chloromethyl and methoxymethyl) or an alkoxy group (such as methoxy, ethoxy, propoxy, butoxy).

Preferably, $a_1$ and $a_2$ each represents independently a hydrogen atom; a halogen atom (such as a chlorine atom and a bromine atom); a trifuluoromethyl group; a cyano group; or an alkyl group having 1 to 4 carbon atoms (such as methyl, ethyl, propyl and butyl), $-COOZ^3$, or $-Z^4-COOZ^3$ wherein $Z^3$ represents a hydrogen atom or an alkyl group having 1 to 18 carbon atoms, an alkenyl group having 2 to 18 carbon atoms, an aralkyl group having 7 to 18 carbon atoms, an alicyclic group having 3 to 18 carbon atoms, or an aryl group having 6 to 18 carbon atoms which may be substituted by the same group(s) groups exemplified for $T^1$, and $Z^4$ is a hydrocarbon group.

Preferably, $Z^4$ may be methylene, ethylene, or propylene.

Especially, in the formula II, $V_1$ may be —COO—, —OCO—, $-CH_2OCO-$, $-CH_2COO-$, —O—, —CONH—, or $-C_6H_4-$, $a_1$ and $a_2$ may be same or different, a hydrogen atom, a hydrocarbon group having 1 to 6 carbon atoms (such as methyl, ethyl, propyl, butyl and hexyl). More preferably, one of $a_1$ and $a_2$ may be a hydrogen atom.

The group containing polymerizable double bond of the formula II may be bonded to the end of the macromonomer either directly or through a linking group. The linking group may be di-valent organic groups such as —O—, —S—, $-Nd_1-$, —SO—, $-SO_2-$, —COO—, —OCO—, —CONHCO—, —NHCONH—, $-CONd_2$, $-SO_2Nd_3-$, $-Si(d_4)(d_5)-$ a di-valent aliphatic or aromatic group, or a combination of these di-valent groups. $d_1$, $d_2$, $d_3$, $d_4$ and $d_5$ each represents independently the same group as exemplified for $T^1$ in the formula II.

Examples of di-valent aliphatic groups include: $-C(k_1)(k_2)-$, $-C(k_1)=C(k_2)-$, $-C\equiv C-$, $-C_6H_{10}-$ and

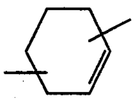

($k_1$ and $k_2$ each represents independently a hydrogen atom, a halogen atom (such as a fluorine atom, a chlorine atom and a bromine atom), or an alkyl group having 1 to 12 carbon atoms (such as methyl, ethyl, propyl, chloromethyl, bromomethyl, butyl, hexyl, octyl, nonyl and decyl)).

Examples of di-valent aromatic groups include: a residue of benzene, a residue of naphthalene, and a hetelocyclic group with 5 or 6 members (containing as at least one hetero atom which consists a heterocyclic group selected from the group consisting of an oxygen atom, a sulfur atom and a nitrogen atom). These aromatic groups may be substituted, for example, by a halogen atom (such as a fluorine atom, a chlorine atom and a bromine atom), an alkyl group having 1 to 8 carbon atoms (such as methyl, ethyl, propyl, butyl, hexyl and octyl), an alkoxy group-having 1 to 6 carbon atoms (such as methoxy, ethoxy, propoxy and butoxy).

Examples of heterocyclic groups include furan, thiophene, pyridine, pirazine, piperazine, tetrahydrofuran, pyrrole, tetrahydropyran, 1,3-oxazoline, pyrrolidine, piperidine rings or the group represented by the following formulae:

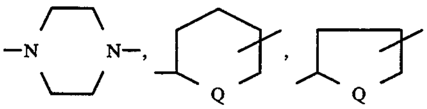

(wherein Q is —O—, —S— or —$NR_{20}$— ($R_{20}$ is an alkyl group having 1 to 4 carbon atoms, —$CH_2Cl$ or —$CH_2Br$).

Examples of moietys which are formed by linking various organic residues to units containing group(s) having a polymerizable double bond represented by the formula II include groups represented by the following formulae:

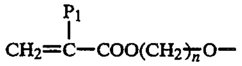
(c-1)

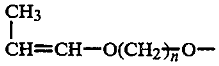
(c-2)

$CH_2{=}CH{-}$ (c-3)

$CH_2{=}CH{-}CH_2{-}$ (c-4)

(c-5)

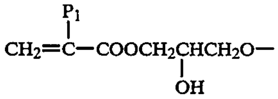
(c-6)

(c-7)

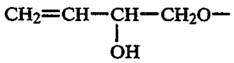
(c-8)

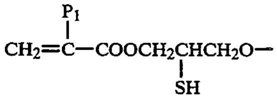
(c-9)

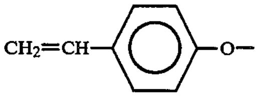
(c-10)

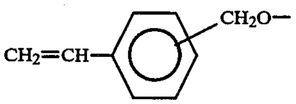
(c-11)

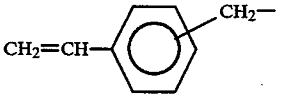
(c-12)

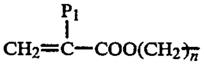
(c-13)

(c-14)

(c-15)

-continued

(c-16)

$CH_2{=}CH{-}CH_2{-}COO{+}CH_2{)_n}$ (c-17)

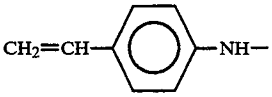
(c-18)

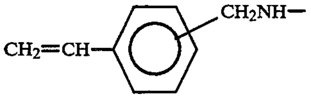
(c-19)

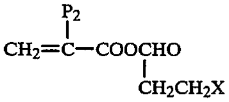
(c-20)

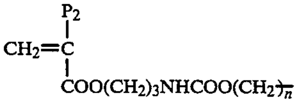
(c-21)

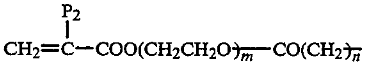
(c-22)

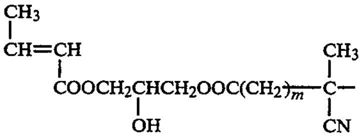
(c-23)

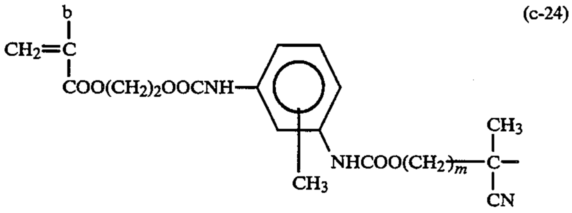
(c-24)

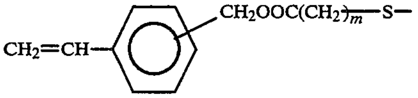
(c-25)

$CH_2{=}CH{-}CH_2OCO(CH_2)_m{-}S{-}$ (c-26)

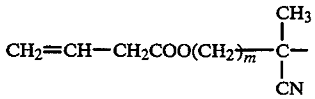
(c-27)

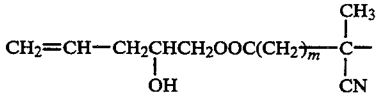
(c-28)

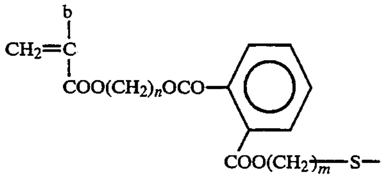
(c-29)

-continued

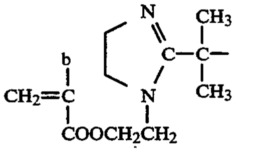

(c-30)

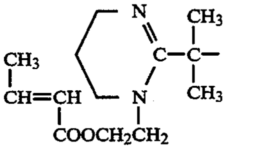

(c-31)

wherein $P_1$ is —H, —$CH_3$, —$CH_2COOCH_3$, —Cl, —Br or —CN, $P_2$ is —H or —$CH_3$, X is —Cl or —Br, n is an integer of 2 to 12, and m is an integer of 1 to 4.

(The segment (Y))

The following illustrates the units having photo and/or thermosetting group(s) in the segment (Y).

A photo and/or thermosetting group is a group which causes a curing reaction of the polymer by at least one of heat and light.

Examples of the photosetting group may be functional groups used in known photosensitive polymers such as those described in the following literatures: Hideo Inui, Gentaro Nagamatsu, "Photosensitive Polymer" published by Kodansha, 1977; Takahiro Tsunoda, "New Photosensitive Polymer", the publishing department of the Printing Society of Japan, 1981; G. E. Green and B. P. Strak, J. Macro. Sci. Reas. Macro. Chem., C21(2), 187-273 (1981-82); C. G. Rattey, "Photopolymerization of Surface Coatings", A. Wiley Inter Science Pub., 1982.

Examples of the thermosetting group may be functional groups in polymers described in the following literatures: Tsuyoshi Endo, "Densifying of Thermosetting Polymer", C.M.C. Co.,Ltd., 1986; Yuji Harazaki, "The Latest binder techniques handbook", chapter II-I, Sogogijutu center, 1985; Takayuki Otsu, "Synthesis, Design and New Use of Acrylic Resin, the publishing department of Chubukeieikaihatsu center, 1985; Eizo Omori, "Functional Acrylic resins", Technosystem, 1985.

Examples of such groups include —COOH, —$PO_3H_2$, —$SO_2H$, —OH, —SH, —$NH_2$. —$NHR_{103}$ ($R_{103}$ is a hydrocarbon group, preferably having 1 to 8 carbon atoms (such as methyl, ethyl, propyl, butyl, hexyl, octyl, 2-chloroethyl, 2-methoxyethyl, 2-cyanoethyl)), a residue of a cyclic acid anhydride, —$CONHCH_2OR_{104}$ ($R_{104}$ is a hydrogen atom or the above mentioned alkyl group), —N═C═O, groups of the following formulae:

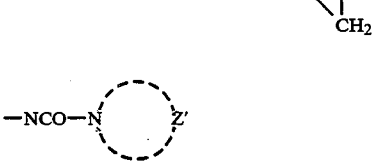

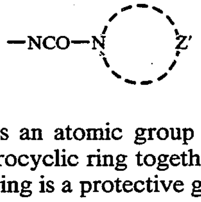

(Z' is an atomic group which is necessary to form a heterocyclic ring together with the nitrogen atom, and the ring is a protective group for —N═C═O), a silane coupling group, a titanate coupling group, —$Cd_9$═$CHd_{10}$ ($d_9$ and $d_{10}$ each represents independently a hydrogen atom, a halogen atom (such as a chlorine atom and a bromine atom) or an alkyl group having 1 to 4 carbon atoms (such as methyl and ethyl).

Examples of groups having the polymerizable double bond include $CH_2$═CH—, $CH_2$═CH—$CH_2$—, $CH_2$═CHCOO—, $CH_2$═C($CH_3$)—COO—, $CH_3$—CH═COO—, $CH_2$═CH—CONH—, $CH_2$═C($CH_3$)—CONH—, $CH_3$—CH═CH—CONH—, $CH_2$═CH—O—CO—, $CH_2$═C($CH_3$)—OCO—, $CH_2$═CH—$CH_2$—OCO—, $CH_2$═CH—NHCO—, $CH_2$═CH—$CH_2$—NHCO—, $CH_2$—CH—$SO_2$—, $CH_2$═CH—CO—, $CH_2$═CH—O—, $CH_2$═CH—S—, groups of the following formulae:

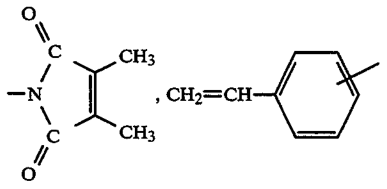

The following description illustrates the macromonomer segment ($M_B$).

Weight average molecular weight of the macromonomer corresponding to the macromonomersegment ($M_B$) is in the range of $1\times10^3$ to $2\times10^4$, preferably $3\times10^3$ to $1\times10^4$. Weight average molecular weight of less than $1\times10^3$ results in an insufficient anchor effect. Weight average molecular weight of more than $2\times10^4$ results in too poor reactivity for copolymerization of the macromonomer with other monomers corresponding to the other units which constitutes the segment (Y).

The units constituting the macromonomer segment ($M_B$) may be any units which do not contain a fluorine atom or a silicon atom. Preferably, the macromonomer segment ($M_B$) contain 1 to 50% by weight of the units having photo and/or thermosetting group(s) based on the total weight of the macromonomer segment ($M_B$).

Examples of the photo and/or thermosetting group may be the same as described above for the photo and/or thermosetting group in the segment (Y) other than the group having a polymerizable double bond.

(Other units)

Other units in the segments (X) and (Y) in the polymer (P) of the present invention may be any units corresponding to monomers which are copolymerizable with the monomers corresponding to the above mentioned units. Examples of them include units of addition polymer, polyester, polyether and polyimine.

The unit of the addition polymer may be those selected from units of the following formula III.

$$—(CH(b_1)—C(V_2—R_{11})(b_2))— \quad (III)$$

In formula III, $V_2$ is the same as defined above for $V_1$ in the formula I, $b_1$ and $b_2$ represent the same as defined above for $a_1$ and $a_2$ in the formula II respectively, $R_{11}$ is the same as defined above for $T_1$ in the formula II.

The unit of the formula III is contained in the segment ($X_1$) in an amount of not more than 50% by weight, preferably not more than 20% by weight. More preferably, it is not contained.

The unit of the formula III is contained in the segment ($M_A$) in an amount of not more than 50% by weight, preferably not more than 20% by weight. More preferably, it is not contained.

The unit of the formula III is contained in the segment (Y) in an amount of 0 to 95% by weight, preferably 5 to 90% by weight based on the total weight of the segment (Y).

The units of the formula III is contained in the segment ($M_B$) in an amount of 40 to 100% by weight, preferably 50 to 95% by weight.

Examples of other units which can be contained with the unit of formula III include units corresponding to monomers copolymerizable with the monomer corresponding to the unit of the formula III, such as units corresponding to acrylonitrile, methacrylonitrile and vinyl heterocyclic compounds (such as vinyl pyridine, vinyl imidazole, vinyl pyrrolidone, vinyl thiophene, vinylpyrazole, vinyldioxane and vinyloxadine). These other units are contained in an amount of less than 20 parts by weight based on 100 parts by weight of the polymer (P).

Further, the unit which contains at least one polar group selected from the group consisting of $—PO_3H_2$, $—SO_3H$, —COOH, $—PO(OH)R^{101}$ ($R^{101}$ is a hydrocarbon group or $—OR^{102}$ ($R^{102}$ is a hydrocarbon group)) and a residue of a cyclic anhydride can be contained in the segment (Y) in the polymer (P) in an amount of less than 10% by weight based on the total weight of the segment (Y).

Preferably, $R^{101}$ and $R^{102}$ each represents independently a hydrocarbon group having 1 to 6 carbon atoms which may be substituted (such as methyl, ethyl, propyl, butyl, 2-chloroethyl, 2-bromoethyl, 2-fluoroethyl, 3-chloropropyl, 3-methoxypropyl, 2-methoxy butyl, benzyl, phenyl, propenyl; methoxymethyl, ethoxymethyl and 2-ethoxyethyl).

Further, a residue of a cyclic anhydride may be a residue of an aliphatic dicarboxylic anhydride or an aromatic dicarboxylic anhydride.

Examples of the aliphatic dicarboxylic anhydrides include succinic anhydride, glutaconic anhydride, maleic anhydride, cyclopentane-1,2-dicarboxylic anhydride, cyclohexene-1,2-dicarboxylic anhydride and 2,3-bicyclo[2,2,2] octadicarboxylic anhydride. These cyclic anhydrides may be substituted, for example, by a halogen atom such as a chlorine atom and a bromine atom and an alkyl group such as methyl, ethyl, butyl and hexyl.

Further, examples of aromatic dicarboxylic anhydrides include phthalic anhydride, naphthalene-dicarboxylic anhydride, pyridine-dicarboxylic anhydride and thiophene-dicarboxylic anhydride. These cyclic anhydrides may be substituted, for example, by a halogen atom such as a chlorine atom and a bromine atom and an alkyl group such as methyl, ethyl, propyl, butyl; hydroxy; cyano; nitro; and alkoxycarbonyl (alkoxy may be, for example, methoxy and ethoxy).

The above mentioned units may be any units corresponding to vinylic compounds having polar group(s) which can be copolymerized with, for example, a monomer corresponding to the unit of the formula II. The vinylic compounds are described in, for example, Polymer Society of Japan, "Polymer data handbook (fundamentals)" published by Baifukan, (1986). Examples of the compounds include acrylic acids, α and/or β-substituted acrylic acid (such as α-acetoxy acrylic acid, α-acetoxymethyl acrylic acid, α-(2-amino)ethyl acrylic acid, α-chloro acrylic acid, α-bromo acrylic acid, α-fluoro acrylic acid, α-tributylsylil acrylic acid, α-cyano acrylic acid, β-chloro acrylic acid, β-bromo acrylic acid, α-chloro-β-methoxy and α,β-dichloro acrylic acid), methacrylic acid, itaconic acid, semi ester of itaconic acid, semi amides of itaconic acid, crotonic acid, 2-alkenylcarboxylic acids (such as 2-pentenoic acid, 2-methyl-2-hexenoic acid, 2-octenoic acid, 4-methyl-2-hexenoic acid, 4-ethyl-2-octenoic acid), maleic acid, semi esters of maleic acid, semi amides of maleic acid, vinyl benzene carboxylic acid, vinyl benzene sulfonic acid, vinyl sulfonic acid, vinyl phosphonic acid, vinyl- or allyl- semi ester of dicarboxylic acids, and esters and amides of these carboxylic acids and sulfonic acids, which contain polar group(s) as substituent(s).

(Preparation of the polymer (P))

The polymers (P) or the one-functional macromonomer corresponding to the macromonomer segment(s) ($M_A$) or ($M_B$) may be prepared in accordance with known polymerization methods, for example, methods described in the following literatures: W. J. Burlant, A. S. Hoffman "Block and Graft Polymer" (1986, Renhald), R. J. Ceresa, "Block and Graft Polymers" (1962, Butterworths), D.C. Allport, W. H. James "Block Copolymers" (1972, Applied Sci), A. Noshay, J. F. McGvath "Block Copolymers" (1977, Academic press.), G. Huvtrez D. J. Wilson, G. Riess, NATO ASI Sev. Sev. E. 1985, 149, V. Percea, Applied. Polymer Sci. 285, 95 (1985).

Ionic polymerization reactions wherein alkyl lithium, lithium diisopropylamide, alkali metal alcoholates, alkyl magnesium halides, alkyl aluminium halides etc. are used as a polymerization initiator are described in the following literatures: T. E. Hogeu-Esch, J. Smid, "Recent Advances in Anionic Polymerization" (1987, Elsevier New York), Yoshio Okamoto, Polymer, 38,912 (1989), Mitsuo Sawamoto, Polymer,38, 1018, (1989), Tadashi Narita, Polymer, 37, 252 (1988), B.C. Anderson, et al, Macromolecules 14, 1601(1981), S. Aoshima, T. Higashimura Macromolecules 22, 1009(1989) etc.

Ionic polymerization reactions with hydrogen iodide/iodine system etc. are described in Macromol. Chem., Macromol. Symp., 13/14, 457(1988), Toshinobu Higashimura, Mitsuo Sawamoto, papers for Polymer, 46, 189 (1989).

Group transfer polymerization reactions are described in D. Y. Sogah et al, Macromolecules 20, 1473 (1987), O.W. Webster, D. Y. Sogah, Polymer, 36, 808(1987), M. T. Reetg, et al, Angew. Chem. Int. Ed. Eugl. 25, 9108(1986), J.P. KOKAI No. Sho 63-97609 etc.

Further, living polymerization reactions with porphyrin metal complex are described in T. Yasuda, T. Aida, S. Inoue, Macromolecules, 17, 2217 (1984), M. Kuroki, T. Aida, S. Inoue, J. Auu Chem. Soc. 109, 4737 (1987), M. Kuroki et al, Macromolecules, 21, 3115 (1988), M. Kuroki, I. Inoue, Organic Şynthesis, 47, 1017 (1989) etc.

Ring opening polymerizations of cyclic compounds are described in the following literatures: S. Kobayashi, T. Saegusa, "Ring Opening Polymerization" (1984, Applied Science Publishors, Co.,Ltd.), W. Seeliger et al. Angew. Chem. Int. Engl. 5, 875 (1966), S. Kobayashi et al, Poly, Bull. 13,447 (1985), Y. Chujo et al, Macromolecules, 22, 1074, (1989) etc.

Further, photo living polymerization reactions wherein dithiocarbamate compound or xanthate compound are used as initiator are described in the following literatures: Takayuki Otsu, Polymer, 37, 248 (1988), Shunichi Hinoemori, Takaiti Otsu, Polym. Rep. Jap.37, 3508 (1988), J.P. KOKAI Nos. Sho 64-111 and Sho 64-26619, M. Niwa, Macromolecules, 189, 2187 (1988) etc.

Methods for preparation of block copolymer by radical polymerization reaction wherein a polymer containing azo groups or peroxide groups is used as initiator are described in the following literatures: Akira Ueda et al, Papers for Polymer, 33, 931 (1976), Akira Ueda, Reports by Osaka City Industrial Laboratory, 84, (1989), O. Nuyken et al, Macromol. Chem. Rapid. Commun, 9, 671 (1988), Yasuo Moriya et al, Reinforced Plastics, 29, 907 (19), Ryohei Oda, Science and Industry, 61, 43(1987) etc.

Methods for preparation of a graft type block copolymer are described in the following literatures in addition to the above literatures: Fumio Ide, "Graft polymerization and application thereof" (1977, Polymer-publishers); Polymer Society of Japan, "Polymer alloy" (1981, Tokyo Kagaku Doujin) etc.

Those methods include, for example, a method for grafting a polymer chains by a mechanochemical reaction with polymerization initiator, chemical active beam (such as radiation and electron rays) and mechanical application, a method for grafting polymer chains with functional groups in other polymer chains through chemical bond (reaction between polymers), or a method for grafting by polymerization of macromonomers.

Methods for grafting polymer chains by the reaction between polymers are described in the following literatures: T. Shiota et al, J. Appl. Polym. Sci. 13, 2447 (1969), W. H. Buck Rubber Chemistry and Technology, 50,109 (1976); Tsuyoshi Endo, Tsutomu Yokozawa, Journal of Japan Adhesive Society (Nihonsechakukyokaishi), 24,323 (1988), Tsuyoshi Endo, ibid, 25, 409, (1989) etc.

Methods for grafting by polymerization of macromonomer described in the following literatures: p. Dreyfuss & R. P. Quirk, Encycl. Polym. Sci. Eng., 7, 551 (1987), P. F. Rempp, E. Franta, Adv. Polym. Sci., 58, 1 (1984), V. Percec, Appl. Poly. Sci.,285, 95 (1984), R. Asami, M. Takari, Macromol. Chem. Suppl., 12, 163 (1985), R. Rempp., et al, Macromol. Chem. Suppl., 8, 3 (1984), Yushi Kawakami, Chemical Industry, 38, 56 (1987), Yuya Yamashita, Polymer, 31, 988 (1982), Shiro Kobayashi, Polymer, 30, 625 (1981), Toshinobu Higashimura, Journal of Japan Adhesive Society, 18, 536 (1982), Koichi Ito, Polymer Processing, 35,262 (1986), Shiro Toki, Takashi Tsuda, functional materials, 1987, No. 10, 5; Yuya Yamashita, "Chemistry and Industry of Macromonomer" (1989, I.P.C Co.,Ltd.) Tsuyoshi Endo, "Design of Construction for Novel Functional Polymer", Chapter 4, (1991, CMC Co Ltd.; Y. Yamashita et al. Polym. Bull. 5, 361 (1981) etc.

Methods for preparation of a star type block copolymer are described in the following literatures: M. T. Reetz Angew. Chem. Int. Ed Engl 27, 1373 (1988), M. Sgwarc, "Carbanions, Living Polymers and Electron Trausfer Processes" (1968. Wiley. New York), B. Gordon etal, Polym. bull. 11, 349 (1984), R.B. Bates et al. J. Org. Chem. 44, 3800 (1979), Y. Sogah, A. C. S. Polym. Repr. 1988, No. 2, 3, J. W. Mays. Polym. Bull. 23,247 (1990), I. M. Khan. et al. Macromolecules, 21, 2684 (1988), A. Morikawa Macromolecules, 24, 3469 (1991), Akira Ueda, Susumu Nagai, Polymer, 39, 202 (1990), T. Otsu, Polym. Bull. 11, 135 (1984) etc.

Methods for preparation of star type block copolymer are also described in the following literatures: W. J. Burlant, A. S. Hoffman, "Block and Graft Polymers" (1960, Renhold), R. J. Ceresa, "Block and Graft Copolymers" (1962, Butterwords) L. C. Allport, W. H. James, "Block Copolymers" (1972, Applied Sci), A. Noshay, J. E. McGrath "Block Copolymers" (1977, Academic press.) et al.

Further, the star type copolymer used in the present invention can be prepared by known method for preparing a star type polymer wherein monomers having polar group(s) and group(s) containing polymerizable double bonds are used. Examples of the known method include a polymerization reaction wherein carbanion is used as initiator. Specific examples of the methods are described in the following literatures: M. Morton, T. E. Helminiak et al, J. Polym. Sci., 57, 471 (1962), B. Gordon III, M. Blumenthal, J. E. Loftus et al, Polym. Bull., 11, 349 (1984), R. B. Bates, W. A. Beavers et al, J. Org. Chem., 44, 3800 (1979).

For the preparation of the polymer (P) containing particular polar groups such as —COOH in the segment (Y), the polar groups in corresponding monomers should be protected by a protective group, and a block copolymer is prepared by living polymerization reaction such as ionic polymerization by organic metal compounds (such as alkyl lithiums, lithium diisopropylamide, alkyl magnesium halides) or hydrogen iodide/iodine or photopolymerization wherein porphyrin metal complex is used as a catalyst or group transition polymerization. After the polymerization reaction, the protective group should be released through a hydrolysis, hydrogenation, oxidative degradation or photodegradation reaction. One example of the reactions is illustrated by the following reaction formula.

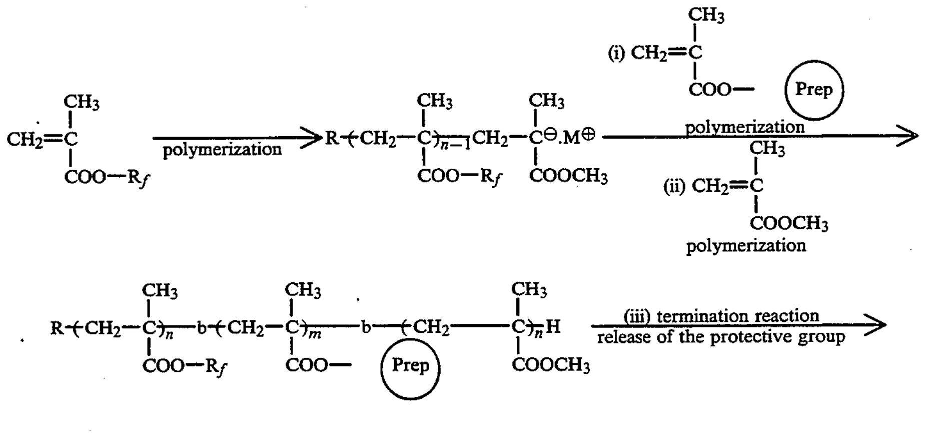

-continued

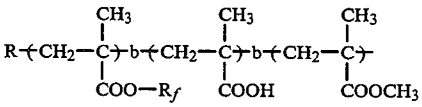

$R_f$ : an alkyl group substituted by fluoro atom(s)

R : an alkyl group (such as a residue of porphyrin ring)

Prep : a protective group (such as $—C(C_6H_5)_3$, $—Si(C_3H_7)_3$)

b : indicates that the units attached to "b" constitute a block to form a block copolymer.

The macromonomers corresponding to the macromonomer segments ($M_A$) and ($M_B$), and the polymer (P) comprising at least one of the macromonomer segments ($M_A$) and ($M_B$) can be prepared by the know method of polymerization.

For example, the macromonomers can be prepared by preparing a polymer having the weight average molecular weight of not more than $2\times10^4$ by known polymerization methods, for example, ionic polymerization reaction with organic metal compounds (such as alkyl lithiums, lithium diisopropylamide, alkyl magnesium halides) or hydrogen iodide/iodine, photopolymerization wherein porphyrin metal complex is used as a catalyst, group transition polymerization, photo initiator polymerization reactions wherein dithiocarbamate compound or xanthate compound are used as initiator, radical polymerization reaction using a radical initiator (such as azobis compound and peroxide compound) and chain transfer agent (such as mercapto compounds and iodo compounds), and then introducing a group having polymerizable double bond to one end of the resultant polymer with various reagents.

For example, the living polymers can be easily prepared by a method in accordance with the following literature: P. Lutz, P.Masson et al., Polym. Bull.,12, 79(1984) B. C. Anderson, G. D. Andrews et al., Macromolecules, 014, 1601 (1981), K. Hatada, K. Ute. et al., Polym. J. 17, 977 (1985), 18, 1037(1986), Koichi Migite, Koichi Hatada, Kobunshikako, 36, 366(1987), Toshinobu Higashimura, Mitsuo Sawamoto, papers for Polymer, 46, 189 (1989), M. Kuroki, T. Aida, T. Am. Chem. Soc. 109, 4737 (1987), Takuzo Aida, Shohei Inoue, Yukigoseikagaku, 43,300(1985), D. Y. Sogah, W. R. Hertler et al., Macromolecules, 20, 1473(1987), Takayuki Otsu, Polymer, 37, 248 (1988), Shunichi Hinoemori, Takaiti Otsu, Polym. Rep. Jap. 37, 3508 (1988), J.P. KOKAi Nos. Sho 64-111 and Sho 64-26619.

Examples for radical polymerization method are described in: Y.Yamashita, J.Appl. Polym. Sci, Appl. Polym. Symp,36, 193(1981), K. K. Roy et al., Makromol. Chem. 153, 71 (1972), Y. Yamashita et al., Polym. J., 14, 255(1982), Akira Ueda, Susumu Nagai, Kagaku to Kogyo,60, 57(1986).

Methods for introducing the group having polymerizable double bond to one end of the polymer are known in the art. Such methods are described in the following literatures and references cited therein: P. Dreyfuss & R. P. Quirk, Encycl. Polym. Sci. Eng., 7, 551 (1987), P. F. Rempp, E. Franta, Adv. Polym. Sci., 58, 1 (1984), V. Percec, Appl. Poly. Sci.,285, 95 (1984), R. Asami, M. Takari, Macromol. Chem. Suppl., 12, 163 (1985), P. Rempp., et al, Macromol. Chem. Suppl., 8, 3 (1984), Yushi Kawakami, Chemical Industry, 38, 56 (1987), Yuya Yamashita, Polymer, 31, 988 (1982), Shiro Kobayashi, Polymer, 30, 625 (1981), Toshinobu Higashimura, Journal of Japan Adhesive Society, 18, 536 (1982), Koichi Ito, Polymer Processing, 35, 262 (1986), Shiro Toki, Takashi Tsuda, functional materials, 1987, No. 10, 5; Yuya Yamashita, "Chemistry and Industry of Macromonomer" (1989, I.P.C Co.,Ltd.).

For the preparation of the macromonomer containing particular polar groups mentioned above, the polar groups in corresoponding monomers should be protected by a protective group, and the protective group should be released after polymerization and introduction of the group having a polymerizable double bond.

Protection by the protective group and release of the protective group can be conducted easily by known techniques. Such methods are described in the following references in addition to the foregoing literatures: Yoshio Iwakura, Keisuke Kurita, "Reactive Polymer", Kodansha Co.,Ltd. (1977), T. W. Green, "Protective Groups in Organic Synthesis", John Wiley & Sons (1981), J. F. W. Mc Omie, "Protective Groups in Organic Chemistry" Plenum Press, (1973) etc.

The polymer ($P_4$) can also be prepared by known living polymerization such as ionic polymerization, group transition polymerization, porphyrin metal polymerization and photoinitiator polymerization.

Polymer ($P_4$) can also be prepared by radical copolymerization using polymeric azo initiators described in the following references: Akira Ueda, Susumu Nagai et al., Kobunshi Ronbunshu,33,131(1976), Akira Ueda, Susumu Nagai et al., Kagaku to Kogyo, 64, 446(1990).

(The polymer (Q))

The following illustrates the polymer (Q), namely the polymer ($Q_1$) and the polymer ($Q_2$).

(The polymer ($Q_1$))

As explained above, the polymer ($Q_1$) is a low molecular weight polymer containing the units of the above mentioned formula I and the above mentioned polar group. The polar group can be contained in a substituent group on one end of the main chain of the polymer, or in a repeating unit of the main chain.

If the polar group is contained in both of the repeating unit of the main chain and the substituent on one end of the main chain, the repeating unit having the polar group can be contained in an amount of 0.05 to 10% by weight based on the total weight of the polymer ($Q_1$), and the sum of the weight of the repeating unit having the polar group and the weight of the substituent having the polar group is 0.5 to 15% by weight, preferably 1 to 10% by weight. The sum of the weights of less than 0.5% by weight results in lower initial potential which causes insufficient density of images, and more than 15% by weight results in poor dispersion properties which causes deterioration of image quality and background contamination, even if the polymer ($Q_1$) has a low molecular weight.

The unit of the formula I is preferably the methacrylate unit having an aryl group represented by the following formula Ia or Ib:

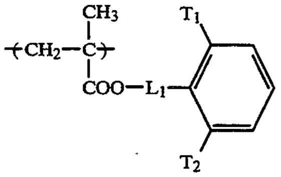
(Ia)

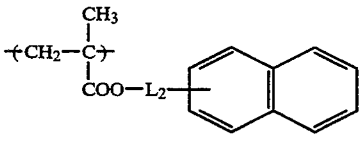
(Ib)

wherein $T_1$ and $T_2$ each represents independently a hydrogen atom, a hydrocarbon group having 1 to 10 carbon atoms, a chlorine atom, a bromine atom, $-COR_4$ or $-COOR_5$ ($R_4$ and $R_5$ each represents independently a hydrocarbon group having 1 to 10 carbon atoms), $L_1$ and $L_2$ each represents independently a single bond, a linking group having 1 to 4 atoms in a main chain.

The weight-average molecular weight of the polymer ($Q_1$) is $1\times10^3$ to $2\times10^4$, preferably $3\times10^3$ to $1\times10^4$. The glass transition temperature of the polymer ($Q_1$) is preferably −30° C. to 110° C., especially −20° C. to 90° C.

Less than $1\times10^3$ of the weight-average molecular weight results in lower ability of coating. More than $2\times10^4$ of the weight-average molecular weight results in lowering of dark charge retention property and photosensitivity in severe condition such as high or low temperature and high or low humidity, and hence, the effect of the present invention, that is a stable image reproduction, cannot attained sufficiently.

The units of the formula I may be contained in an amount of not less than 30% by weight, preferably 50 to 97% by weight based on the total weight of the polymer ($Q_1$).

The polymer ($Q_1$) preferably contains the unit of the formula Ia or Ib which comprises methacrylate portion having a residue of unsubstituted benzene, unsubstituted naphthalene or benzene substituted by a particular substituent at 2 and/or 6 position thereof, and has a polar group on one end of the polymer.

The following illustrates the units of the formula I more in detail.

In the formula I, preferably, $a_1$ and $a_2$ each represents independently a hydrogen atom, a cyano group, an alkyl group having 1 to 4 carbon atoms (such as methyl, ethyl, propyl and butyl), $-COOR_8$, or $-Z-COOR^8$ ($R^8$ is a hydrogen atom or an alkyl group having 1 to 18 carbon atoms, an alkenyl group having 2 to 18 carbon atoms, an aralkyl group having 7 to 18 carbon atoms, an alicyclic group having 3 to 18 carbon atoms or an aryl group having 6 to 18 carbon atoms which may be substituted such as groups exemplified below for $R^3$, and Z is a hydrocarbon group such as methylene, ethylene and propylene.

$R^3$ is preferably an alkyl group having 1 to 18 carbon atoms which may be substituted (such as methyl, ethyl, propyl, butyl, pentyl, hexyl, octyl, decyl, dodecyl, tridecyl, tetradecyl, 2-chloroethyl, 2-bromoethyl, 2-cyanoethyl, 2-hydroxyethyl, 2-methoxyethyl, 2-ethoxyethyl and 3-hydroxypropyl), an alkenyl group having 2 to 18 carbon atoms which may be substituted (such as vinyl, allyl, isopropenyl, butenyl, hexenyl, heptenyl and octenyl), an aralkyl group having 7 to 12 carbon atoms which may be substituted (such as benzyl, phenethyl, naphthylmethyl, 2-naphthylethyl, methoxybenzyl, ethoxybenzyl and methylbenzyl), a cycloalkyl group having 5 to 8 carbon atoms which may be substituted (such as cyclopentyl, cyclohexyl and cycloheptyl) or an aryl group which may be substituted (such as phenyl, tolyl, xylyl, mesityl, naphthyl, methoxyphenyl, ethoxyphenyl, fluorophenyl, difluorophenyl, bromophenyl, chlorophenyl, dichlorophenyl, iodophenyl, methoxycarbonylphenyl, et hoxycarbonylphenyl and cyanophenyl).

Preferably, $T_1$ and $T_2$ each represents independently a hydrogen atom, a chlorine atom, a bromine atom, a hydrocarbon group having 1 to 10 carbon atoms such as an alkyl group having 1 to 4 carbon atoms (for example, methyl, ethyl, propyl, butyl, and the like), an aralkyl group having 7 to 9 carbon atoms (such as benzyl, phenethyl, 3-phenylpropyl, chlorobenzyl, dichlorobenzyl, bromobenzyl, methylbenzyl, methoxybenzyl and chloromethylbenzyl), an aryl group (such as phenyl, tolyl, xylyl, bromophenyl, methoxyphenyl, chlorophenyl, dichlorophenyl), or $-COR_4$ or $-COOR_5$ (preferably, $R_4$ and $R_5$ each represents hydrocarbons mentioned above as a hydrocarbon having 1 to 10 carbon atoms).

Preferably, $L_1$ and $L_2$ in the formula Ia and Ib each represents independently a single bond or a linking group having 1 to 4 atoms in a main chain such as $-(CH_2)_{n1}-$ ($n_1$ is an integer of 1 to 3), $-CH_2O-CO-$, $-CH_2CH_2O-CO-$, $-CH_2CH_2O-$, especially a linking group having 1 to 2 atoms in a main chain.

The following is examples of the units in the polymer ($Q_1$), which should not be understood to restrict the present invention. In the following formulae (q-1) to (q-20), n is an integer of 1 to 3, m is integer of 0 or 1 to 3, $p_1$ is an integer of 1 to 3, $R_9$ to $R_{12}$ each represents $-C_nH_{2n+1}$ or $-(CH_2)m-C_6H_5$ (n and m are the same as defined above), $X_1$ and $X_2$ are same or different, each represents a hydrogen atom, —Cl, —Br or —I.

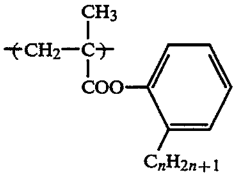
(q-1)

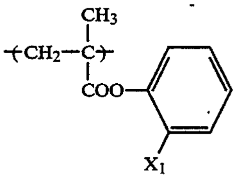
(q-2)

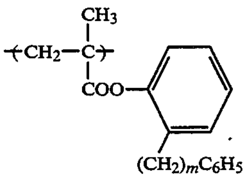
(q-3)

-continued
(q-4)
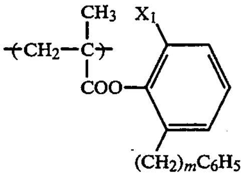
(q-5)
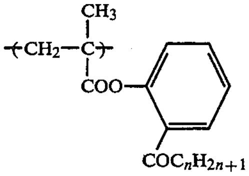
(q-6)
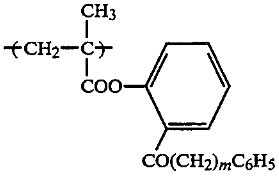
(q-7)
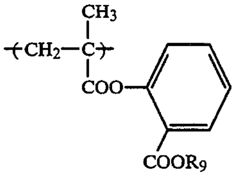
(q-8)
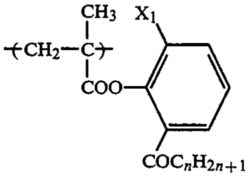
(q-9)
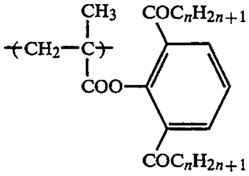
(q-10)
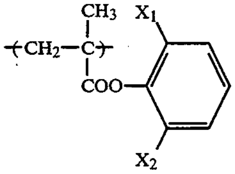
(q-11)
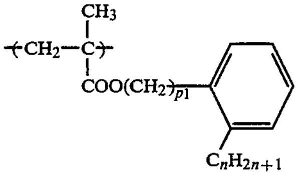
(q-12)
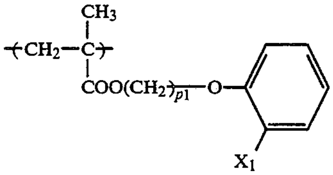
-continued
(q-13)
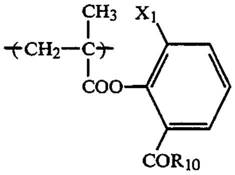
(q-14)
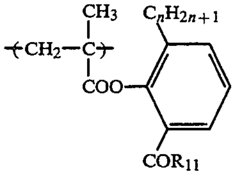
(q-15)
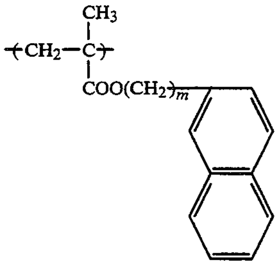
(q-16)
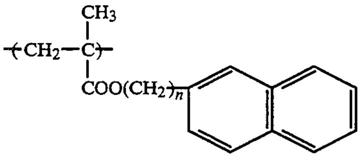
(q-17)
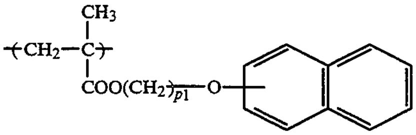
(q-18)
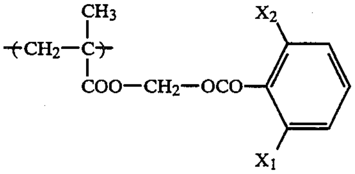
(q-19)
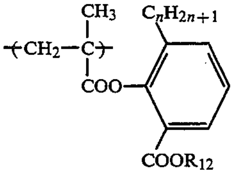
(q-20)
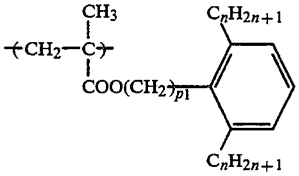
The following illustrates the polar group contained in the repeating unit in the main chain or in the substituent on one end of the main chain.
The polar group may be one selected from the group consisting of $—PO_3H_2$, $—SO_3H$, $—COOH$, $—PO(OH)R_1$ ($R_1$ is a hydrocarbon group or $—OR_2$ ($R_2$ is a hydrocarbon group) and a residue of a cyclic anhydride.

Preferably, $R_1$ and $R_2$ each represents an aliphatic group having 1 to 22 carbon atoms (such as methyl, ethyl, propyl, butyl, hexyl, octyl, decyl, dodecyl, octadecyl, 2-chloroethyl, 2-methoxyethyl, 3-ethoxypropyl, allyl, crotonyl, butenyl and cyclohexyl), an aralkyl group having 7 to 22 carbon atoms (such as benzyl, phenethyl, 3-phenylpropyl, methyl benzyl, chlorobenzyl, fluorobenzyl, methoxybenzyl), or an aryl group which may be substituted (such as phenyl, tolyl, ethylphenyl, propylphenyl, chlorophenyl, fluorophenyl, bromophenyl, chloromethylphenyl, dichlorophenyl, methoxyphenyl, cyanophenyl, acetamidophenyl, acetylphenyl and butoxyphenyl).

The residue of a cyclic anhydride may be a residue of an aliphatic dicarbonic anhydride or an aromatic dicarbonic anhydride.

Examples of aliphatic dicarboxylic anhydride include: succinic anhydride, glutaconic anhydride, maleic anhydride, cyclopentane-1,2-dicarbonic anhydride, cyclohexane-1,2-dicarboxylic anhydride and 2,3-bicyclo[2,2,2]octadicarboxylic anhydride, which may be substituted, for example, by a halogen atom such as a chlorine atom and a bromine atom or an alkyl group such as methyl, ethyl, butyl and hexyl.

Examples of aromatic dicarboxylic anhydride include: cyclic phthalic anhydride, cyclic naphthalene dicarboxylic anhydride, pyridine dicaroboxylic anhydride, thiophene dicarboxylic anhydride, these cyclic anhydrides may be substituted, for example, by a halogen atom such as a chlorine atom and a bromine atom or an alkyl group such as methyl, ethyl, propyl and butyl, a hydroxyl group, a cyano group, a nitro group, alkoxy carbonyl group (alkoxy may be methoxy, ethoxy and the like).

The polar group may be linked on one end of the main chain of the polymer ($Q_1$) directly or through a linking group. Examples of linking group include: the group represented by the formula: —($C(d_1)$ $(d_2)$)— ($d_1$ and $d_2$may be same or different, each represents a hydrogen atom, a halogen atom (such as a chlorine atom and a bromine atom), —OH, a cyano group, an alkyl group (such as methyl, ethyl, 2-chloroethyl, 2-hydroxyethyl, propyl, butyl and hexyl), an aralkyl group (such as a benzyl group and a phenethyl group), phenyl group); —($CH(d_3)$—$CH(d_4)$)— ($d_3$ and $d_4$ may be the same as defined above for $d_1$ and $d_2$); a cyclohexene group; a phenylene group; —O—; —S—; —$N(d_5)$— ($d_5$ is a hydrogen atom or a hydrocarbon group such as a hydrocarbon group having 1 to 12 carbon atoms (such as methyl, ethyl, propyl, butyl, hexyl, octyl, decyl, dodecyl, 2-methoxyethyl, 2-chloroethyl, 2-cyanoethyl, benzyl, methylbenzyl, phenethyl, phenyl, tolyl, chlorophenyl, methoxyphenyl and butylphenyl)); —CO—; —COO—; —OCO—; —$CON(d_5)$—; —$SO_2N(d_5)$—; —$SO_2$—; —NHCONH—; —NHCOO—; —$NHSO_2$—; —CONHCOO—; —CONHCONH—; a residue of a heterocyclic group having 5 or 6 members which contains at least one hetero atom such as an oxygen atom, a sulfur atom and a nitrogen atom and a condensate thereof such as thiophene, pyridine, furan, imidazole, piperidine and morpholine ring); or —$Si(d_6)(d_7)$— ($d_6$ and $d_7$ are same or different, each represents a hydrocarbon group or —$Od_8$ ($d_8$ is a hydrocarbon group such as groups mentioned above for $d_5$)). The linking group may be present solely or in combination.

The polymer ($Q_1$) may contain units other than the unit of the formula I.

Preferably, the polymer ($Q_1$) may contain units having a polar group(s).

The units having a polar group(s) may be any units corresponding to vinyl compounds having the polar group(s) which can copolymerize with a monomer corresponding to a unit of the formula I which contains a unit of formula Ia or Ib. The vinyl compounds are described in, for example, Polymer Society of Japan, "Polymer data handbook (fundamentals)" published by Baifukan, (1986). Examples of the compounds include acrylic acids, $\alpha$ and/or $\beta$-substituted acrylic acid (such as $\alpha$-acetoxy acrylic acid, $\alpha$-acetoxymethyl acrylic acid, $\alpha$- (2-amino)methyl acrylic acid, $\alpha$-chloro acrylic acid, $\alpha$-bromo acrylic acid, $\alpha$-fluoro acrylic acid, $\alpha$-tributylsylil acrylic acid, $\alpha$-cyano acrylic acid, $\beta$-chloro acrylic acid, $\beta$-bromo acrylic acid, $\alpha$-chloro-$\beta$-methoxy and $\alpha$, $\beta$-dichloro acrylic acid), methacrylic acid, itaconic acid, semi ester of itaconic acid, semi amides of itaconic acid, crotonic acid, 2-alkenylcarboxylic acids (such as 2-pentenoic acid, 2-methyl-2-hexenoic acid, 2-octenoic acid, 4-methyl-2-hexenoic acid, 4-ethyl-2-octenoic acid), maleic acid, semi esters of maleic acid, semi amides of maleic acid, vinyl benzene carboxylic acid, vinyl benzene sulfonic acid, vinyl sulfonic acid, vinyl phosphonic acid, vinyl- or allyl- semi ester of dicarboxylic acids, and esters and amides of these carboxylic acids and sulfonic acids, the esters and amides which contain polar group(s) as substituent(s).

Examples for the units having a polar group(s) include units of the following formulae (b-1) to (b-52). In the formulae, $e_1$ is a hydrogen atom or —$CH_3$, $e_2$ is a hydrogen atom, —$CH_3$ or —$CH_2COOCH_3$, $R_{14}$ is an alkyl group having 1 to 6 carbon atoms, benzyl or phenyl, c is an integer of 1 to 3, d is an integer of 2 to 11, e is an integer of 1 to 11, f is an integer of 2 to 4, and g is an integer of 2 to 10.

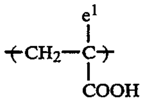
(b-1)

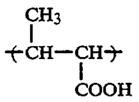
(b-2)

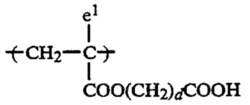
(b-3)

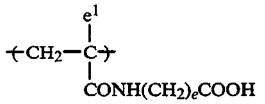
(b-4)

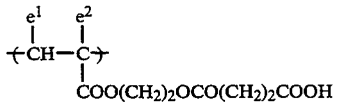
(b-5)

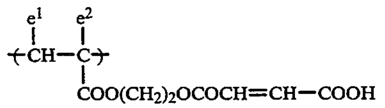
(b-6)

-continued
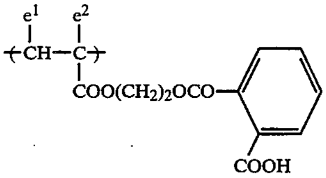
(b-7)
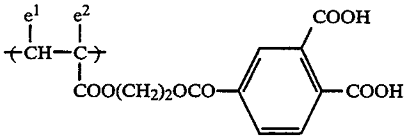
(b-8)
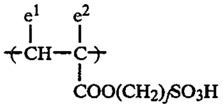
(b-9)
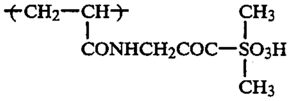
(b-10)
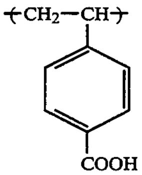
(b-11)
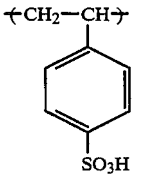
(b-12)
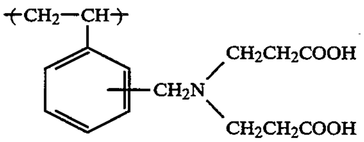
(b-13)
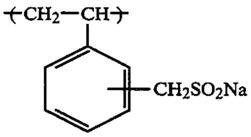
(b-14)
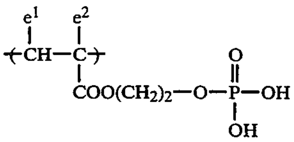
(b-15)
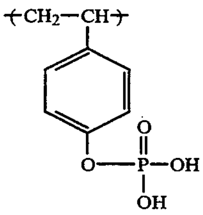
(b-16)
-continued
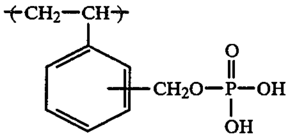
(b-17)
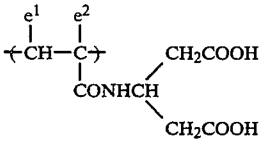
(b-18)
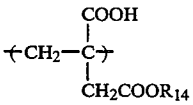
(b-19)
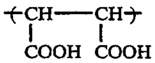
(b-20)
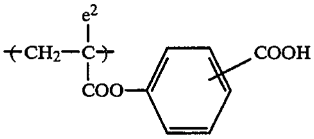
(b-21)
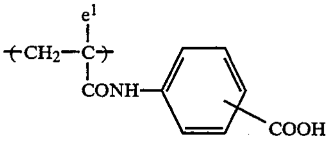
(b-22)
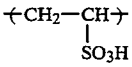
(b-23)
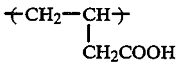
(b-24)
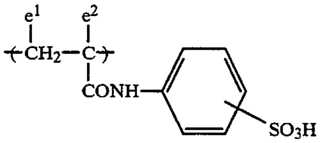
(b-25)
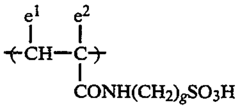
(b-26)
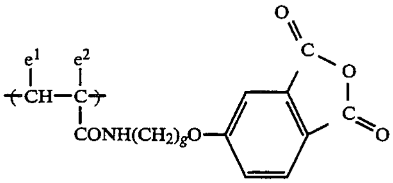
(b-27)
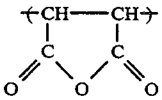
(b-28)

-continued
(b-29)
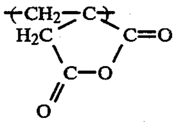
(b-30)
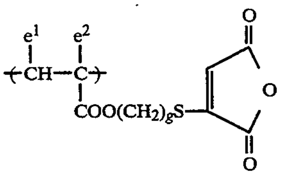
(b-31)
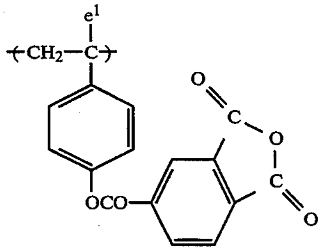
(b-32)
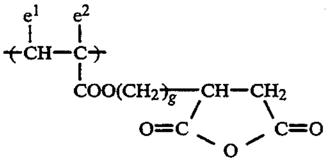
(b-33)
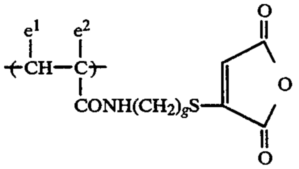
(b-34)
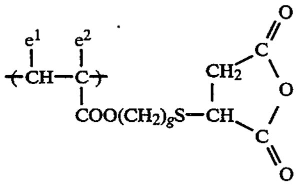
(b-35)
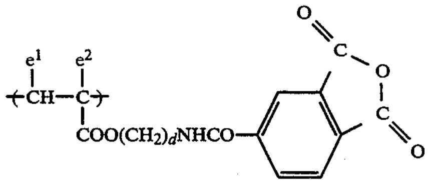
(b-36)
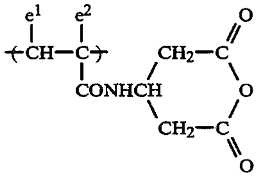
(b-37)
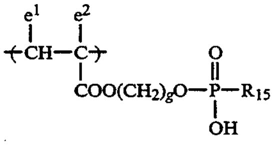
-continued
(b-38)
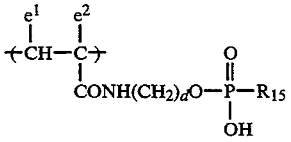
(b-39)
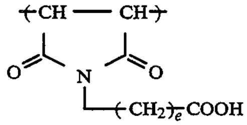
(b-40)
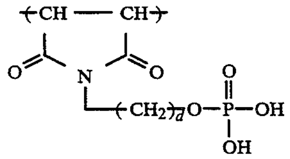
(b-41)
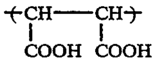
(b-42)
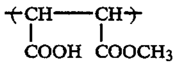
(b-43)
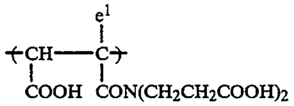
(b-44)
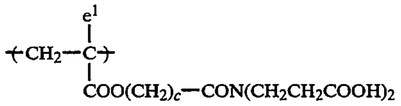
(b-45)
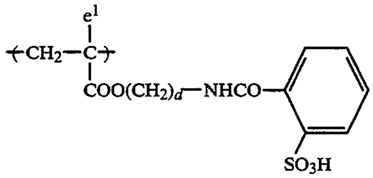
(b-46)
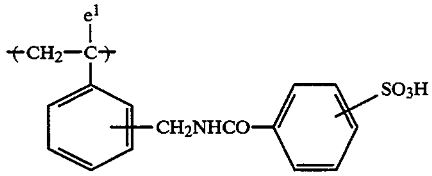
(b-47)
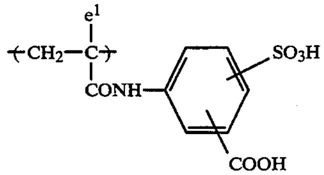
(b-48)
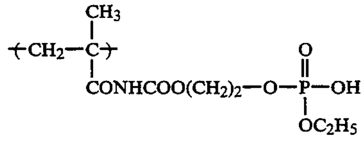

-continued

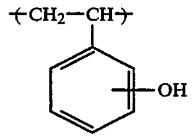

(b-49)

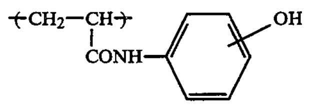

(b-50)

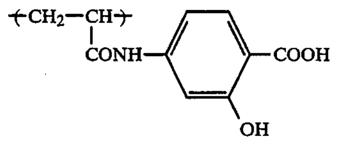

(b-51)

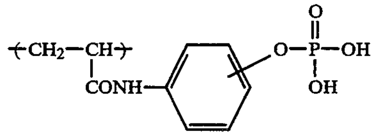

(b-52)

The polymer ($Q_1$) may contain units having photo and/or thermosetting group(s) in addition to the unit of the formula I and the units having the polar group(s).

The units having photo and/or thermosetting group(s) may be contained in an amount of not more than 20% by weight based on the total weight of the polymer ($Q_1$). More than 20% by weight of the units results in lower electrophotographic properties.

Examples of other units include: a residue of methacrylic acid esters, acrylic acid esters and crotonic acid esters having a group(s) other than groups mentioned above for the substituent group in the formula I; a residue of α-olefin; a residue of vinyl esters of a carboxylic acid or acrylic acid (carboxylic acid may be acetic acid, propionic acid, butyric acid, valeric acid, benzoic acid and naphthalene carboxylic acid); a residue of acrylonitrile; a residue of methacrylonitrile; a residue of vinyl ethers; a residue of itaconic acid esters (such as dimethyl esters and diethyl esters); a residue of acrylamides; a residue of methacrylamides; a residue of styrenes (such as styrene, vinyl toluene, chlorostyrene, hydroxystyrene, N,N-dimethylaminomethylstyrene, methoxycarbonylstyrene, m ethanesulufonyloxystyrene and vinylnaphthalene); a residue of a compound having vinyl sulfone group; a residue of a compound having vinyl ketone group; a residue of a heterocyclic compound having a vinyl group (such as vinyl pyrrolidone, vinyl pyridine, vinyl imidazole, vinyl thiophene, vinyl imidazoline, vinyl pyrazole, vinyl dioxane, vinyl quinoline, vinyl tetrazole and vinyloxazine). However, the present invention is not restricted by the above examples.

The above other units may preferably be contained in an amount of less than 30% by weight based on the total weight of the polymer ($Q_1$).

The methods for introducing the polar group to one end of the main chain of the polymer ($Q_1$) include: a method of reacting on end of living polymer obtained by known anionic polymerization or cationic polymerization with various reagents (namely, a method by ionic polymerization reaction); a method by a radical polymerization with a polymerization initiator and/or a chain transfer agent having a particular polar group therein, or a method for connecting the polymer obtained by the above mentioned method with polymers having a reactive group (such as amino group, a halogen atom, epoxy group and a residue of acid halide group).

Examples of the above method may be those described in the following literatures and references cited therein: P. Dreyfuss & R. P. Quirk, Encycl. Polym. Sci. Eng.,7, 551 (1987), Yoshiki Nakajo, Yuya Yamashita, "Senryo to Yakuhin", 30 232 (1985), Akira Ueda Susumu Nagai, "Kagaku to Kogyo", 60, 57 (1986).

Examples of the chain transfer agent used in the above mentioned method include: a mercapto compound having the polar group or the above reactive group which can produce the polar group (such as a residue of thioglycolic acid, thiomalic acid, thiosalicylic acid, 2-mercapto propionic acid, 3-mercapto propionic acid, 3-mercapto butyric acid, N-(2-mercapto propionyl) glycine, 2-mercapto nicotinic acid, 3-[(N-(2-mercapto ethyl) carbamoyl] propionic acid, 3-[N-(2-mercapto ethyl)amino]propionic acid, N-(3-mercapto propionyl) alanine, 2-mercapto ethane sulfonic acid, 3-butane sulfonic acid, 2-mercapto ethanol, 3-mercapto-1,2-propanediol, 1-mercapto-2-propanol, 3-mercapto2-butanol, mercapto-2-butanol, mercapto phenol, 2-mercapto ethylamine, 2-mercapto imidazole, 2-mercapto-3-pyridinol, 4-(2-methyloxycarbonyl) phthalic anhydride, 2-mercapto ethyl phosphonic anhydride, 2-mercapto ethyl phosphonic acid monomethylester, or iodoalkyl compound having the above polar group or the above substituent group (such as iodoacetic acid, iodopropionic acid, 2-iodoethanol, 2-iodoethanesulfonic acid and 3-iodopropane sulfonic acid).

Examples of the polymerization initiator having the reactive group include: 4,4'-azobis (4-cyanovaleric acid), 4,4'-azobis(4-cyanovaleric acid chloride), 2,2'-azobis(2-cyanopropanol), 2,2'-azobis(2-cyanopentanol), 2,2'-azobis[2-methyl-N-(2-hydroxyethyl)propionamide], 2,2'-azobis[2-methyl-N-1,1-bis(hydroxymethyl)-2-hydroxyethylpropionamide], 2,2'-azobis[2-(1-(2-hydroxyethyl)-2-imazoline-2-yl)propane], 2,2'-azobis[2-(2-imidazoline-2-yl)propane], 2,2'-azobis[2-(4,5,6,7-tetrahydro-1H-1,3-diazepine-2-yl)propane].

The above mentioned chain transfer agents or polymerization initiator may be used in an amount of 0.5 to 15% by weight, preferably 2 to 10% by weight based on an amount of monomer (s).

(The polymer ($Q_2$))

As explained above, the polymer ($Q_2$) is the AB type or ABA type block copolymer comprising the segment (M) which contains at least the units of the formula I and does not contain the units having the polar group(s) and the segment (N) having the particular polar group(s).

The segment (N) contains the units having the polar group in an amount of 0.05 to 10% by weight, preferably 0.1 to 10% by weight based on the total weight of the polymer ($Q_2$). The weight less than 0.05% by weight results in lower initial potential which causes insufficient density of images, and the weight more than 15% by weight results in poor dispersion properties which causes deterioration of evenness of the coating and electrophotographic properties under the condition of high temperature or high humidity, and causes background contamination when using as an offset master.

The weight-average molecular weight of the polymer ($Q_2$) is $1\times10^3$ to $2\times10^4$ preferably $3\times10^3$ to $1\times10^4$.

Less than $1\times10^3$ and more than $2\times10^4$ of the weight-average molecular weight result in lowering of electrophotographic properties, and hence, the effect of the present invention cannot be attained sufficiently.

The glass transition temperature of the polymer ($Q_2$) is preferably −30° C. to 100° C., especially 0° C. to 90° C.

(The segment (M))

The following illustrates the segment (M).

The segment (M) contains the unit of the formula I mentioned above in an amount of 30 to 100% by weight, preferably 50 to 100% by weight.

Preferably, $a^1$ and $a^2$ in the formula I each may represent a hydrogen atom, a halogen atom (such as a fluorine atom, a chlorine atom and a bromine atom), a cyano group or a hydrocarbon group (for example, an aliphatic group having 1 to 8 carbon atoms such as methyl, ethyl, propyl, butyl, pentyl and hexyl; benzyl; or an aromatic group having 6 to 12 carbon atoms such as phenyl. Especially, $a^1$ is a hydrogen atom, and $a^2$ is methyl.

$R^3$ represents an alkyl, aralkyl group or an aromatic ring, preferably an aralkyl group having benzene ring or naphthalene ring or an aromatic ring.

$R^3$ is preferably a hydrocarbon group having 1 to 18 carbon atoms which may be substituted. The substituent group for $R^3$ may be any group other than the polar group contained in the segment (N), for example, a halogen atom (such as a fluorine atom, a chlorine atom and a bromine atom), $-OR^5$, $-COOR^5$, or $-OCOR^5$ (wherein $R^5$ represents a hydrocarbon group having 1 to 22 carbon atoms such as methyl, ethyl, propyl, butyl, hexyl, octyl, decyl, dodecyl, hexadecyl and octadecyl). Preferably, the hydrocarbon may be an alkyl group having 1 to 18carbon atoms which may be substituted (such as methyl, ethyl, propyl, butyl, hexyl, heptyl, octyl, decyl, dodecyl, hexadecyl, octadecyl, 2-chloroethyl, 2-bromoethyl, 2-cyanoethyl, 2-methoxycarbonylethyl, 2-methoxyethyl, 3-brormopropyl); an alkenyl group having 4 to 18 carbon atoms which may be substituted (such as 2-methyl-1-propenyl, 2-butenyl, 2-pentenyl, 3-methyl-2-pentenyl, 1-pentenyl, 1-hexenyl, 2-hexenyl and 4-methyl-2-hexenyl); an aralkyl group having 7 to 12 carbon atoms which may be substituted (such as benzyl, phenethyl, 3-phenylpropyl, naphthylmethyl, 2-naphthylethyl, chlorobenzyl, bromobenzyl, methylbenzyl, ethylbenzyl, methoxybenzyl, dimethylbenzyl and dimethoxybenzyl); an alicyclic group having 5 to 8 carbon atoms which may be substituted (such as cyclohexyl, 2-cyclohexylethyl and 2-cyclopentylethyl); or an aromatic group having 6 to 12 carbon atoms which may be substituted (such as phenyl, naphthyl, tolyl, xylyl, propylphenyl, butylphenyl, octylphenyl, dodecylphenyl, methoxyphenyl, ethoxyphenyl, butoxyphenyl, decyloxyphenYl, chlorophenyl, dichlorophenyl, bromophenyl, cyanophenyl, acetylphenyl, methoxycarbonylphenyl, acetamidephenyl, propionamidephenyl and dodecyloylamidophenyl).

The units of the formula I containing $R^3$ is preferably the units represented by the formulae Ia and/or Ib mentioned above for the polymer ($Q_1$) as preferable units. Preferable examples of substituent groups in the formulae Ia and Ib and specific examples of the units of the formulae Ia and Ib may be the same as defined above for the polymer ($Q_1$).

Other unit in the segment (M) may be the units represented by the formula XII: $-(CH(m^1)-C(m^2)(X^1R^1))-$ ($X^1$ is $-CO-O-$, $-O-CO-$, $-(CH_2)-CO-O-$, $-(CH_2)_p-O-CO-$ (p is an integer of 1 to 3), $-O-$, $-SO_2-$, $-CO-$, $-CON(R^2)-$, $-SO_2N(R^2)-$, $-CONHCO-O-$, $-CONHCONH-$ or $-C_6H_4-$ ($R^2$ is a hydrogen atom or a hydrocarbon group, $R^1$ is a hydrocarbon atom, $m^1$ and $m^2$ are same or different, each represents the same as defined above for $a^1$ and $a^2$ in the formula I.

A hydrocarbon atom for $R^2$ may be preferably an alkyl group having 1 to 18 carbon atoms which may be substituted (such as methyl, ethyl, propyl, butyl, heptyl, hexyl, octyl, decyl, dodecyl, hexadecyl, octadecyl, 2-chloroethyl, 2-bromoethyl, 2-cyanoethyl, 2-methoxycarbonylethyl, 2-methoxyethyl and 3-bromopropyl), an alkenyl group having 4 to 18 carbon atoms which may be substituted (such as 2-methyl-1-propenyl, 2-butenyl, 2-pentenyl, 3-methyl-2-pentenyl, 1-pentenyl, 1-hexenyl, 2-hexenyl and 4-methyl-2-hexenyl), an aralkyl group having 7 to 12 carbon atoms which may be substituted (such as benzyl, phenethyl, 3-phenylpropyl, naphtylmethyl, 2-naphtylethyl, chlorobenzyl, bromobenzyl, methylbenzyl, ethylbenzyl, methoxybenzyl, dimethylbenzyl and dimethoxybenzyl), an alicyclic group having 5 to 8 carbon atoms which may be substituted (such as cyclohexyl, 2-cyclohexylethyl and 2-cyclopentylethyl) or an aromatic group having 6 to 12carbon atoms which may be substituted (such as phenyl, naphthyl, tolyl, xylyl, propylphenyl, butylphenyl, octylphenyl, dodecylphenyl, methoxyphenyl, ethoxyphenyl, butoxyphenyl, decyloxyphenyl, chlorophenyl, dichlorophneyl, bromophenyl, cyanophenyl, acetylphenyl, methoxycarbonylphenyl, ethoxycarbonylphenyl, butoxycarbonylphenyl, acetamidophenyl, propionamidophenyl and dodecyloylamidophenyl).

If $X^1$ is $-C_6H_4-$, the benzene ring may be substituted. The substituent group may be a halogen atom (such as a chlorine atom and a bromine atom), an alkyl group (such as methyl, ethyl, propyl, butyl, chloromethyl and methoxymethyl) or an alkoxy group (methoxy, ethoxy, propoxy and butoxy).

Preferable examples of $R^1$ include: an alkyl group having 1 to 22 carbon atoms which may be substituted (such as methyl, ethyl, propyl, butyl, heptyl, hexyl, octyl, decyl, dodecyl, tridecyl, tetradecyl, hexadecyl, octadecyl, 2-chloroethyl, 2-bromoethyl, 2-cyanoethyl, 2-methoxycarbonylethyl, 2-methoxyethyl and 3-bromopropyl), an alkenyl group having 4 to 18 carbon atoms which may be substituted (such as 2-methyl-1-propenyl, 2-butenyl, 2-pentenyl, 3-methyl-2-pentenyl, 1-pentenyl, 1-hexenyl, 2-hexenyl and 4-methyl-2-hexenyl), an aralkyl group having 7 to 12 carbon atoms which may be substituted (such as benzyl, phenethyl, 3-phenylpropyl, naphtylmethyl, 2-naphtylethyl, chlorobenzyl, bromobenzyl, methylbenzyl, ethylbenzyl, methoxybenzyl, dimethylbenzyl and dimethoxybenzyl), an alicyclic group having 5 to 8 carbon atoms which may be substituted (such as cyclohexyl, 2-cyclohexylethyl and 2-cyclopentylethyl), an aromatic group having 6 to 12 carbon atoms which may be substituted (such as phenyl, naphthyl, tolyl, xylyl, propylphenyl, butylphenyl, octylphenyl, dodecylphenyl, methoxyphenyl, ethoxyphenyl, butoxyphenyl, decyloxyphenyl, chlorophenyl, dichlorophenyl, bromophenyl, cyanophenyl, acetylphenyl, methoxycarbonylphenyl, ethoxycarbonylphenyl, butoxycarbonylphenyl, acetamidophenyl, propionamidophenyl and dodecyloylamidophenyl).

Especially, $X^1$ is $-CO-O-$, $-O-CO-$, $-CH_2O-CO-$, $-CH_2CO-O-$, $-O-$, $-CONH-$, $-SO_2NH-$ or $-C_6H_4-$.

The following other units can also be contained in the segment (M) together with the units of the formula XII:

the units corresponding to the monomer which can copolymerize with the monomer corresponding to the units of the formula XII, such as units corresponding to acrylonitrile, methacrylonitrile and a heterocyclic compound having a vinyl group (such as vinyl pyrrolidone, vinyl pyridine, vinyl imidazole, vinyl thiophene, vinyl pyrazole, vinyl dioxane, and vinyloxazine). The units may be contained in an amount of not more than 20% by weight based on the total weight of all units in the segment (M).

(The segment (N))

The following illustrates the segment (N) in the polymer ($Q_2$).

The segment (N) contains at least one polar group selected from the group consisting of $-PO_3H_2$, $-SO_3H$, $-COOH$, $-PO(OH)R^1$ and a residue of a cyclic acid anhydride.

$R^1$ is a hydrocarbon group or $-OR^2$ ($R^2$ is a hydrocarbon group), and preferably, $R^1$ and $R^2$ each represents a hydrocarbon group having 1 to 6 carbon atoms which may be substituted (such as methyl, ethyl, propyl, butyl, 2-chloroethyl, 2-bromoethyl, 2-fluoroethyl, 3-chloropropyl, 3-methoxypropyl, 2-methoxybutyl, benzyl, phenyl, propenyl, methoxymethyl, ethoxymethyl and 2-ethoxyethyl).

The residue of a cyclic anhydride may be the same as defined above for the polymer ($Q_1$). Examples of an aliphatic dicarboxylic anhydride and an aromatic dicarboxylic anhydride may be the same as defined above for the polymer ($Q_1$).

The units having the polar group(s) and examples thereof may also be the same as defined above for the polymer ($Q_1$).

More than one kind of the units having the particular polar group(s) mentioned above may be contained in the segment (N). In that case, the units can be contained in a random arrangement or in blocks.

Further, units other than the units having a polar group(s) may be contained in the segment (N). Preferably, the units may be the units of the formula I mentioned above. Also, the units may be other units than these other units mentioned above for the polymer ($Q_1$), which may be contained in an amount of not more than 20% by weight based on the total weight of the segment (N).

The polymer ($Q_2$) may be prepared by known polymerization methods. For example, the polymer ($Q_2$) may be prepared by the method wherein the polar group in monomers corresponding to a particular unit is protected by a protective group, and the protective group is released through a hydrolysis, hydrogenation, oxidative degradation or photodegradation after preparing a block copolymer by known living polymerization, reaction such as ionic polymerization by organic metal compounds (such as alkyl lithiums, lithium diisopropylamide, alkyl magnesium halides) or hydrogen iodide/iodine or photopolymerization wherein porphyrin metal complex is used as a catalyst or group transition polymerization. One example of the reactions is illustrated by the following reaction formula.

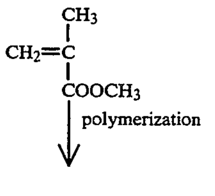

-continued

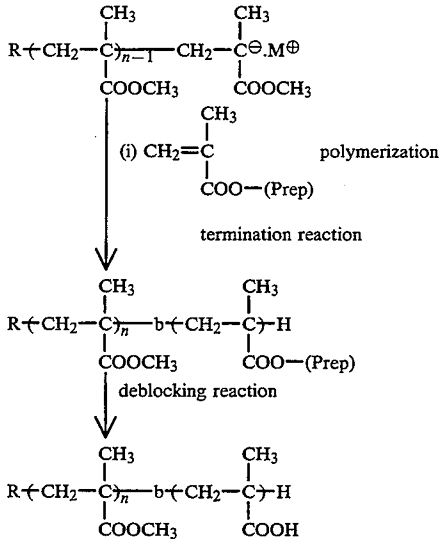

R: an alkyl group, a residue of porphyrin ring and the like (Prep): a protecting group (such as $-C(C_6H_5)_3$, $-Si(C_3H_7)s$ and the like —b—: block linkage For example, the methods are described in the following literature: p. Lutz, P.Masson et al., Polym. Bull., 12, 79(1984) B. C. Anderson, G. D. Andrews et al., Macromolecules, 14, 1601 (1981), K. Hatada, K. Ute. et al., Polym. J. 17, 977 (1985), 18, 1037(1986), Koichi Migite, Koichi Hatada, Kobunshikako, 36,366(1987), Toshinobu Higashimura, Mitsuo Sawamoto, papers for Polymer, 46, 189 (1989), M. Kuroki, T. Aida, J. Am. Chem. Soc. 109, 4737 (1987), Takuzo Aida, Shohei Inoue, Yukigoseikagaku, 43, 300(1985), D. Y. Sogah, W. R. Hertler et al., Macromolecules, 20, 1473(1987).

Further, the polymer ($Q_2$) can be prepared using a monomer having non-protected polar group by polymerization under light radiation using dithiocarbamate compound or xanthate compound as initiator. The method is described in the following literatures: Takayuki Otsu, Polymer, 37, 248 (1988), Shunichi Hinoemori, Takaiti Otsu, Polym. Rep. Jap. 37, 3508 (1988), J.P. KOKAI Nos. Sho 64-111 and Sho 64-26619, N. Higashi et al, Polymer Preprints, Japan, 36, (6), 1511 (1987), M. Niwa, J. Macromol. Sci. Chem. A24 (5), 567 (1987) etc.

Protection by the protective group and release of the protective group can be conducted easily by known techniques. Such methods are described also in the following references: Yoshio Iwakura, Keisuke Kurita, "Reactive Polymer", Kodansha Co.,Ltd (1977), T. W. Green, "Protective Groups in Organic Synthesis", John Wiley & Sons (1981), J. F. W Mc Omie, "Protective. Groups in Organic Chemistry" Plenum Press, (1973) etc.

Other methods for preparation of AB type block copolymer may be a method wherein azobis compound (namely, a high-molecular azobis initiator) containing one of the segment (M) and the segment (N) is prepared, and then with the resultant compound, the monomers corresponding to the units consisting the other segment are polymerized by radical polymerization reaction. The method is described in the following literatures: Akira Ueda et al, Papers for Polymer, 44, 469 (1987), Akira Ueda, Reports by Osaka City Industrial Laboratory, 84, (1989).

The weight average molecular weight of the high-molecular azobis initiator is preferably not more than $2\times10^4$ from the point of readiness of preparation thereof and regularity of polymerization to obtain a block copolymer.

In the polymer ($Q_2$) of the present invention, the segment (M) is preferably longer than the segment (N).

Accordingly, it is preferable to use the high-molecular azobis initiator containing the segment (N) when the polymer ($Q_2$) is prepared by this reaction. For example, the reaction is conducted in accordance with the following scheme.

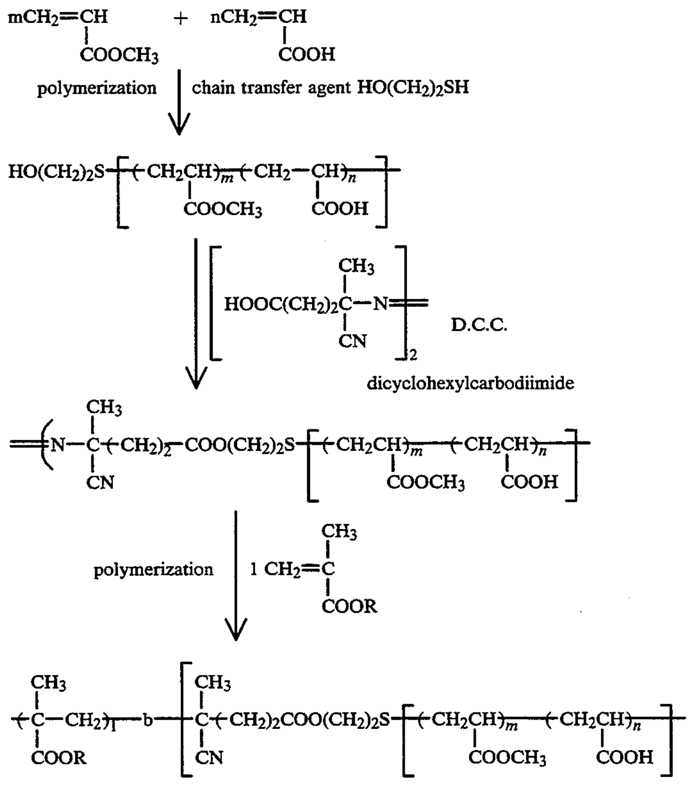

(The polymer (R))

The following illustrates the polymer (R) containing at least one photo and/or thermosetting group.

The photo and/or thermosetting group may be any group. However, for example, the groups mentioned above for the polymer (P) may be contained.

The polymer (R) may be any known polymer having the photo and/or thermosetting group used for the electrophotographic materials.

The polymer may be those described in the following literature: Takaharu Shibata, Jiro Isiwatari, Polymer, 17, p.278 (1968), Seiji Miyamoto, Hidehiko Takei, Imaging, 1973, (No. 8), Koich Nakamura, "Practical Techniques or Binder for Recording Materials", Chapter 10, C.H.C Co.,Ltd.,(1985), "Denshishasinyo yukikankotai no genjo sinpojium, Yokoshu" (1985), Hiroshi Kokado, "Recent Development and Utilization of Photoconductive Material and Photosensitive Material", published by Nihonkagakujoho Co.,Ltd.,(1986), Denshishashingakkai, "Denshishashingijutu no kiso to oyo" the chapter 5, Korona sha, (1988), D. Tatt, S.C. Heidecker, Tappi,49, (No. 10), 439 (1966), E. S. Baltazzi, R. G. Blanclotte et al, Phot. Sci. Eng. 16, (No. 5), 354 (1972), Guen Chan Kei, Isamu Shimizu, Eiichi Inoue, Journal of Society of Electrophotographics of Japan,18, (No. 2), 22, (1980).

Examples of the polymer (R) include: olefin polymer and copolymer, vinyl chloride copolymer, vinylidene chloride copolymer, Vinyl alkanoate polymer and copolymer, allyl alkanoate polymer and copolymer, polymer and copolymer of styrene or derivative thereof, butadiene-styrene copolymer, isoprene-styrene copolymer, butadiene-unsaturated carboxylate copolymer, acrylonitrile copolymer, methacrylonitrile copolymer, alkyl vinyl ether copolymer, acrylate polymer and copolymer, methacrylate polymer and copolymer, styrene-acrylate copolymer, styrene-methacrylate copolymer, itaconic acid diester polymer and copolymer, maleic anhydride copolymer, acrylamide copolymer, methacrylamide copolymer, hydroxy modified silicone resin, polycarbonate resin, ketone resin, polyester resin, silicone resin, amide resin, hydroxy- and carboxyl-modified polyester resin, butyral resin, polyvinylacetal resin, cyclized rubber-methacrylate copolymer, cyclized rubber-acrylic ester copolymer, copolymer having heterocycle which does not have a nitrogen atom (heterocycle may be furan, tetrahydrofuran, thiophene, dioxane, dioxofuran, lactone, benzofuran, benzothiophene and 1,3-dioxetane) and epoxy resins.

In the photoconductive layer of the present invention, other binder resins can be employed in addition to the polymer (P), the polymer (Q) and the polymer (R). Such other resins may be any resins used in known electrophotographic materials as mentioned with respect to the polymer (R).

(Photo and/or thermosetting agent)

Preferably, the photoconductive layer of the electrophotographic material for color proofing of the present invention may further include a small amount of photo and/or thermosetting agent in order to improve curing characteristics of the coating. The word "photo and/or thermosetting agent" means a photo and/or thermosetting compound, oligomer, and resin and a crosslinking agent in this specification.

The photo and/or thermosetting agent may be used in an amount of 0.01–20 parts by weight, preferably 0.1–15 parts by weight per 100 parts by weight of the total amount of the polymer (P), the polymer (Q) and the polymer (R).

Less than 0.01 parts by weight of the photo and/or thermosetting agent results in insufficient improvement in hardening coating. More than 20 parts by weight of the photo and/or thermosetting agent results in disadvantageous influence on an electrophotographic property.

A photo and/or thermosetting resin may be any known curable resins, for example, resins having curable groups explained above for the segment (y) of the polymer (p).

The photo and/or thermosetting agent may be a crosslinking agent which is generally used as a crosslinking agent in the art and disclosed in the following literatures: Shinzo Yamamoto, Tosuke Kaneko, "Cross linking agent handbook", published by Taiseisha (1981); Kobunshigakkai, "Polymer Data Handbook (Fundamentals)", Baifukan (1986).

Examples of crosslinking agents include: organic silane compounds (such as silane coupling agent of vinyl trimethoxy silane, vinyl tributoxy silane, γ-glycidoxy propyl trimethoxy silane, γ-mercapto propyl triethoxy silane, γ-aminopropyltriethoxy silane), polyisocyanate compounds (such as toluylene diisocyanate, o-toluylene diisocyanate, diphenylmethane diisocyanate, triphenylmethane triisocyanate, polymethylenepolyphenyl isocyanate, hexamethylene diisocyanate, isophorone diisocyanate, polymeric polyisocyanate), polyols (such as 1,4-butanediol, polyoxypropyleneglycol, polyoxyalkyleneg/ycol, 1,1,1-trimthylolpropane), polyamines (such as ethylenediamine, γ-hydroxy propyl ethylenediamine, phenylene diamine, hexamethylene diamine, N-aminoethylpiperazine, modified aliphatic polyamine), polyepoxy group containing compounds and epoxy resins (such as compounds described in Hiroshi Kakiuchi, "Novel Epoxy Resins", Shokodo, (1985), Kuniyuki Hashimoto, "Epoxy Resins", Nikkan kogyo newspaper company,(1969)), melamine resins (such as compounds described in Mitsuwa Ichiro, Hideo Matsunaga, "Urea Melamine Resins", Nikkan kogyo newspaper company, (1969)) and poly(metha)acrylate compound (such as compound described in Haranobu Okawa, Takeo Saegusa, Toshinobu Higasimura, "Oligomer", Kodansha, (1976), Eizo Omori, "Functional acrylic resin", Technosystem, (1985)). Further, monomers having polyfunctional curable groups such as vinylmethacrylate, allylmethacrylate, ethyleneglycoldiacrylate, polyethy leneglycoldiacrylate, divinylsuccinate, divinyladipate, diallylsuccinate, 2-methylvinylmethacrylate, trimethyl olpropanetrimethacrylate, divinylbenzene and pentaerythrytol polyacrylate may also be used.

As explained above, the present invention is characterized in that the photoconductive layer which contacts with a transfer layer is cured after the photoconductive layer is formed by coating. Accordingly, it is preferable to use the polymer (P), the polymer (Q), the polymer (R), and the photo and/or thermosetting agent in appropriate combination so that each polymer may have functional groups which can bond chemically with each other.

Such combinations of functional groups are well known in the art. For example, the combinations of functional groups are shown in the following table as combination of functional groups of Group A and functional groups of Group B. The table should not be understood to limit the present invention.

TABLE 1

| Group A | Group B |
|---|---|
| —COOH | 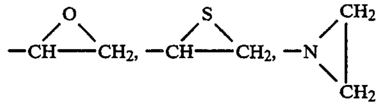 |
| —$PO_3H_2$ | —COCl, —$SO_2Cl$, a residue of a cyclic acid anhydride |
| —OH | —N=C=O, —N=C=S, |
| —SH<br>—$NH_2$ | 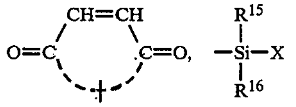 (X = Cl, Br) |
| —NHR<br>—$SO_2H$ | 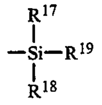 |
| | a block isocyanate group |
| | —NHCOOR' (R': e.g. 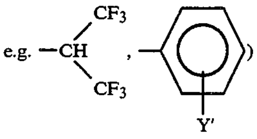 [Y': —$CH_3$, —Cl, —$OCH_3$] |
| | 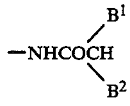 ($B^1$, $B^2$ are electron attractive groups) |
| | 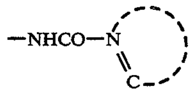 (e.g. imidazole group) |

R is a hydrocarbon group. $R^{15}$ and $R^{16}$ are alkyl groups. $R^{17}$ to $R_{19}$ are alkyl or alkoxy groups. At least one of $R^{17}$ to $R^{19}$ is an alkoxy group. $B^1$ and $B^2$ are electron attractive groups such as —CN, —$CF_3$, —$COR^{20}$, —$COOR^{20}$ and —$SO_2OR^{20}$ ($R^{20}$ is a hydrocarbon group such as $C_nH_{2n+1}$ (n is an integer of 1 to 4), —$CH_2C_6H_5$ and —$C_6H_5$).

(Other additives)

A reaction accelerator may optionally be added to the binder (Q) in order to promote crosslinking reaction.

If the crosslinking reaction is a reaction of forming chemical bonds between functional groups, the following accelerator may be used: organic acids (such as acetic acid, propionic acid, butyric acid, benzensulfonic acid and p-toluenesulfonic acid); phenols (phenol, chlorophenol, nitrophenol, cyanophenol, bromophenol, naphthol and dichlorophenol), organometallic compounds (such as zirconium acetylacetonate, zirconium acetylacetate, cobalt acetyl acetate and tin dibutoxy dilaurylate), dithiocarbamic acid compounds (such as salts of diethyldithiocarbamic acid), thiuram disulfide compounds (such as tetramethylthiuram disulfide) and carboxylic anhydrides (such as phthalic anhydride, maleic anhydride, succinic anhydride, butylsuccinic anhydride, 3,3',4 4'-benzophenone tetracarboxylic dianhydride and trimellitic anhydride).

If the crosslinking reaction is a polymerization reaction, a polymerization initiator (such as peroxides and azobis compounds) may be used.

The above mentioned binder is cured by light and/or heat after coating. Cure by heat requires severer drying condition than the condition required for preparation of conventional electrophotographic materials. For example, higher temperature and/or longer time period are required for drying. Alternatively, it is preferable to heat the binder after drying a coating solvent. Heating may be conducted in the temperature between 60° C. and 150° C., for 5 to 120 minutes. Milder condition is possible if the above mentioned reaction accelerator is used.

Methods of photo-setting of particular functional groups of the resin of the present invention may be conducted with an actinic radiation.

The actinic radiation may be visible light, ultraviolet light, far ultraviolet light, electron beams, X rays, $\gamma$ rays, $\alpha$ rays, preferably ultraviolet. Rays having wave length between 310 nm and 500 nm is especially preferable. Generally, a mercury vapor lamp, a halogen lamp, etc. are used for the radiation. The radiation may be conducted at the distance of 5–50 cm, for the period of 10 seconds to 10 minutes.

(Photoconductive compounds)

The photoconductive compound used in the present invention may be either organic compounds or inorganic compounds.

The compound may be, for example, a known inorganic photoconductive compound such as zinc oxide, titanium oxide, zinc sulfide, cadmium sulfide and lead sulfide. Zinc oxide and titanium oxide are preferable from the environmental point of view.

If an inorganic photoconductive compound such as zinc oxide and titanium oxide are used, the binder resins are used in an amount of 10–100 parts by weight, preferably 15 to 40 parts by weight based on 100 parts by weight of the inorganic compound.

Organic photoconductive compounds may be any known compounds. For example, there may be mentioned those used in photoconductive layer comprising an organic photoconductive compound, a sensitizing dye and a binder resin described in J.P. KOKOKU Nos. Sho 37-17162 and Sho 62-51462, J.P. KOKAI Nos. Sho 52-2437, Sho 54-19803, Sho 56-107246 and Sho 57-161863; a photoconductive layer comprising a charge generating agent, a charge transporting agent and a binder resin described in J.P. KOKAI Nos. Sho 56-146145, Sho 60-17751, Sho 60-17752, Sho 60-17760, Sho 60-254142 and Sho 62-54266; a double layer type of photoconductive layer containing a charge generating agent and a charge transporting agent in different layers described in J.P. KOKAI Nos. Sho 60-230147, Sho 60-230148 and Sho 60-238853.

Examples of organic photoconductive compounds for the first type include:

(a) Triazol derivatives described in U.S. Pat. No. 3112197;

(b) Oxadiazol derivatives described in U.S. Pat. No. 3189447;

(c) Imidazol derivatives described in J.P. KOKOKU No. Sho 37-16096;

(d) Polyarylalkane derivatives described in U.S. Pat. Nos. 3,615,402, 3,820,989, and 3,542,544, J.P. KOKOKU No. Sho 45-555 and Sho 51-10983; J.P. KOKAI Nos. Sho 51-93224, Sho 55-108667, Sho 55-156953 and Sho 56-36656.

(e) Pyrazoline or pyrazolone derivatives described in U.S. Pat. Nos. 3,180,729; and 4,278,746; J.P. KOKAI Nos. Sho 55-88064, Sho 55-88065, Sho 49-105537, Sho 55-51086, Sho 56-80051, Sho 56-88141, Sho 57-45545, Sho 54-112637 and Sho 55-74546.

(f) Phenylenediamine derivatives described in U.S. Pat. No. 3,615,404, J. P. KOKOKU Nos. Sho 51-10105, Sho 46-3712 and Sho 47-28336; J.P. KOKAI Nos. Sho 54-83435, Sho 54-110836 and Sho 54-119925.

(g) Aryl amine derivatives described in U.S. Pat. Nos. 3,567,450; 3,180,703; 3,240,597; 3,658,520; 4,232,103; 4,175,961; and 4,012,376; J.P. KOKOKU No. Sho 49-35702; West Germany Patent DASNo. 1110518, J.P. KOKOKU No. Sho 39-27577; J.P. KOKAI Nos Sho 55-144250, Sho 56-119132 and Sho 56-22437.

(h) Amino substituted chalcone derivatives described in U.S. Pat. No. 3,526,501;

(i) N,N-bicarbazyl derivatives described in U.S. Pat. No. 3,542,546;

(j) Oxazol derivatives described in U.S. Pat. No. 3257203;

(k) Styryl anthracene derivatives described in J.P. KOKAI No. Sho 56-46234;

(l) Fluorenone derivatives described in J.P. KOKAI No. Sho 54-110837;

(m) Hydrazone derivatives described in U.S. Pat. No. 3,717,462; J.P. KOKAI Nos. Sho 54-59143 (corresponding to U.S. Pat. No. 4,150,987), Sho 55-52063, Sho 55-52064, Sho 55-46760, Sho 55-85495, Sho 57-11350, Sho 57-148749 and Sho 57-104144.

(n) Benzidine derivatives described in U.S. Pat. Nos. 4,047,948; 4,047,949; 4,265,990; 4,273,846; 4,299,897; and 4306008.

(o) Stilbene derivatives described in J.P. KOKAI Nos. Sho 58-190953, Sho 59-95540, Sho 59-97148, Sho 59-195658 and Sho 62-36674.

(p) Polyvinylcarbazole and derivatives thereof described in J.P. KOKOKU No. Sho 34-10966;

(q) Vinyl polymer such as polyvinylpyrene, polyvinylanthracene, poly-2-vinyl-4-(4'-dimethylaminophenyl)-5-phenyl-oxazol, poly-3-vinyl-N-ethylcarbazole in J.P. KOKOKU Nos. Sho 43-18674 and Sho 43-19192;

(r) Polymers such as polyacenaphthylene, polyindene, copolymer of acenaphthylene with styrene in J.P. KOKOKU No. Sho 43-19193;

(s) Condensation polymers such as pyrene-formaldehyde resin, bromopyrene-formaldehyde resin, ethylcarbazol-formaldehyde resin described in J.P. KOKAI Nos. Sho 56-13940;

(t) Triphenylmethane polymers described in J.P. KOKAI Nos. Sho 56-90833 and Sho 56-161550.

Organic photoconductive compounds should not be limited to the above compounds of (a) to (t), and may be any known organic photoconductive compounds. They may be used alone or in combination containing more than two kinds of compounds.

Any known organic and inorganic charge generating agents in the art of an electrophotographic material may be used as a charge generating agent in the photoconductive layer. Examples of the charge generating agents include selenium, selenium-tellurium, cadmium sulfide, zinc oxide, and the following organic pigments, (1) Azo pigments such as monoazo, bisazo and trisazo pigments described in U.S. Pat. Nos. 4,436,800, and 4,439,506, J.P. KOKAI Nos. Sho 47-37543, Sho 58-123541, Sho 58-192042, Sho 58-219263, Sho 59-78356, Sho 60-179746, Sho 61-148453 and Sho 61-219263, J.P. KOKOKU No. Sho 60-5941 and No. Sho 60-45664;

(2) Phthalocyanine pigments such as nonmetallic or metallic phthalocyanines described in U.S. Pat. No. 3,397,086, U.S. Pat. No. 4,666,802, J.P. KOKAI Nos. Sho 51-90827 and Sho 52-55643;

(3) Perylene pigments described in U.S. Pat. No. 3,371,884, J.P. KOKAI Nos. Sho 47-30330;

(4) Indigo and thioindigo pigments described in British Patent No. 2237680, J.P. KOKAI No. Sho 47-30331;

(5) Quinacridone pigments described in British Patents No. 2237680, J. P. KOKAI No. Sho 47-30332;

(6) Polycyclic quinone pigments described in British Patents No. 22376789, J.P. KOKAI Nos. Sho 59-184348, Sho 62-28738 and Sho 47-18544;

(7) Bisbenzimidazol pigments described in J.P. KOKAI Nos. Sho 47-30331 and Sho 47-18543;

(8) Squarium pigments described in U.S. Pat. Nos. 4,396,610 and 4,644,082.

(9) Azulenium pigments described in J.P. KOKAI Nos. Sho 59-53850 and Sho 61-21254.

The above mentioned pigments may be used solely or in combination which contains two or more of the pigments.

The ratio of the organic photoconductive compound to the binder depends on the compatibility of the photoconductive compound and the binder. Namely, the upper limit of an amount of the organic photoconductive compound depends on the compatibility of the photoconductive compound and the binder, and the excess of the organic photoconductive compound results in crystallization of the organic photoconductive compound. Since an electrophotographic sensitivity lowers in proportion to the amount of the photoconductive compound, the more organic photoconductive compound is preferable provided that the organic photoconductive compound does not crystallize. The organic photoconductive compound may be contained in an amount of 5–120 parts by weight, preferably 10–100 parts by weight per 100 parts by weight of the binder. The organic photoconductive compound may be used solely, or in combination.

(Sensitizing dyes)

Any sensitizing dyes can be used optionally in the electrophotographic material for color proofing of the present invention depending on kinds of light source for image exposure such as visible light or semiconductor laser beam. Examples of the sensitizing dyes include: carbonium dye, diphenylmethane dye, triphenylmethane dye, xanthene dye, phthalein dye, polymethine dye (such as oxonol dye, merocyanine cyanine dye, rhodacyanine dye and styryl dye) and phthalocyanine dye which may include metallic atoms and they are described in the following literatures: Haruki Miyamoto, Hidehiko Takei, Imaging,1973, (No. 8), page 12, C. J. Young et al., RCA Review, 15, page 469 (1954), Kohei Kiyota, Denkitushingakkaironbun, J63-C, (No. 2), page 97 (1980), Yuji Harazaki et al., Kogyokagakuzasshi, 66, pages 78 and 188 (1963), Tadaaki Tani, Nihonshashingakkai, 35, page 208 (1972).

Examples of carbonium dyes, triphenylmethane dyes, xanthene dyes and phthalein dyes are described in J.P. KOKOKU No. Sho 51-452, J.P. KOKAI Nos. Sho 50-90334, Sho 50-114227, Sho 53-39130 and Sho 53-82353, U.S. Pat. Nos. 3,052,540 and 4,054,450, J.P. KOKAI No. Sho 57-16456.

Examples of polymethine dyes such as oxonol dyes, merocyanine dyes, cyanine dyes and rhodacyanine dyes are described in F. M. Harmmer, The Cyanine Dyes and Related Compounds, U.S. Pat. Nos. 3,047,384, 3,110,591, 3,121,008, 3,125,447, 3,128,179, 3,132,942 and 3,622,317, British Patent Nos. 1226892, 1309274 and 14045898 and J.P. KOKOKU Nos. Sho 48-7814 and Sho 55-18892.

Examples of polymethine dyes which sensitize spectrally in near infrared to infrared region of wavelength of not less than 700 nm are described in J.P. KOKAI Nos. Sho 47-840 and Sho 47-44180, J.P. KOKOKU Nos. Sho 51-41061, Sho 49-5034, Sho 49-45122, Sho 57-46245, Sho 56-35141, Sho 57-157254, Sho 61-26044 and Sho 61-27551, U.S. Pat. Nos. 3,619,154 and 4,175,956 and "Research Disclosure", 1982, 216, 117–118.

The electrophotographic material of the present invention is advantageous also in that the performance thereof is not adversely influenced by sensitizing dyes used.

Further, conventional additives for electrophotographic materials may optionally be used in the electrophotographic material of the present invention.

Additives include, for example, a chemical sensitizer for improving the electrophotographic sensitivity, or a plasticizer or a surfactant for improving film performance.

Examples of chemical sensitizers include: an electron attractive compound such as halogens, benzoquinone, chloranyl, fluoranyl, bromanyl, dinitrobenzene, anthraquinone, 2,5-dichloro benzoquinone, nitrophenol, tetrachlorophthalic anhydride, 2,3-dichloro-5,6-dicyanobenzoquinone, dinitrofluorenone, trinitrofluorenone, tetracyanoethylene; polyarylalkane compounds, hindered phenol compounds, p-phenylenediamine compounds described in the following references: Hiroshi Komon, "The Latest Development and Utilization of Photoconductive Materials and Photosensitive Materials", chapter 4 to 6; Publishing department of Nihonkagakujouhou Co.,Ltd., (1986); and compounds described in J.P. KOKAI Nos. Sho 58-65439, Sho 58-102239, Sho 58-129439 and Sho 62-71965.

Examples of a plasticizer which can be added in order to improve plasticity of the photoconductive layer include: dimethylphthalate, dibutylphthalate, dioctylphthalate, triphenylphthalate, triphenylphosphate, diisobutyladipate, dimethylsebacate, dibutylsebacate, butyl laurate, methylphtharylethylglycolate and dimethylglycolphthalate. The plasticizer may be added in amount so that static properties of the photoconductive layer are not affected adversly.

The above mentioned additives are added usually in an amount of 0.001–2.0 parts by weight per 100 parts by weight of a photoconductive layer.

The photoconductive material is ground, and dispersed in a system comprising a binder, a solvent thereof and an additive by well known method in the art. For example, it is ground and dispersed in the system with the apparatus such as a ball mill, a Kady mill, a sand mill, a DYNO-MILL ®, a paint shaker, a roll mill and an ultrasonic dispersion apparatus described in Solomon, "Chemistry of Paint", etc.

Then, they are coated to the substrate, for example, with a barcoater, a reversecoater, or Dye coater in suitable coating amount for each imaging material system, and dried.

Solvents used for dispersing the photoconductive material may be any solvents and determined depending on such factors as the solubility of the binder. They may be used solely or in combination.

The transfer layer will hereunder be illustrated.

The transfer layer comprises a thermoplastic resin with weight-average molecular weight of $1\times10^3$ to $1\times10^6$, preferably $5\times10^4$ to $5\times10^5$, and with glass transition temperature of 0° C. to 100° C., preferably 20° to 85° C. Thermoplastic resin is used in an amount of not less than 70% by weight, preferably not less than 90% by weight of the transfer layer.

Examples of the thermoplastic resin include: vinyl chloride resin, polyolefin resin, olefin-styrene copolymer, vinyl alkanoate resin, polyester resin, polyether resin, acrylic resin, cellulose resin, aliphatic acid modified cellulose resin.

They are described in, for example, the following references: Nikkankogyoshinbunsha, "Plastic Material Lecture", 1 to 18, (1961); Vinyl Department of Kinkikagakukyokai, "Polyvinylchloride", published by Nikkankogyoshinbunsha, (1988); Eizo Omori, "Functionality of Acrylic resin", published by Technosystem, (1985); Eiichiro Takiyama, "Polyester Resin Handbook", published by Nikkankogyoshinbunsha, (1988); Kazuo Yumoto, "Saturated Polyester Resin Handbook", published by Nikkankogyoshinbunsha, (1989); Polymer Society of Japan, "Polymer Data Handbook", Chapter 1, published by Baifukan, (1986); Yuji Harazaki, "The latest handbook of binder technology", Chapter 2, published by Sogogijutu center (1985).

The thermoplastic resins may be used solely or in combination.

The transfer layer may include other additives in order to improve physical properties such as coating properties, film-forming property and strength of coating. Examples of additives include a plasticizer such as mentioned above for the photoconductive layer.

The thickness of the transfer layer is 0.1–10 μm, preferably 0.5 to 5 μm.

The transfer layer may be applied, for example, by a conventional coating method. For example, it is conducted using a coating solution containing an appropriate compound such as one mentioned above and a method such as one for coating of the photoconductive layer. In addition, the transfer layer may be applied by a spray drying method which is known in the art. The above coating methods of the transfer layer are not limitative.

(Preparation of Color Proof)

The method for preparing a color proof using the electrophotographic material for color proofing of the present invention is as follows. First of all, an image to be reproduced is formed on the light-sensitive material by a conventional electrophotographic process. Namely, charging, image exposure, development and fixing are conducted by well known methods in the art. Any type of developer such as a dry developer and a liquid developer may be used.

Examples of the method are described in, for example, Gen Machida, "Recording Material and Photosensitive Resin", p.107-127, (1983);. and Gakkaishuppan Center Co.,Ltd., Imaging, No. 2-5, "Development .Fixing. Charging. Trasfer in Electrophotography".

A combination of a scanning exposure method wherein an exposure is conducted based on a digital information using a laser beam and a developing method using a liquid developer is effective, since it can form a highly precise image.

One of examples will hereunder be described. The electrophotographic material is placed on a flat bed by a resister pin method, and is sucked from the backside to be fixed. Charging is conducted with a charging device such as one described in the following literature: Electrophotographic Society of Japan, "Fundamentals and Applications of Electrophotographic Technique", p. 212 et seq., published by Corona Co.,Ltd., in Jun. 15, 1963. Corotron or Scorotron method is generally used. It is also preferable to control the charging condition by feedback based on data from means for detecting charging potential, so that the surface potential may be in an appropriate range.

And then, scanning exposure to laser beams is conducted in accordance with the manner described in p. 254 et seq. of the above mentioned literature. First of all, the electrophotographic material is exposed using a dot pattern converted from image for yellow of four color separations.

Subsequently, a toner-development is conducted with a liquid developer. Namely, the charged and exposed material is removed from the flat bed, and developed by direct liquid development described in p. 275 et seq. of the above mentioned literature. The exposure mode is determined depending on the toner development mode. For example, a negative exposure is conducted for a reversal development. Namely, an image area is exposed to laser beams, and a development bias voltage is applied thereto so that a toner may be adsorbed on an image area. The toner should have the same charging polarity as one of the imaging material on charging. The detailed information is described in p. 157 et seq. of the above mentioned literature.

In order to remove the excess developer after development, the electrophotographic material are squeezed and dried as described in p. 283 of the above mentioned literature. It is also preferable to rinse the material with a liquid carrier for the developer.

Finally, the above procedures are repeated for each color, namely magenta, cyan, black to form an image with 4 colors on the electrophotographic material.

The toner image is heat-transfered to the regular paper for printing together with the transfer layer to form a color proof.

FIG. 1 shows an apparatus for heat-transfer of a transfer layer to a regular paper. The electrophotographic material is conveyed with appropriate nip pressure between a pair of rubber-coated metallic rollers equipped with a built-in heating means. Temperature on the surface of the rollers may be 50°–150° C., preferably 80°–120° C. Nip pressure between the rollers may be 0.2–20 kgf/cm², preferably 0.5–10 kgf/cm². Conveyance speed may be 0.1–100 mm/sec., preferably 1–30 mm/sec. The optimum values may be selected depending on the kind of the electrophotographic materials, namely the physical properties of the transfer layer, the photoconductive layer and the substrate.

It is preferable to keep the temperature on the surface of the rollers in a range defined above by known means. A means for preheating and/or cooling can be set in front of the heat rollers. Springs or air cylinders which use compressed air as means for pressing (which is not shown in FIG. 1) may also be set on the both ends of an axis of at least one of rollers.

As described above, the addition of the polymer (P) to the photoconductive layer can improve releasability of the photoconductive layer from the transfer layer. As a result, a color proof of high quality without color drift and defect in transfer can be obtained.

Examples of the present invention will hereunder be described in more detail, but they do not limit the present invention.

In the formulae in the examples, the symbol "-b-" represents that two block segments illustrated on both sides of the symbol are present in the form of blocks to form a block copolymer. Namely, a copolymer represented by the formula including the symbol "-b-" is not a random copolymer, but a block copolymer.

Example P-101

A solution of 70 g of methyl methacrylate, 20 g of methyl acrylate, 10 g of glycidyl methacrylate and 200 g of toluene was heated to 80° C. in a stream of nitrogen. 10 g of polymer azobis initiator (PI-1) of the following formula was added thereto, and reacted for 8 hours. After the reaction was completed, the reaction mixture was reprecipitated in 1.5 l of methanol. Then, the resultant precipitate was collected, and dried. 75 g of Poymer (P-101) was obtained ( Mw: $3\times10^4$).

(PI-1)

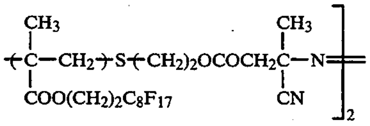

(P-101)

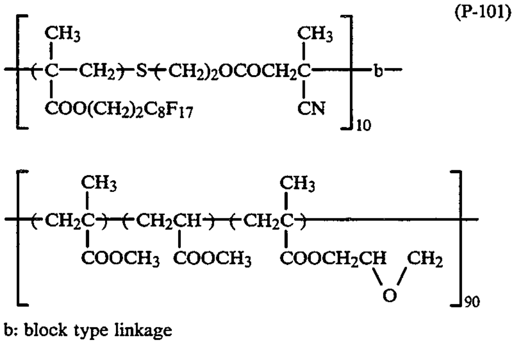

b: block type linkage

Example P-102

A solution of 63 g of methyl methacrylate, 12.8 g of tri(dipropyl)silylmethacrylate and 200 g of tetrahydrofuran was degassed sufficiently in a stream of nitrogen, and then cooled to −20° C. 0.8 g of 1,1-diphenyl butyl lithium was added thereto, and reacted for 12 hours. Then, a solution of 30 g of the monomer (M-1) of the formula:

$$CH_2{=}C(CH_3)(COO(CH_2)_2C_8F_{17}) \quad (M\text{-}1)$$

and 60 g of tetrahydrofuran which had been degassed sufficiently in stream of nitrogen was added thereto, and reacted for 8 hours. The resultant reaction mixture was cooled to 0° C. Then, 10 ml of methanol was added, and reacted for 30 minutes. Then, the polymerization was ceased, and the silyl ester was deblocked. The resultant polymer solution was stirred to 30° C., then 3 ml of 30% ethanol solution of hydrogen chloride was added, and stirred for 1 hour. Then, the reaction mixture was evaporated to half amount under reduced pressure, reprecipitated in 1l of petroleum ether. The resultant precipitate was collected, and dried under reduced pressure. 76 g of Polymer (P-102) was obtained (Mw: $6.8\times10^4$).

(P-102)

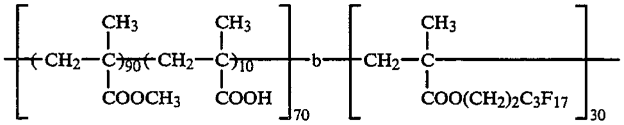

Example P-103

A solution of 63.8 g of methyl methacrylate, 19.7 g of 2-(trifluoroacetyloxy) ethyl methacrylate, 0.5 g of (tetraphenyl porphinato)aluminium methyl and 200 g of methylene chloride was heated to 30° C. in a stream of nitrogen. The resultant reaction mixture was irradiated with light from 300W-xenon lamp through glass filter from the distance of 25 cm, and reacted for 20 hours. Then, 25 g of the monomer (M-2) of the following formula was added thereto, and the reaction mixture was irradiated for 12 hours in the same manner as explained above. Then, 3 g of methanol was added to the reaction mixture. The reaction mixture was stirred for 30 minutes, and the reaction was ceased. 50 g of a solution of 5% by weight of p-toluene sulfonic acid in tetrahydrofran was added to the resultant reaction mixture to hydrolize. The resultant mixture was added to 2l of methanol to precipitate polymer, and the precipitate was collected and dried. 70 g of Polymer (P-103) was obtained (Mw: $7\times10^4$).

(M-2)

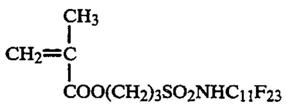

(P-103)

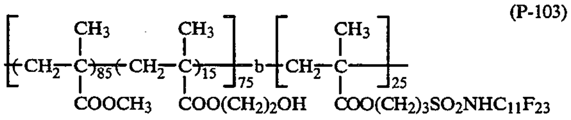

Example P-104

A mixture of 48 g of ethyl methacrylate, 12 g of glycidyl methacrylate and 2.4 g of benzyl N,N-diethyldithiocarbamate was fed to a vessel, sealed under a stream of nitrogen, heated to 50° C., and then, irradiated with light from 400W-high pressure mercury vapor lamp through glass filter from the distance of 10 cm for 6 hours to conduct photopolymerization. The resultant mixture was dissolved in 100 g of tetrahydrofuran, and 40 g of the monomer (M-3) of the following formula was added to the solution of resultant reaction mixture in 100 g of tetrahydrofuran. The vessel was purged with nitrogen, and the radiation was conducted for 10 hours again. The resultant reaction mixture was added to 11 of methanol to precipitate polymer, and the precipitate was collected and dried. 73 g of Polymer (P-104) was obtained (Mw: $8\times10^4$).

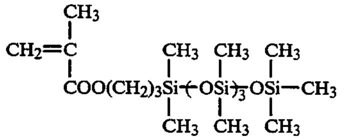

(M-3)

(P-104)

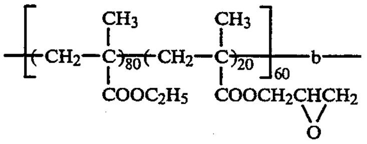

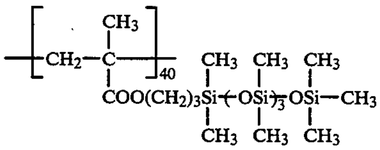

Example P-105

A mixture of 55 g of methyl methacrylate, 20 g of 3-(trimethoxysilyl)ethyl methacrylate and 1.0 g of benzyl isopropyl xanthate was fed to a vessel in a stream of nitrogen, sealed, heated to 50° C., and then, irradiated with light from 400W-high pressure mercury vapor lamp through a glass filter from the distance of 10 cm for 6 hours to conduct photopolymerization. Tetrahydrofuran was added to the resultant to form 40% solution and 25 g of the monomer (M-4) of the following formula was added to the solution. The vessel was purged with nitrogen, and the radiation was conducted for 10 hours. The resultant reaction mixture was added to 21 of methanol to precipitate polymer, and the precipitate was collected and dried. 63 g of Polymer (P-105) was obtained (Mw: $6\times10^4$).

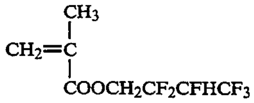

(M-4)

(P-105)

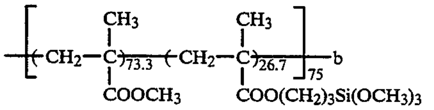

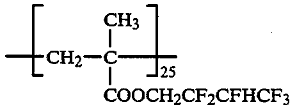

Examples P-106–P-114

Polymers listed in Table 102 were prepared in a similar manner to the method of Example P-105. Mw of each of resultant polymers (Polymers (P-106)–(P-114)) was in the range of $6\times10^4$ to $8\times10^4$.

TABLE 102

| Example | [P] | AB Type Block Copolymer (ratio by weight) |
|---|---|---|
| P-106 | P-106 | 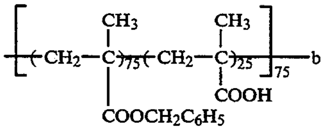 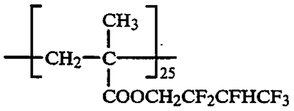 |
| P-107 | P-107 | 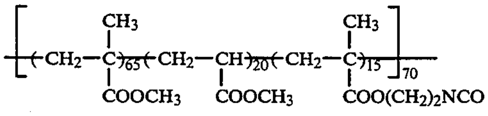 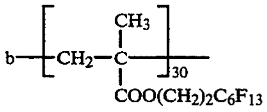 |

TABLE 102-continued
| Example | [P] | AB Type Block Copolymer (ratio by weight) |
|---|---|---|
| P-108 | P-108 | 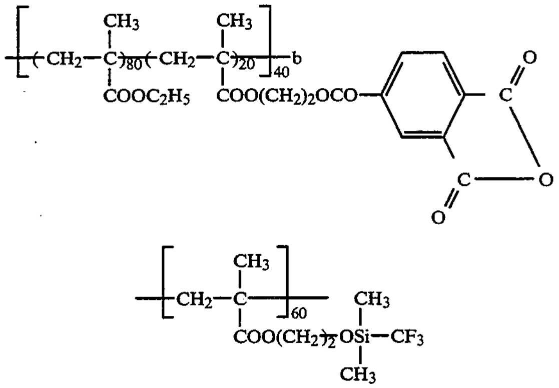 |
| P-109 | P-109 | 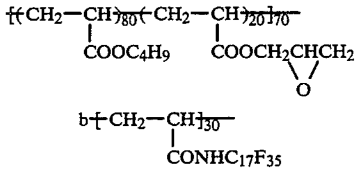 |
| P-110 | P-110 | 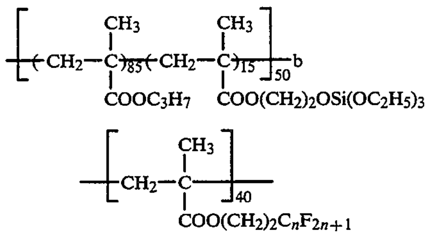 n: 8~10 |
| P-111 | P-111 | 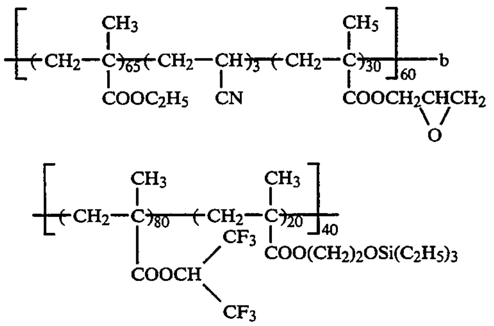 |
| P-112 | P-112 | 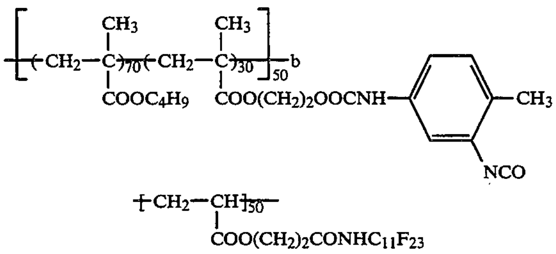 |
| P-113 | P-113 | 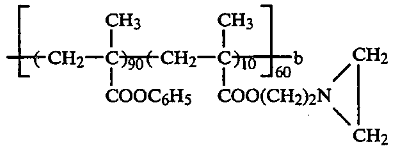 |

TABLE 102-continued

| Example | [P] | AB Type Block Copolymer (ratio by weight) |
|---|---|---|
| | | 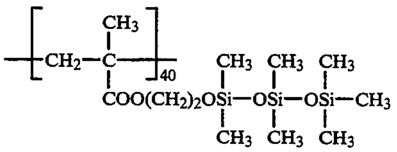 |
| P-114 | P-114 | 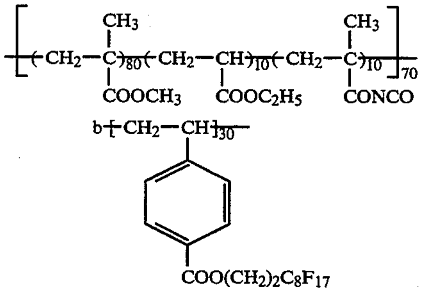 |

Example P-115

The procedures of Example P-104 were repeated except that 10 g of the initiator (I-2) of the following formula was substituted for benzyl N,N-diethyldithiocarbamate. Polymer (P-115) with Mw of $8.3\times10^4$ was obtained.

(I-2)

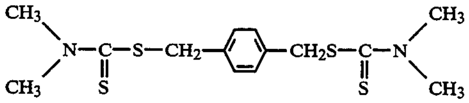

(P-115)

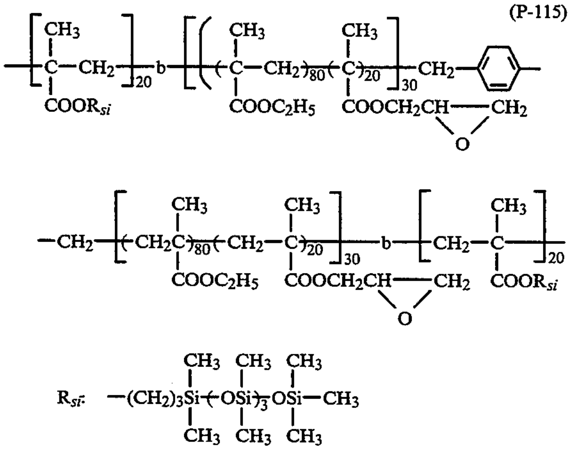

Example P-116

The procedures of Example P-105 were repeated except that 12 g of the initiator (I-3) of the following formula was substituted for benzyl isopropylxanthate. Polymer (P-116) having Mw of $9.3\times10^4$ was obtained.

(I-3)

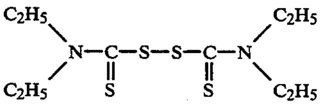

-continued

[P-116]

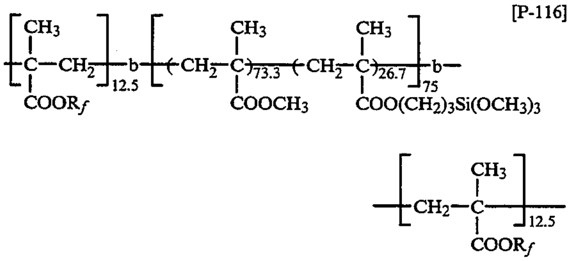

$R_f$: $-CH_2CF_2CFHCF_3$

Examples P-117–P-125

The procedures of Example P-104 were repeated except that 14 g of the initiator (I-4) of the following formula and monomers corresponding to units listed in Table 103 were used. Polymers (P-117)–(P-125) having Mw in the range of $7\times10^4$ to $9\times10^4$ were obtained.

(I-4)

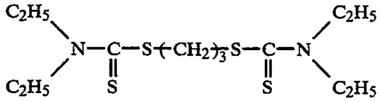

TABLE 103

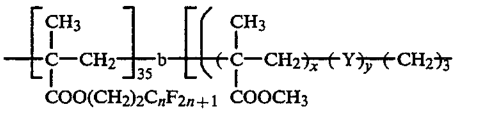

n = 8~10

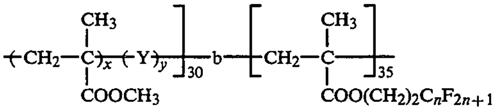

| Example | [P] | —Y— | x/y ratio by weight |
|---|---|---|---|
| P-117 | P-117 | 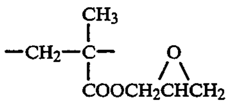 | 40/10 |
| P-118 | P-118 | 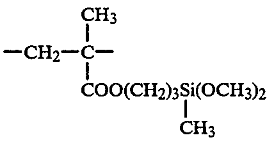 | 35/15 |
| P-119 | P-119 | 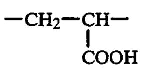 | 40/10 |
| P-120 | P-120 | 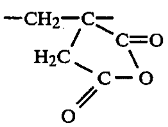 | 45/5 |
| P-121 | P-121 | 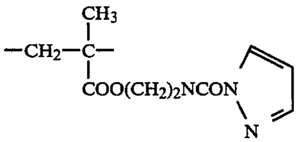 | 37.5/12.5 |
| P-122 | P-122 | 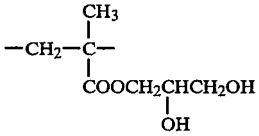 | 45/5 |

TABLE 103-continued

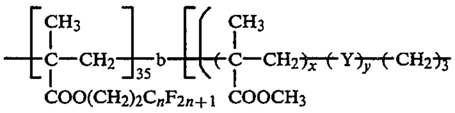

n = 8~10

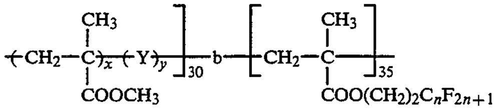

| Example | [P] | —Y— | x/y ratio by weight |
|---|---|---|---|
| P-123 | P-123 | 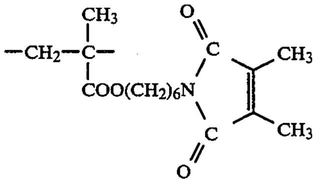 | 40/10 |
| P-124 | P-124 | 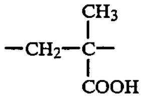 | 40/10 |
| P-125 | P-125 | 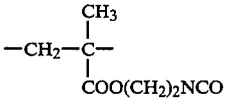 | 42.5/7.5 |

Examples P-126–P-134

The procedures of Example P-116 were repeated except that 9.6 g of the initiator (I-5) of the following formula and monomers corresponding to units listed in Table 104 were used. Polymers (P-126)-(P-134) having Mw in the range of $8\times10^4\sim10\times10^4$ were obtained.

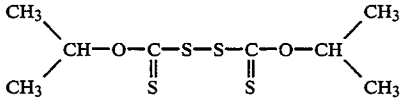

(I-5)

TABLE 104

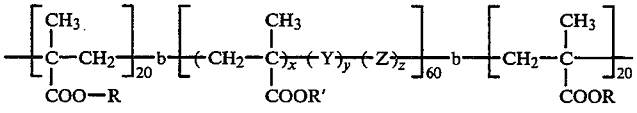

| Example | [P] | —R | —R' | —Y— | —Z | x/y/z ratio by weight |
|---|---|---|---|---|---|---|
| P-126 | P-126 | $-CH_2CF_2CFHCF_3$ | $-CH_3$ | — | 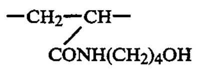 | 85/0/15 |
| P-127 | P-127 | 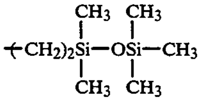 | $-CH_3$ | 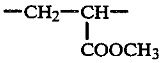 | 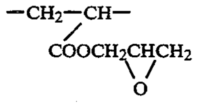 | 60/20/20 |

TABLE 104-continued

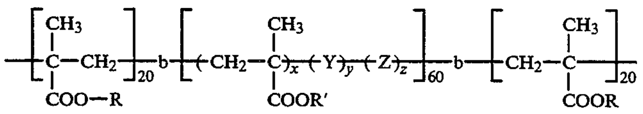

| Example | [P] | —R | —R' | —Y— | —Z | x/y/z ratio by weight |
|---|---|---|---|---|---|---|
| P-128 | P-128 | 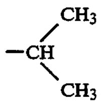 | $-C_2H_5$ | — |  | 85/0/15 |
| P-129 | P-129 | $-(CH_2)C_8F_{17}$ | $-CH_2C_6H_5$ | 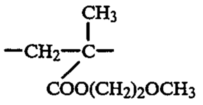 | 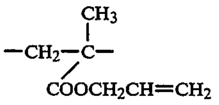 | 75/5/20 |
| P-130 | P-130 | " | $-C_4H_9$ | 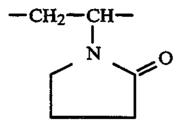 | 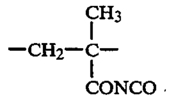 | 87.5/2.5/10 |
| P-131 | P-131 | " | $-C_2H_5$ | 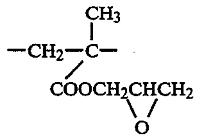 | 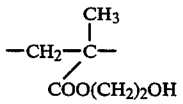 | 90/5/5 |
| P-132 | P-132 | $-(CH_2)_2SO_2-$ $-NHC_{17}F_{35}$ | $-C_3H_7$ | — | 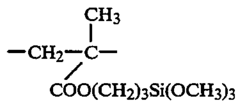 | 90/0/10 |
| P-133 | P-133 | $-(CH_2)_2CO-$ $-NHC_{11}F_{23}$ | $-CH_3$ | 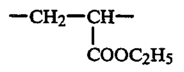 | 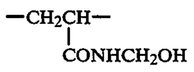 | 65/20/15 |
| P-134 | P-134 | 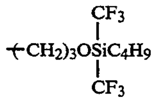 | $-C_4H_9$ | 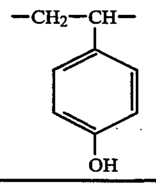 | 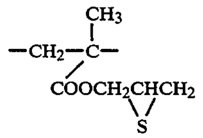 | 80/5/15 |

Examples P-135–P-138

A mixture of 40 g of monomers corresponding to units listed in Table 105, 11 g of the initiator (I-6) of the following formula, and 40 g of tetrahydrofuran was fed to a vessel under a stream of nitrogen, sealed, heated to 50° C., and then, irradiated with light from 400W-high pressure mercury vapor lamp through a glass filter from the distance of 10 cm for 12 hours to conduct photopolymerization. 23 g of methylmethacrylate, 22 g of methyl acrylate, and 50% by weight solution of 15 g of glycidyl methacrylate in tetrahydrofuran were added thereto. The vessel was purged with nitrogen, and the radiation was conducted for 10 hours. The resultant reaction mixture was added to 11 of methanol to precipitate polymer, and the precipitate was collected and dried. Polymers (P-135)-(P-138) having Mw in the range of $6\times10^4\sim8\times10^4$ were obtained.

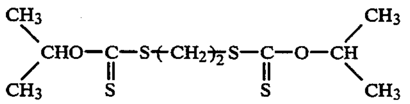

(I-6)

TABLE 5

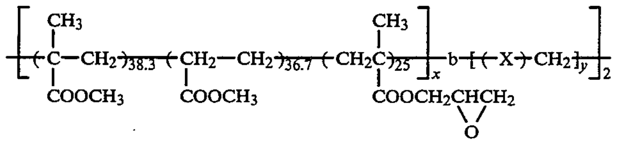

| Example | [P] | —X— | x/y ratio by weight |
|---|---|---|---|
| P-135 | P-135 | 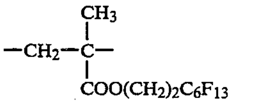 | 60/40 |
| P-136 | P-136 | 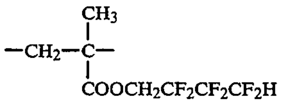 | 30/70 |
| P-137 | P-137 | 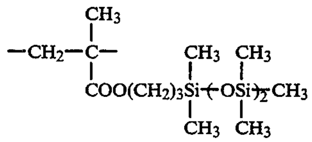 | 65/35 |
| P-138 | P-138 | 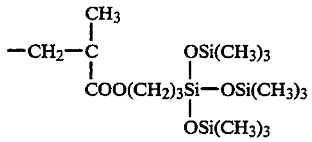 | 70/30 |

Example P-201

A mixture of 57 g of methyl methacrylate, 28 g of methyl acrylate, 15 g of glycidyl methacrylate, 17.5 g of initiator (I'-1) of the following formula, and 150 g of tetrahydrofuran was heated to 50° C. in a stream of nitrogen. The resultant reaction mixture was irradiated with light from 400W-high pressure mercury vapor lamp through glass filter from the distance of 10 cm for 10 hours to conduct photopolymerization. The resultant reaction mixture was added to 1.5 l of methanol to precipitate polymer, and the precipitate was collected and dried. 72 g of polymer having Mw of $4.0\times10^4$ was obtained.

40 g of the polymer, 60 g of the monomer (M'-2), and 100 g of tetrahydrofuran were heated to 50° C. in a stream of nitrogen. The resultant reaction mixture was irradiated for 15 hours in the above mentioned manner. The resultant reaction mixture was added to 1.5 l of methanol to precipitate polymer, and the precipitate was collected and dried. 78 g of polymer (P-201) having Mw of $6\times10^4$ was obtained.

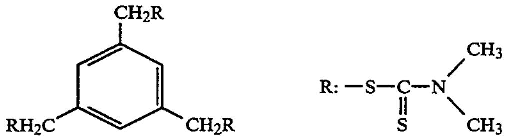

I'-1)

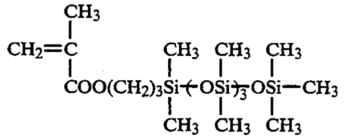

(M'-2)

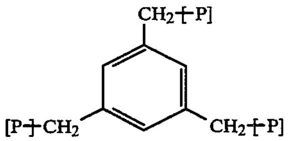

(P-201)

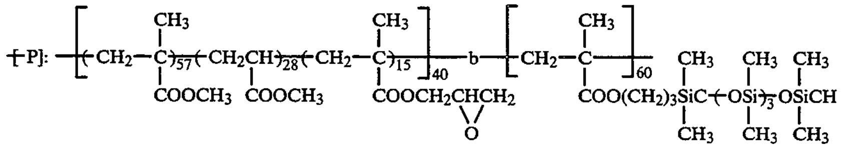

Examples P-202–P-214

The procedures of Example P-201 were repeated except that 0.031 mole of initiators listed in Table 202 were substituted for 17.5 g of the initiator (I'-2). 70 to 80 g of polymers (Polymers (P-202)-(P-214)) having Mw in the range of $4\times10^4$ to $6\times10^4$ were obtained.

TABLE 202
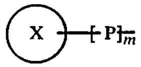
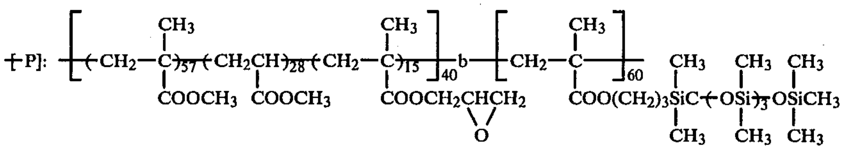
| Example | [P] | Initiator | —R |  |
|---|---|---|---|---|
| P-202 | P-202 | 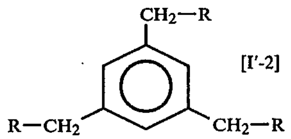 [I'-2] | 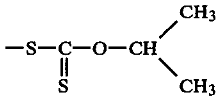 | 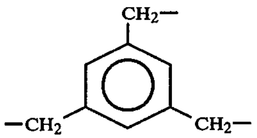 |
| P-203 | P-203 | 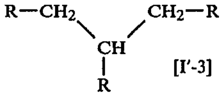 [I'-3] | 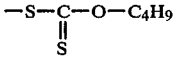 | 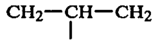 |
| P-204 | P-204 | 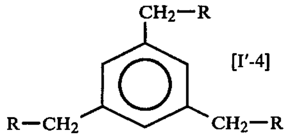 [I'-4] | 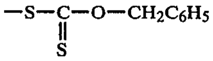 | 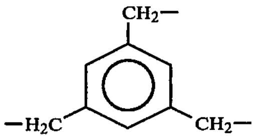 |
| P-205 | P-205 | 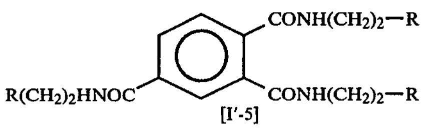 [I'-5] | 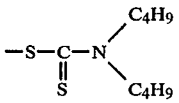 | 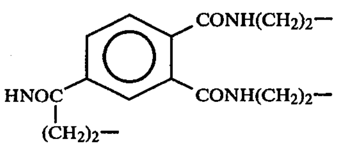 |

TABLE 202-continued
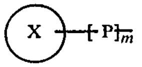
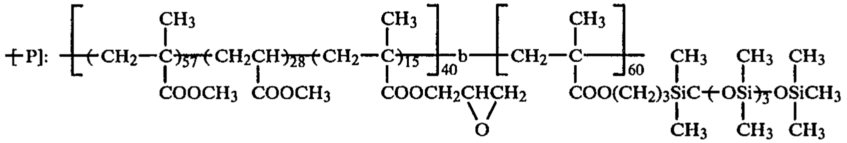
| Example | [P] | Initiator | —R | 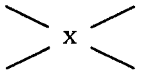 |
|---|---|---|---|---|
| P-206 | P-206 | 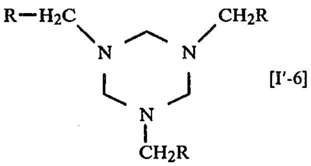 [I'-6] | 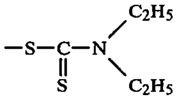 | 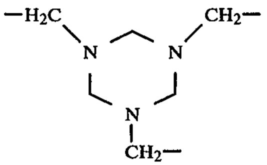 |
| P-207 | P-207 | 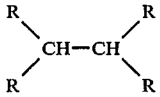 [I'-7] | 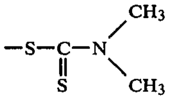 | 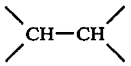 |
| P-208 | P-208 | 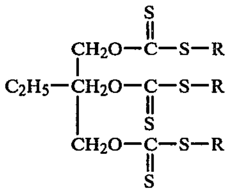 [I'-8] | $-CH_2C_6H_5$ | 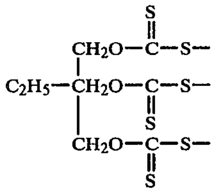 |
| P-209 | P-209 | 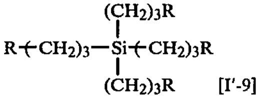 [I'-9] | 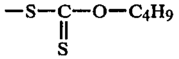 | 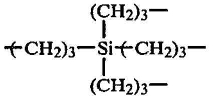 |

TABLE 202-continued
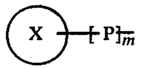
[P]: 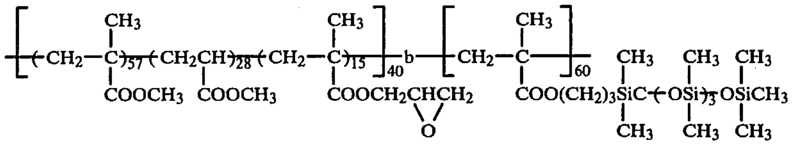
| Example | [P] | Initiator [I] | —R | 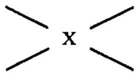 |
|---|---|---|---|---|
| P-210 | P-210 | 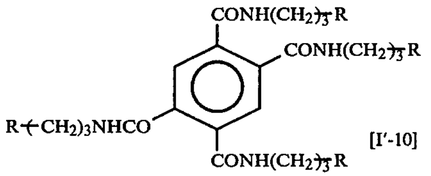 [I'-10] | 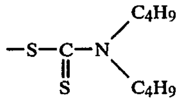 | 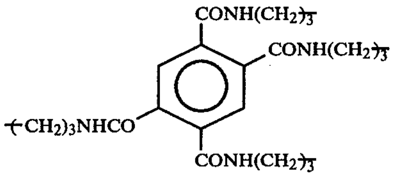 |
| P-211 | P-211 | 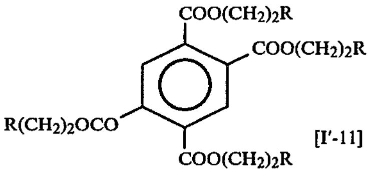 [I'-11] | 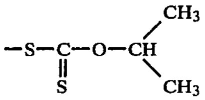 | 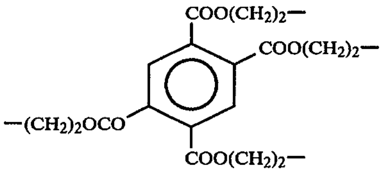 |
| P-212 | P-212 | 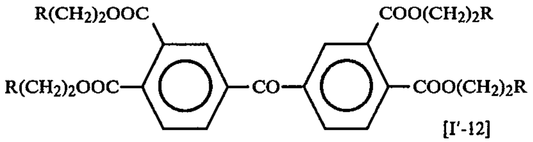 [I'-12] | 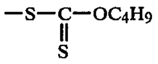 | 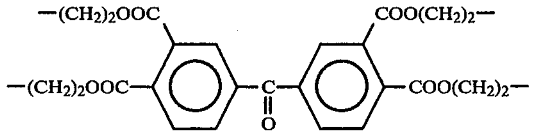 |
| P-213 | P-213 | 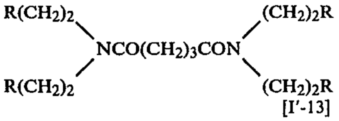 [I'-13] | 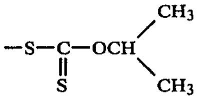 | 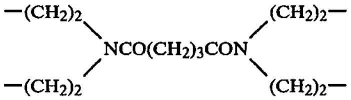 |

TABLE 202-continued
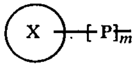
[P]: 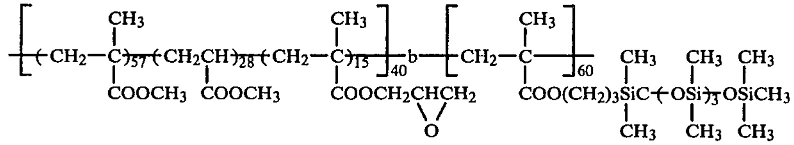
| | | | | |
|---|---|---|---|---|
| P-214 | P-214 | 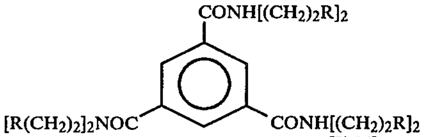 [I'-14] | 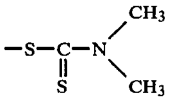 | 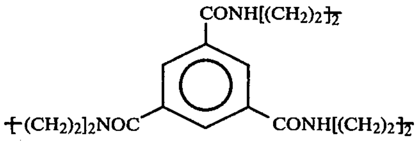 |

Examples (P-215)-(P-233)
The procedures of Example P-201 were repeated except that 60 g of monomeres corresponding to units listed in Table 203 for 60 g of the monomer (M'-2). Mw of each of resultant polymers (Polymers (P-215)-(P-233)) was in the range of $6\times10^4\sim7\times10^4$.
TABLE 203
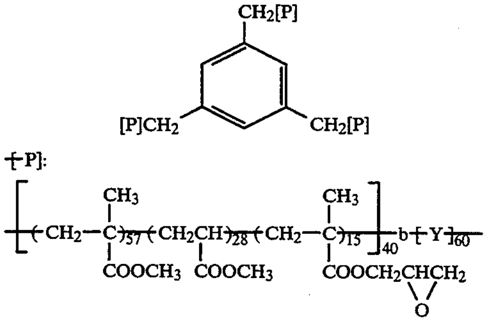
| Example | [P] | —Y— |
|---|---|---|
| P-215 | P-215 | 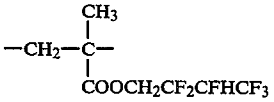 |
| P-216 | P-216 | 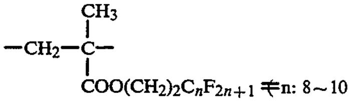 |
| P-217 | P-217 | 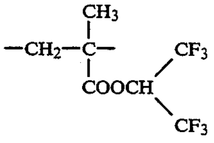 |
| P-218 | P-218 | 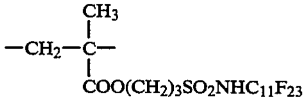 |
| P-219 | P-219 | 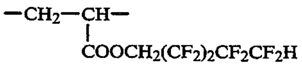 |
| P-220 | P-220 | 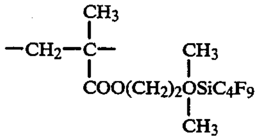 |
| P-221 | P-221 | 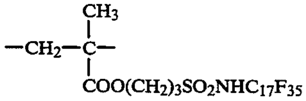 |
| P-222 | P-222 | 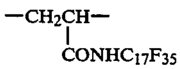 |
| P-223 | P-223 | 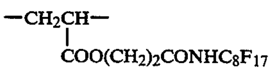 |
TABLE 203-continued
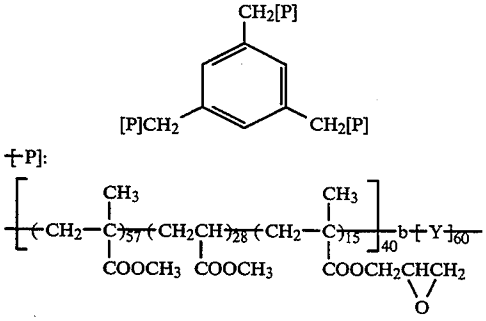
| Example | [P] | —Y— |
|---|---|---|
| P-224 | P-224 | 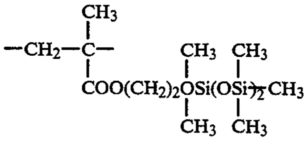 |
| P-225 | P-225 | 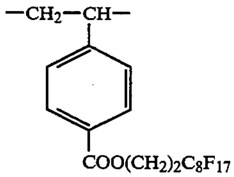 |
| P-226 | P-226 | 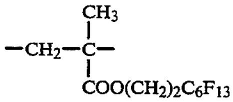 |
| P-227 | P-227 | 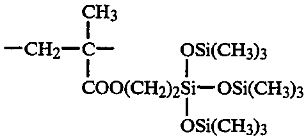 |
| P-228 | P-228 | 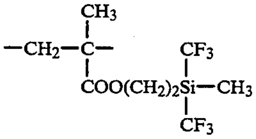 |
| P-229 | P-229 | 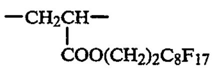 |
| P-230 | P-230 | 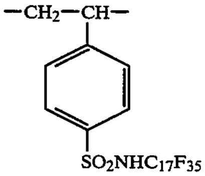 |
| P-231 | P-231 | 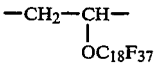 |
| P-232 | P-232 | 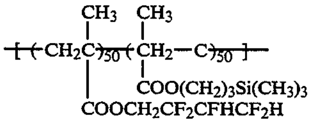 ratio by weight |

TABLE 203-continued

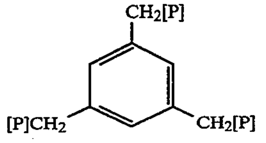

-[P]: 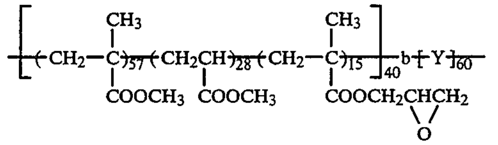

| Example | [P] | —Y— |
|---|---|---|
| P-233 | P-233 | 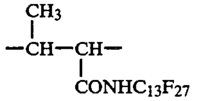 |

Examples P-234–P-240

The procedures of Example P-201 were repeated except for using a mixture of 70 g of methacrylate monomer, 30 g of monomers corresponding to-units listed Table 204, 15 g of the initiator (I'-7), and 100 g of tetrahydrofuran. 80 g of polymers having Mw of $6\times10^4\sim7\times10^4$ were obtained.

Further, polymerization was conducted using a mixture of 50 g of the resultant polymer, 50 g of the monomer (M'-2), and 100 g of tetrahydrofuran in the same manner as a method of Example P-201 except for substituting diethylether for methanol., Mw of each of resultant polymers (Polymers (P-234)-(P-240)) was in the range of $8\times10^4$ to $10\times10^4$.

TABLE 204

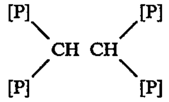

-[P]: 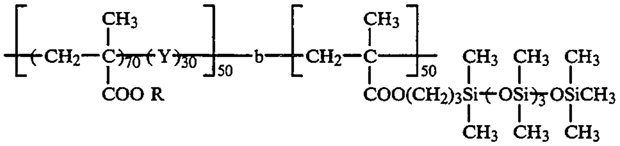

TABLE 203

| Example | [P] | —R | —Y— |
|---|---|---|---|
| P-234 | P-234 | $-C_2H_5$ | 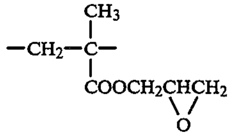 |
| P-235 | P-235 | $-CH_3$ | 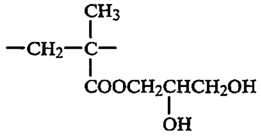 |
| P-236 | P-236 | $-CH_2C_6H_5$ | 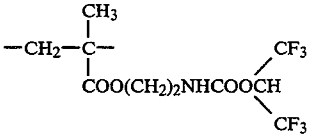 |
| P-237 | P-237 | 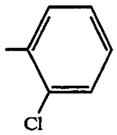 | 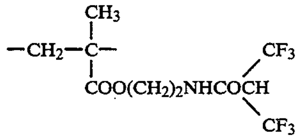 |
| P-238 | P-238 | $-C_4H_9$ |  |
| P-239 | P-239 | $-CH_3$ | 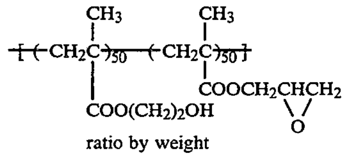 ratio by weight |

TABLE 203-continued

| Example | [P] | —R | —Y— |
|---|---|---|---|
| P-240 | P-240 | $—C_2H_5$ | 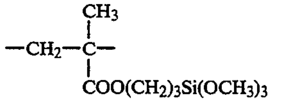 |

Examples P-241–P-254

The procedures of Example P-201 were repeated to prepare polymers listed in Table 205 except for using 10 g of the initiator (I'-2) for 17.5 g of the initiator (I'-1), and diethylether for methanol as a solvent for reprecipitation. Polymers (P-241)-(P-254) having Mw in the range of of $7\times10^4\sim9\times10^4$ were obtained.

TABLE 205

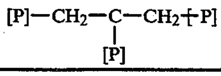

Polymer (P-241)

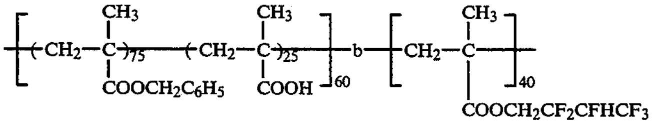

Polymer (P-242)

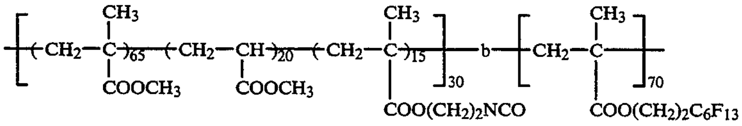

Polymer (P-243)

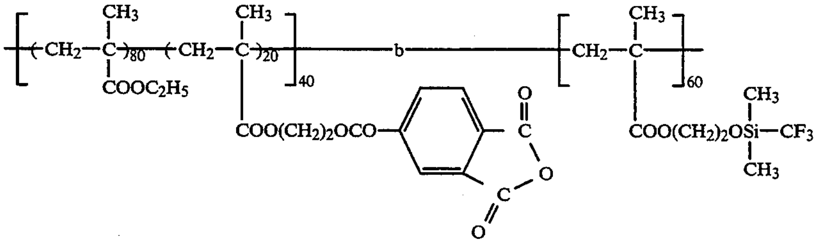

Polymer (P-244)

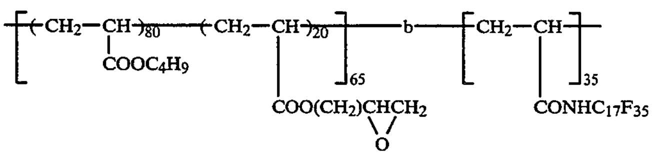

Polymer (P-245)

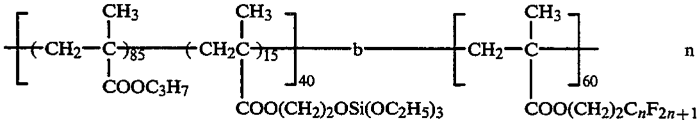

n = an integer of 8 to 10

Polymer (P-246)

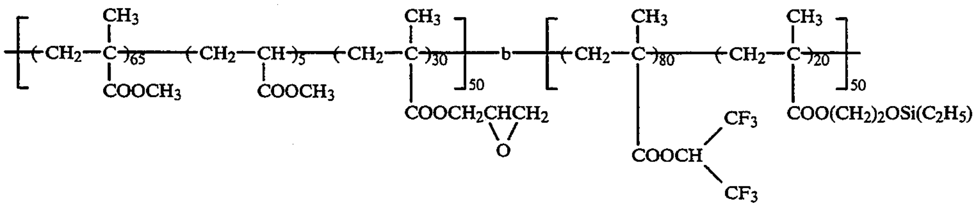

Polymer (P-247)

TABLE 205-continued
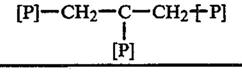
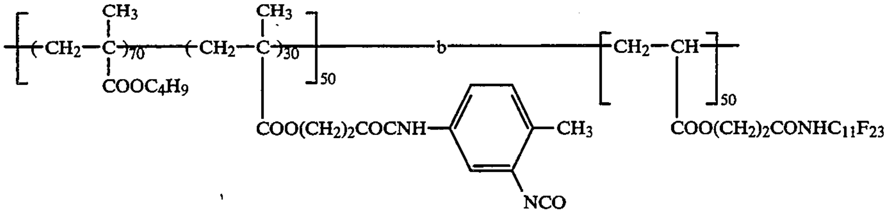
Polymer (P-248)
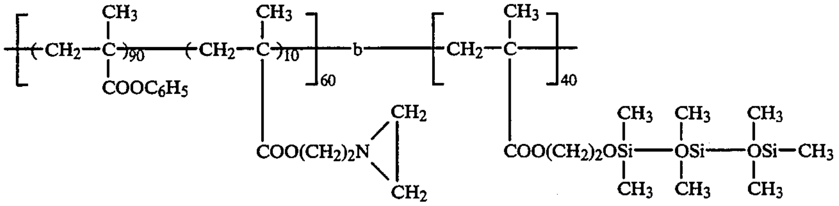
Polymer (P-249)
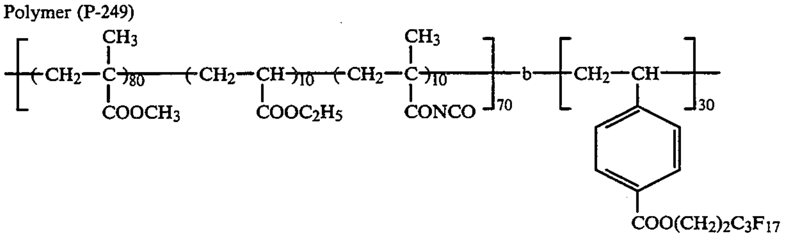
Polymer (P-250)
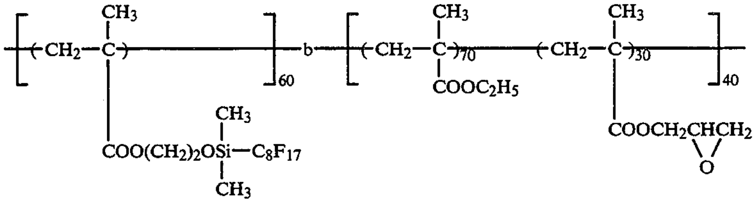
Polymer (P-251)
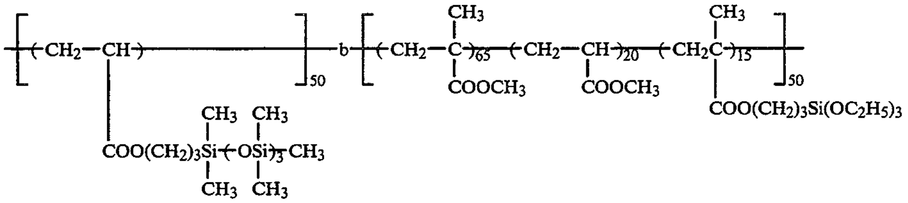
Polymer (P-252)
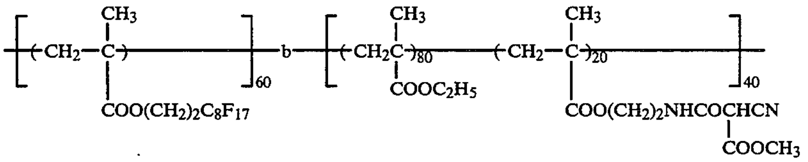
Polymer (P-253)
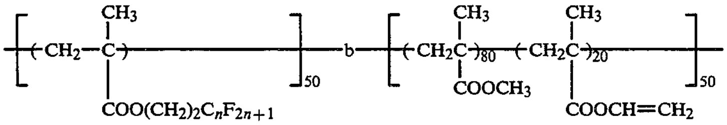
(n: an integer of 8 to 10)
Polymer (P-254)

TABLE 205-continued

| 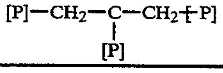 |
|---|
| 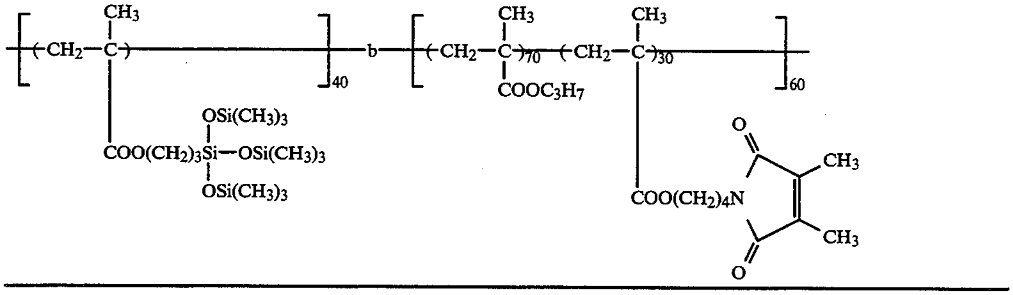 |

Example P-301

A mixture of 60 g of methyl methacrylate, 30 g of a macromonomer of the following formula, 10 g of diglycidyl methacrylate, and 150 g of toluene was heated to 70° C. in a stream of nitrogen. 1.0 g of 2,2'-azobisisobutylonytrile (A.I.B.N) was added and reacted for 4 hours. Further, 0.5 g of A.I.B.N was added and reacted for 4 hours. Polymer having Mw of $6.5\times10^4$ (P-301) was obtained.

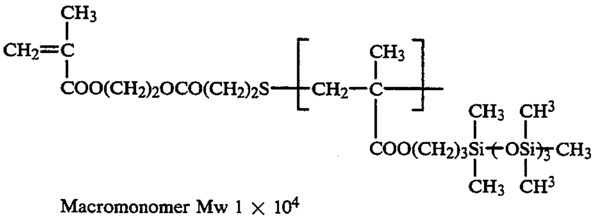

Macromonomer Mw $1 \times 10^4$

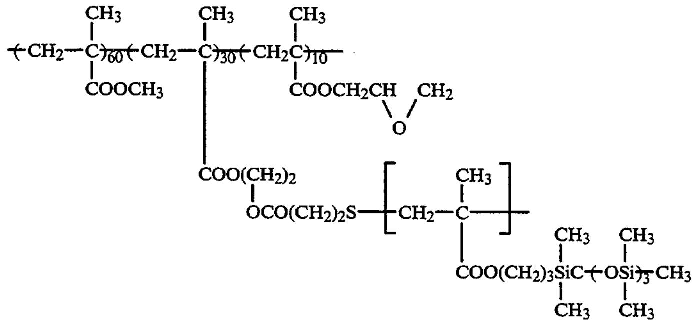

(P-301)

Examples P-302–P-314

The procedures of Example P-301 were repeated except that 30 g of macromonomers listed in Table 302 for 30 g of the macromonomer M-301. Polymers (P-302)-(P-314) having Mw in the range of $5\times10^4\sim8\times10^4$ were obtained, Mw of used macromonomers are listed in Table 302,

TABLE 302

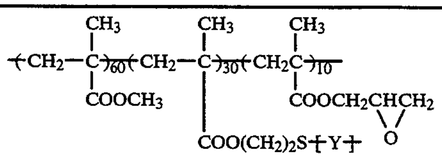

| Example | [P] | —Y— | Mw of Macromonomer |
|---|---|---|---|
| P-302 | P-302 | 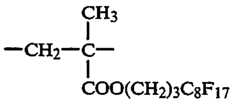 | $6.5 \times 10^3$ |
| P-303 | P-303 | 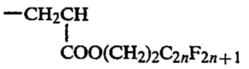 n = an integer of 8 to 10 | $8 \times 10^3$ |

TABLE 302-continued

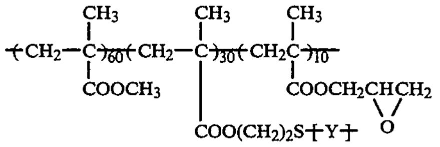

| Example | [P] | —Y— | Mw of Macromonomer |
|---|---|---|---|
| P-304 | P-304 | 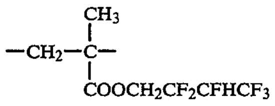 | $6 \times 10^3$ |
| P-305 | P-305 | 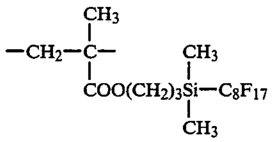 | $8 \times 10^3$ |
| P-306 | P-306 | 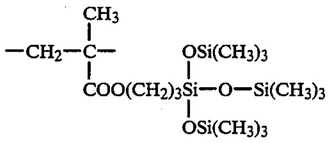 | $5 \times 10^3$ |
| P-307 | P-307 | 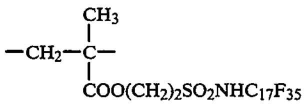 | $8 \times 10^3$ |
| P-308 | P-308 | 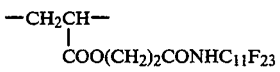 | $7 \times 10^3$ |
| P-309 | P-309 | 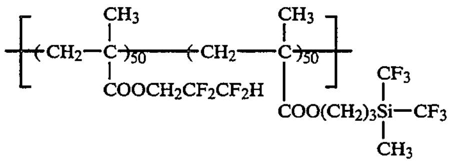 | $6 \times 10^3$ |
| P-310 | P-310 | 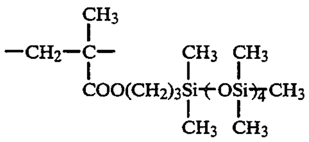 | $9 \times 10^3$ |
| P-311 | P-311 | 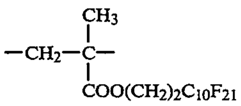 | $1.5 \times 10^4$ |
| P-312 | P-312 | 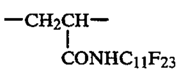 | $1.2 \times 10^4$ |
| P-313 | P-313 | 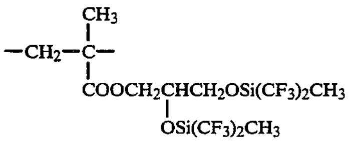 | $1.5 \times 10^4$ |
| P-314 | P-314 | 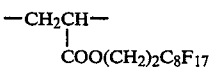 | $1.0 \times 10^4$ |

Examples P-315–P-325

A mixture of monomers corresponding to units listed in Table 303, 25 g of Macromonomer-FM-0721 (Mw $1\times10^4$, manufactured by CHISSO CORPORATION), and 200 g of toluene was heated to 80° C. in a stream of nitrogen.

TABLE 303
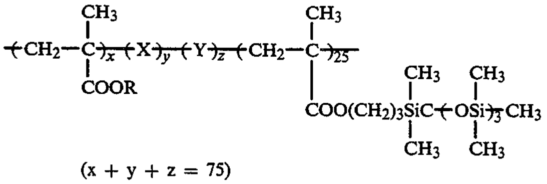
(x + y + z = 75)
| Example | [P] | —R | —X— | —Y— | x/y/z ratio by weight |
|---|---|---|---|---|---|
| P-315 | P-315 | $-CH_2C_6H_5$ | — | 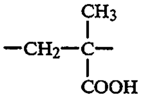 | 55/0/20 |
| P-316 | P-316 | $-CH_3$ | — | 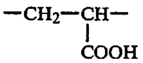 | 60/0/15 |
| P-317 | P-317 | $-CH_3$ | 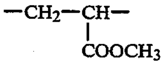 | 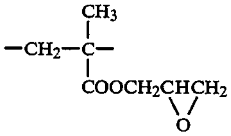 | 50/15/10 |
| P-318 | P-318 | $-CH_2C_6H_5$ | 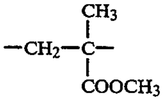 | 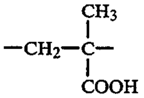 | 55/10/10 |
| P-319 | P-319 | $-CH_3$ | 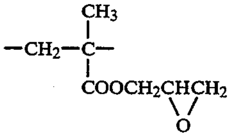 | 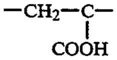 | 65/5/5 |
| P-320 | P-320 | $-C_2H_5$ | — | 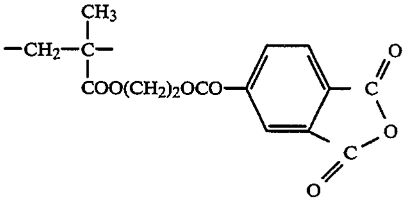 | 65/0/10 |
| P-321 | P-321 | $-C_4H_9$ | 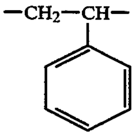 | 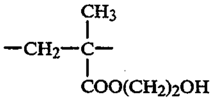 | 50/10/15 |
| P-322 | P-322 | $-C_2H_5$ | — | 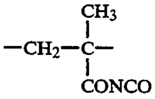 | 67/0/8 |
| P-323 | P-323 | $-C_6H_5$ | — | 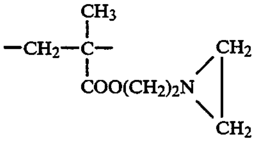 | 65/0/10 |
| P-324 | P-324 | $-CH_3$ | 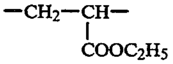 | 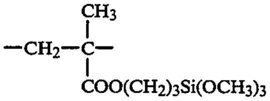 | 54/14/15 |

TABLE 303-continued

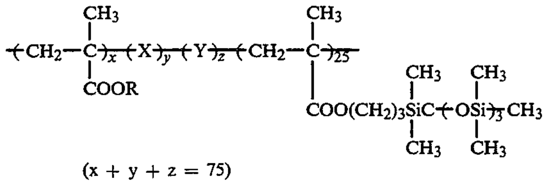

(x + y + z = 75)

| Example | [P] | —R | —X— | —Y— | x/y/z ratio by weight |
|---|---|---|---|---|---|
| P-325 | P-325 | $-C_2H_5$ | — | 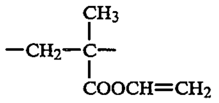 | 55/0/20 |

Examples P-326–P-337

The procedures of Example P-301 were repeated except for using a mixture of a monomer of the following formula (M-302), macromonomers listed in Table 304 and 200 g of toluene. Polymers (P-326)-(P-337) having in the range of Mw of $6\times10^4\sim8\times10^4$ were obtained.

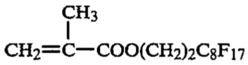

(M-302)

TABLE 304

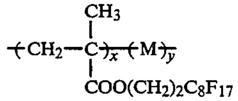

| Example | [P] | x/y ratio by weight | —M— | Mw of Macro-monomer |
|---|---|---|---|---|
| P-326 | P-326 | 60/40 | 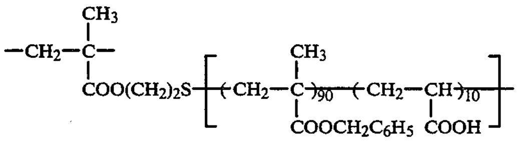 | $9\times10^3$ |
| P-327 | P-327 | 80/20 | 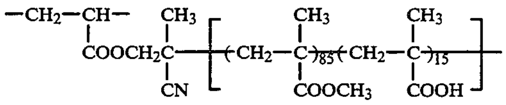 | $1.4\times10^4$ |
| P-328 | P-328 | 80/20 | 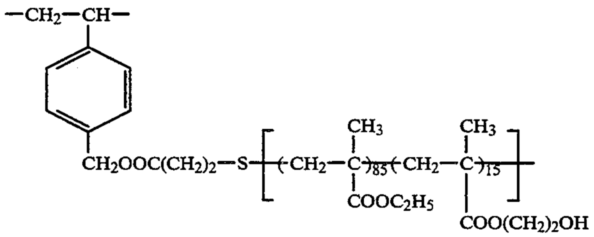 | $8\times10^3$ |
| P-329 | P-329 | 75/25 | 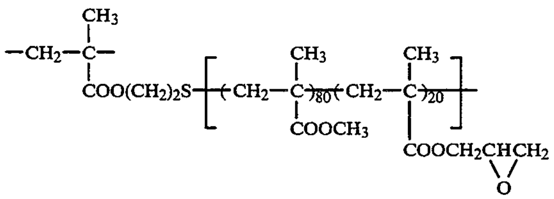 | $9\times10^4$ |

TABLE 304-continued
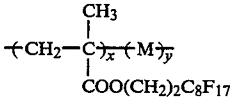
| Example | [P] | x/y ratio by weight | —M— | Mw of Macro-monomer |
|---|---|---|---|---|
| P-330 | P-330 | 80/20 | 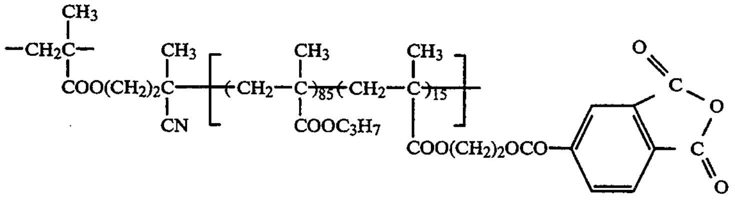 | $1.1 \times 10^4$ |
| P-331 | P-331 | 90/10 | 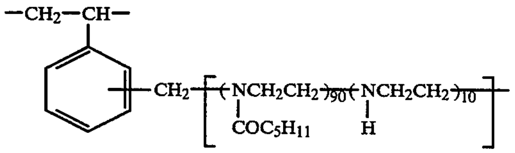 | $3 \times 10^3$ |
| P-332 | P-332 | 60/40 | 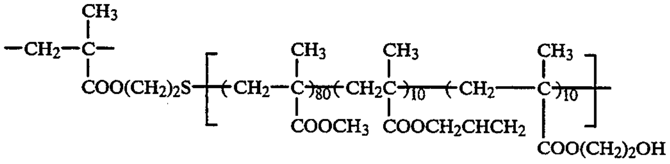 | $1 \times 10^4$ |
| P-333 | P-333 | 50/50 | 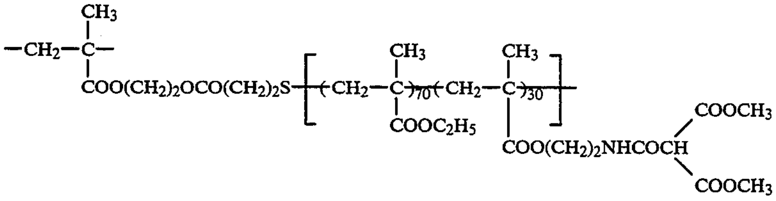 | $7 \times 10^3$ |
| P-334 | P-334 | 80/20 | 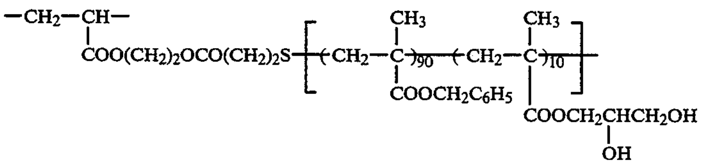 | $8 \times 10^3$ |
| P-335 | P-335 | 75/25 | 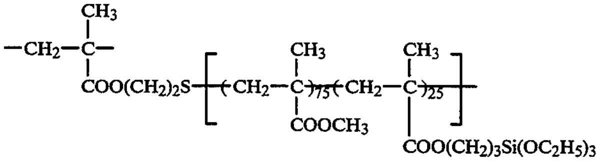 | $8 \times 10^3$ |
| P-336 | P-336 | 80/20 | 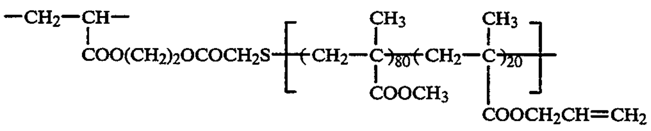 | $6 \times 10^3$ |
| P-337 | P-337 | 75/25 | 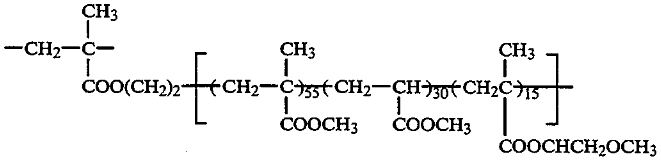 | $8 \times 10^3$ |

Example P-401

A mixture of 50 g of a monomer of the following formula, 0.5 g of an initiator of the following formula and 50 g of tetrahydrofuran was fed to a vessel and sealed in a stream of nitrogen, and heated to 60° C., and then, irradiated with light from 400W-high pressure mercury vapor lamp through a glass filter from the distance of 10 cm for 10 hours to conduct photopolymerization. A mixture of 25 g of methylmethacrylate, 15 g of glycidyl methacrylate and 10 g of macromonomer (MB-401), and 50 g of tetrahydrofuran was added thereto. Then, the vessel was purged with nitrogen, and the radiation was conducted for 16 hours. The resultant reaction mixture was added to 1.0 l of methanol to precipitate polymer, and the precipitate was collected and dried. 68 g of Polymer (P-401) having Mw of $6\times10^4$ was obtained.

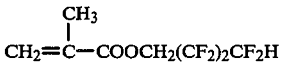
(A-402)

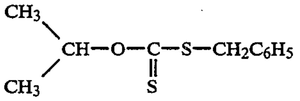
(I-402)

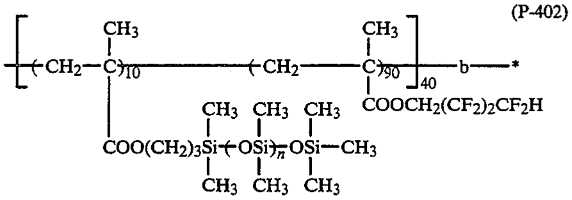
(P-402)

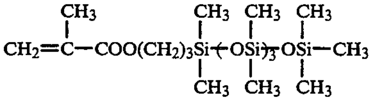
(A-401)

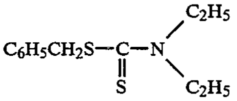
(I-401)

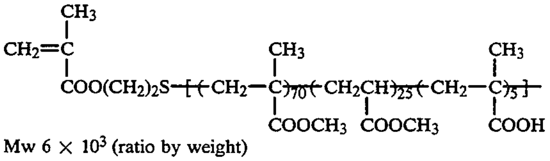
(MB-401)

Mw 6 × $10^3$ (ratio by weight)

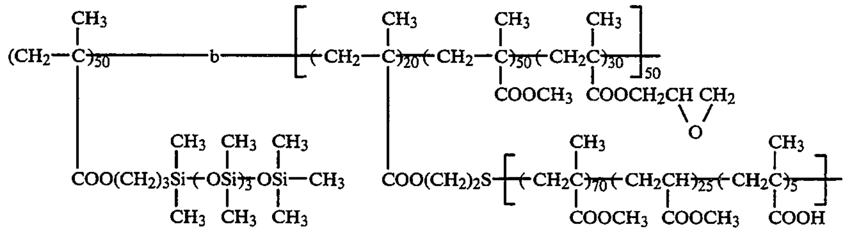
(P-401)

—b—: a block type linkage

Example P-402

A mixture of 36 g of the monomer (A-402), 4 g of a siloxane macromonomer praqcell FM-725 (manufactured by CHISSO CORPORATION, Mw $1\times10^4$), 1.0 g of an initiator (I-402) of the following formula and 50 g of tetrahydrofuran are charged to a vessel and sealed in a flow of nitrogen, and heated 50° C. Then, the mixture was irradiated for 12 hours in the same manner as Example 401 to conduct photopolymerization. A mixture of 24 g of methyl methacrylate, 18 g of methyl acrylate, and 18 g of glycidyl methacrylate and 60 g of tetrahydrofuran was added to the mixture. And then, the vessel was purged with nitrogen, and was irradiated, for 12 hours in the same manner as Example P-401.

The resultant reaction mixture was added to 1 l of methanol to precipitate polymer. The precipitate was collected and dried. 70 g of polymer (Polymer (P-402)) with Mw of $8\times10^4$ was obtained.

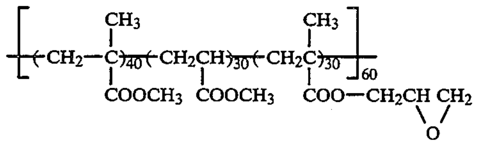

Example P-403

A mixture of 25 g of methyl methacrylate, 15 g of glycidyl methacrylate, 10 g of a macromonomer (MB-402) of the following formula, 2.5 g of an initiator (I-403) of the following formula, and 50 g of tetrahydrofuran was degassed in a stream of nitrogen, and irradiated for 12 hours in the same manner as Example P-401.

The resultant reaction mixture was added to 1 l of methanol to precipitate. The precipitate was collected and dried. 72 g of polymer (Polymer (P-403)) having Mw of $5.3\times10^4$ was obtained.

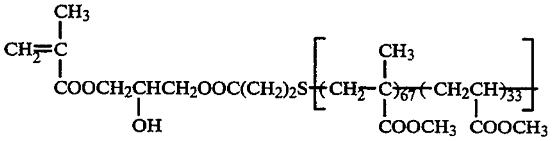

(MB-402)

$\overline{M}w\ 8 \times 10^3$

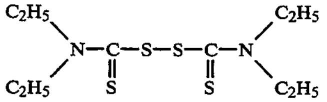

(I-403)

(A-403)

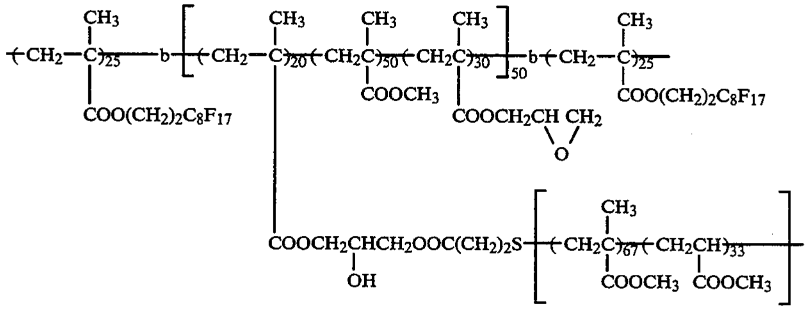

(P-403)

Examples P-404–P-416

The procedures of Example P-402 were repeated except for substituting macromonomers corresponding to the macromonomer segment ($M_A$) listed in Table 402 for the macromonomer (M-401), Polymers (P-404)-(P-416) having Mw in the range of $5\times10^4\sim8\times10^4$ were obtained. Mw of macromonomers which were used are also listed in Table 402.

TABLE 402

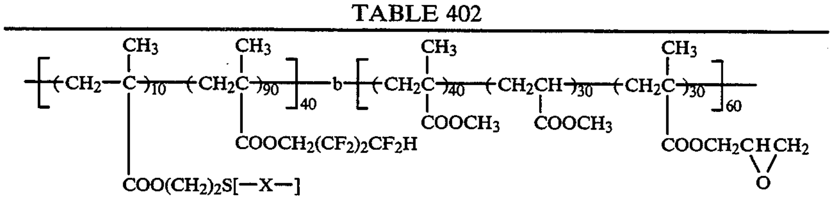

| Example | Polymer | Macromonomer segment ($M_A$) | Mw of Macromonomer |
|---|---|---|---|
| 404 | P-404 | $M_A$-4 *) | $6.5 \times 10^3$ |
| 405 | P-405 | $M_A$-5 *) | $8 \times 10^3$ |
| 406 | P-406 | $M_A$-6 *) | $6 \times 10^3$ |
| 407 | P-407 | $M_A$-7 *) | $8 \times 10^3$ |
| 408 | P-408 | $M_A$-8 *) | $5 \times 10^3$ |
| 409 | P-409 | $M_A$-9 *) | $8 \times 10^3$ |
| 410 | P-410 | $M_A$-10 *) | $7 \times 10^3$ |
| 411 | P-411 | $M_A$-11 *) | $6 \times 10^3$ |
| 412 | P-412 | $M_A$-12 *) | $9 \times 10^3$ |
| 413 | P-413 | $M_A$-13 *) | $1.5 \times 10^3$ |
| 414 | P-414 | $M_A$-14 *) | $1.2 \times 10^3$ |
| 415 | P-415 | $M_A$-15 *) | $1.5 \times 10^3$ |
| 416 | P-416 | $M_A$-16 *) | $1.0 \times 10^3$ |

*) Units of —X— (the macromonomer segment ($M_A$)) are as follows:

($M_A$-4)

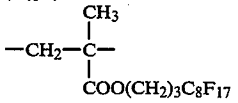

($M_A$-5)

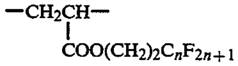

(n = an integer of 8 to 10)

($M_A$-6)

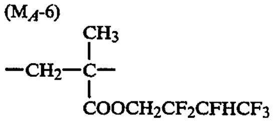

TABLE 402-continued ($M_A$-7)

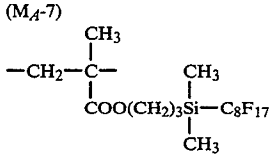

($M_A$-8)

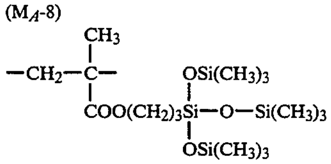

($M_A$-9)

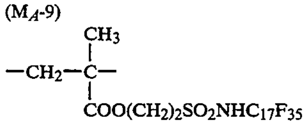

($M_A$-10)

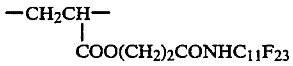

($M_A$-11)

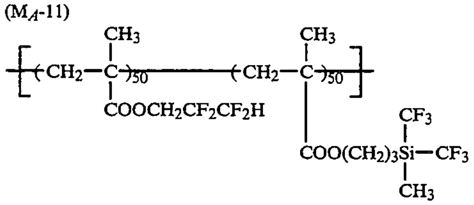

($M_A$-12)

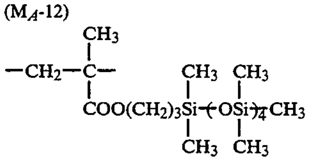

($M_A$-13)

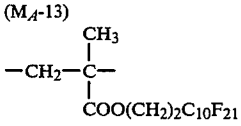

($M_A$-14)

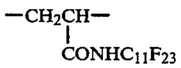

($M_A$-15)

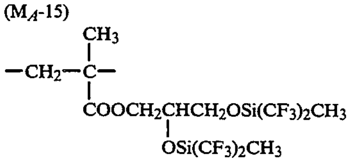

($M_A$-16)

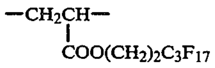

Examples P-417–P-429

Polymers listed in Table 403 were prepared by a similar method to one of Example P-401. Polymers (P-417)-(P-427) having Mw of $4\times10^4$~$8\times10^4$ were obtained. Mw of each of one-functional macromonomers corresponding to units ($M_B$-17) to ($M_B$-29) which were used for the preparation was in the range of $6\times10^3$~$9\times10^4$.

TABLE 403
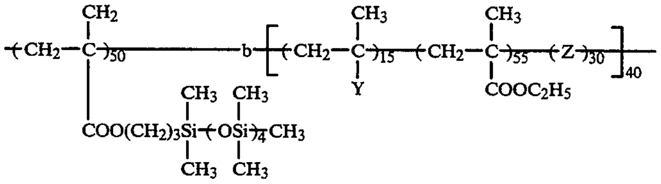
| Example | [P] | —Y ratio by weight | —Z— |
|---|---|---|---|
| P-417 | P-417 | $M_B$-17 | 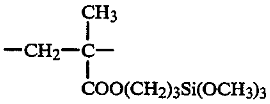 |
| P-418 | P-418 | $M_B$-18 | 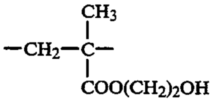 |
| P-419 | P-419 | $M_B$-19 | 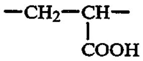 |
| P-420 | P-420 | $M_B$-20 | 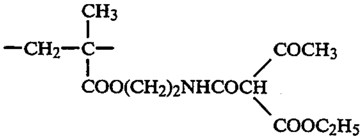 |
| P-421 | P-421 | $M_B$-21 | 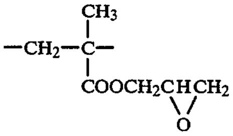 |
| P-422 | P-422 | $M_B$-22 | 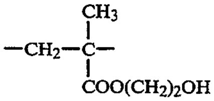 |
| P-423 | P-423 | $M_B$-23 | 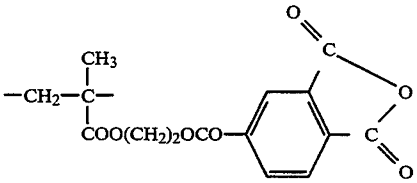 |
| P-424 | P-424 | $M_B$-24 | 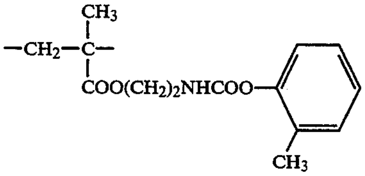 |
| P-425 | P-425 | $M_B$-25 | 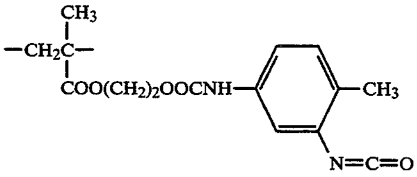 |

TABLE 403-continued
| | | | |
|---|---|---|---|
| P-426 | P-426 | $M_B$-26 | 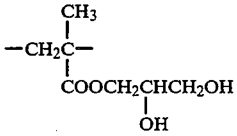 |
| P-427 | P-427 | $M_B$-27 | 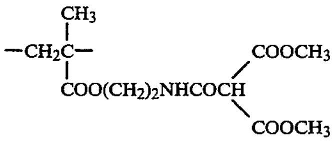 |
| P-428 | P-428 | $M_B$-28 |  |
| P-429 | P-429 | $M_B$-29 | 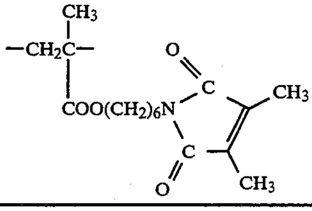 |
*) ($M_B$-17) to ($M_B$-29) are as follows:
($M_B$-17)
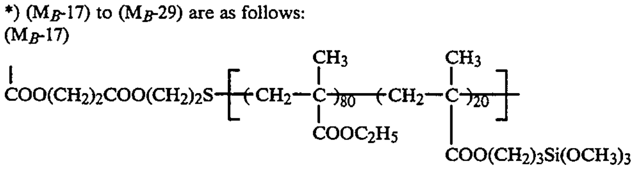
($M_B$-18)
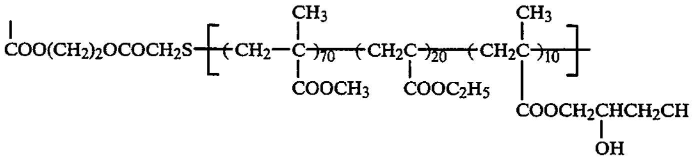
($M_B$-19)
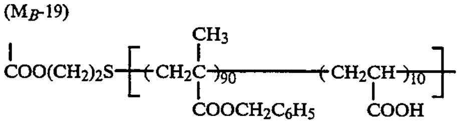
($M_B$-20)
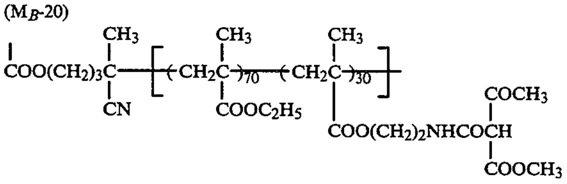
($M_B$-21)
($M_B$-22)
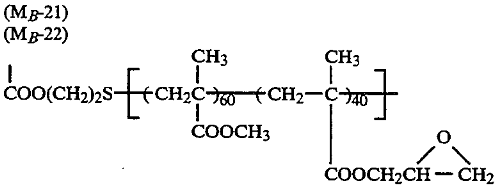
($M_B$-23)
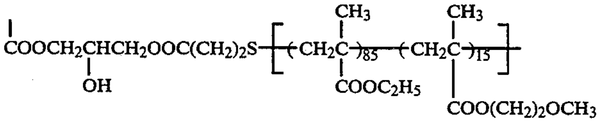
($M_B$-24)

TABLE 403-continued

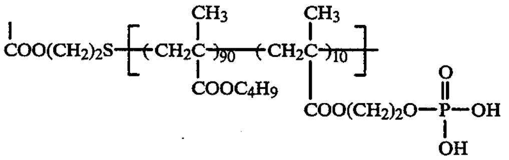

($M_B$-25)

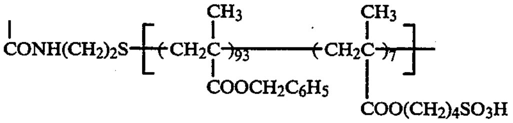

($M_B$-26)

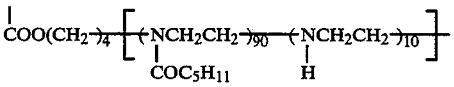

($M_B$-27)

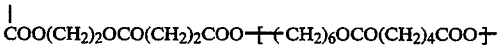

($M_B$-28)

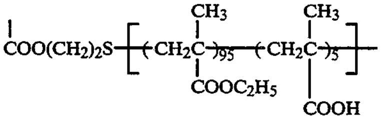

($M_B$-29)

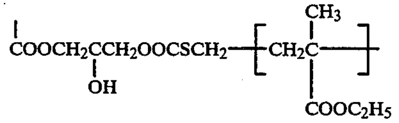

(Preparation Examples of The Polymer (Q))

Example Q-1

A solution of 95 g of 2-chlorophenyl methacrylate, 5 g of methacrylic acid and 200 g of toluene was heated to 90° C. in a stream of nitrogen. 7.0 g of 2,2'-azobisisobutylonytrile (A.I.B.N) was added thereto, and reacted for 4 hours. Then, 2 g of A.I.B.N. was further added thereto, and reacted for 2 hours. Weight-average molecular weight (Mw) of the resultant polymer (Polymer (Q-1)) was $7.7\times10^3$.

Polymer (Q-1)

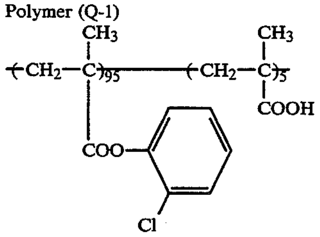

Example Q-2

A solution of 96 g of 2,6-dichlorophenyl methacrylate, 5 g of acrylic acid, 2 g of n-dodecylmercaptan and 200 g of toluene was heated to 75° C. in a stream of nitrogen. 1 g of azobisisobutylonytrile (A.I.B.N) was added thereto, and reacted for 4 hours. Then, 0.5 g of A.I.B.N. was further added thereto, and reacted for 3 hours. After cooling, the reaction mixture was re-precipitated in 2 l of a mixture (methanol/water:9/1), and the precipitate was collected by decantation and dried under reduced pressure. 78 g of wax-like Polymer (Q-2) was obtained (Mw: $6.0\times10^3$).

Polymer (Q-2)

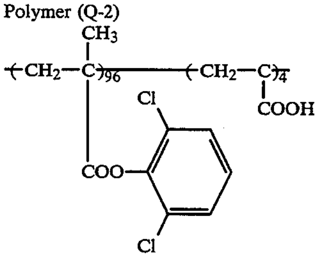

Examples Q-3–Q-16

Polymers (Q-3)-(Q-16) listed in Table 2 were prepared in a similar manner to the method of Example Q-1.

TABLE 2
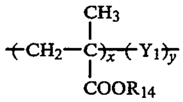 Mw: $5.0 \times 10^3$ to $9.0 \times 10^3$
| Example | $R_{14}$ | $-Y_1-$ | x/y ratio by weight |
| --- | --- | --- | --- |
| [Q-3] | $-CH_2C_6H_5$ | 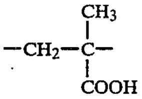 | 94/6 |
| [Q-4] | 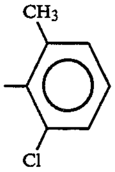 | 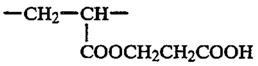 | 95/5 |
| [Q-5] | $-CH_2C_6H_5$ | 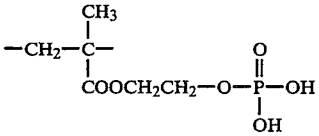 | 97/3 |
| [Q-6] | 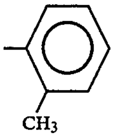 | 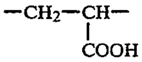 | 95/5 |
| [Q-7] | 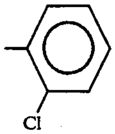 | 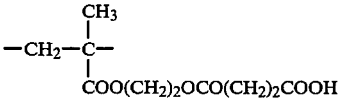 | 94/6 |
| [Q-8] | 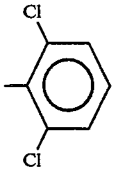 | 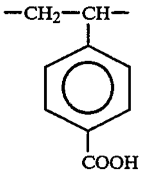 | 95/5 |
| [Q-9] | 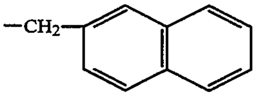 | 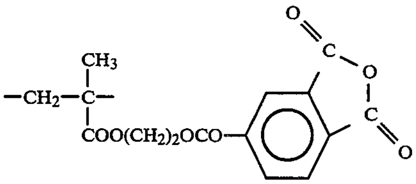 | 93/7 |
| [Q-10] | 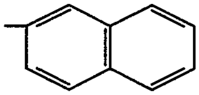 | 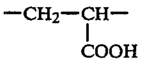 | 95/5 |
| [Q-11] | 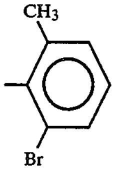 | 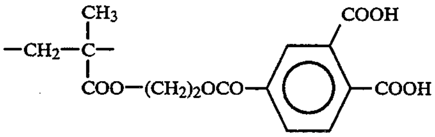 | 96/4 |

TABLE 2-continued

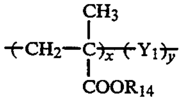

Mw: $5.0 \times 10^3$ to $9.0 \times 10^3$

| Example | $R_{14}$ | $-Y_1-$ | x/y ratio by weight |
|---|---|---|---|
| [Q-12] | 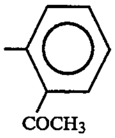 | 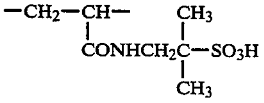 | 98/2 |
| [Q-13] | 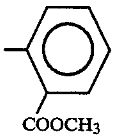 | 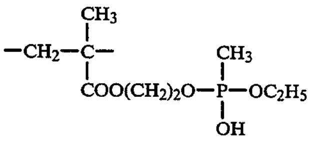 | 97/3 |
| [Q-14] | 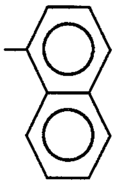 | 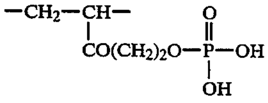 | 97/3 |
| [Q-15] | 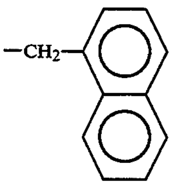 | 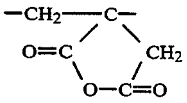 | 95/5 |
| [Q-16] | 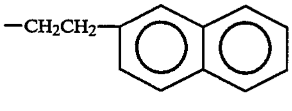 | 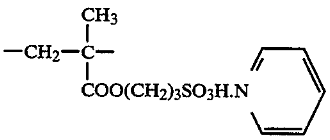 | 98/2 |

Example Q-17

A solution of 100 g of benzyl methacrylate, 4 g of thiosalicylic acid, 160 g of toluene and 40 g of ethanol was heated to 75° C. in a stream of nitrogen, and then 1.0 g of 2,2'-azobisisobutylonytrile (A.I.B.N) was added thereto, and reacted for 4 hours. Then, 0.4 g of A.I.B.N. was added thereto, and reacted for 2 hours. Then, 0.2 g of A.I.B.N. was further added thereto, and reacted for 3 hours. Weight-average molecular weight (Mw) of the resultant polymer (Polymer (Q-17)) was $6.8 \times 10^3$.

Polymer (Q-17)

-continued

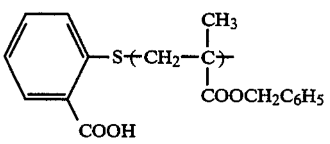

Example Q-18–Q-27

The procedures of Example Q-17 were repeated except that methacrylates and mercapto compounds listed in Table 3 were substituted for 100 g of benzyl methacrylate and 4 g of thiosalicylic acid. Mw of each of resultant polymers (Polymers (Q-18)–(Q-27)) was in the range of $5 \times 10^3$ to $8 \times 10^3$.

TABLE 3
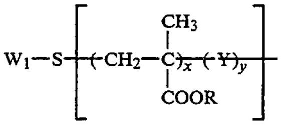
| Example | $W_1$-weight | —R | —Y— | x/y ratio by weight |
|---|---|---|---|---|
| Q-18 | $HOOC(CH_2)_2-$ 4 g | $-C_6H_5$ | 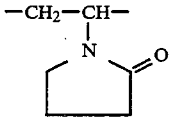 | 97.5/2.5 |
| Q-19 | $HOOC-CH_2-$ 5 g | 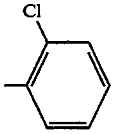 | 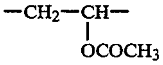 | 90/10 |
| Q-20 | 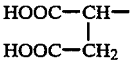 5 g | 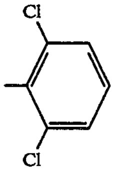 | 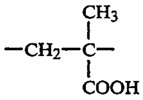 | 97.5/2.5 |
| Q-21 | 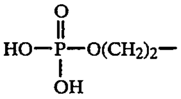 3 g | 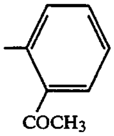 | 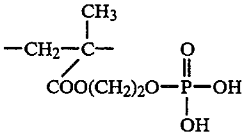 | 98.5/1.5 |
| Q-22 | 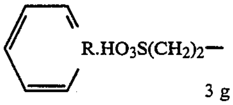 3 g | $-H_2C_6H_5$ | 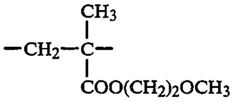 | 96/4 |
| Q-23 | 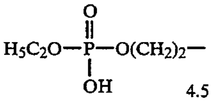 4.5 g | 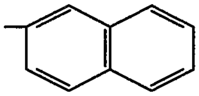 | 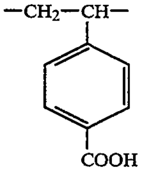 | 97/3 |
| Q-24 | 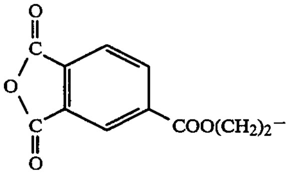 | $-CH_3$ | 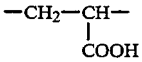 | 97.5/2.5 |
| Q-25 | 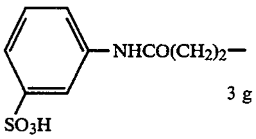 3 g | 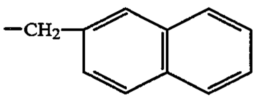 | 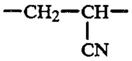 | 95/5 |
| Q-26 | 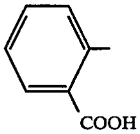 3 g | $-CH_2C_6H_5$ | 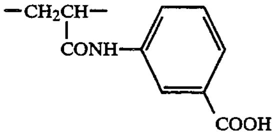 | 97/3 |

TABLE 3-continued

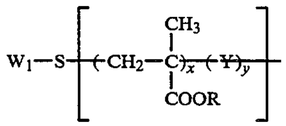

| Example | $W_1$-weight | —R | —Y— | x/y ratio by weight |
|---|---|---|---|---|
| Q-27 | $HOOC(CH_2)_3$— 4 g | 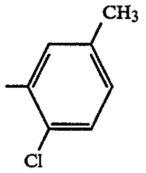 | 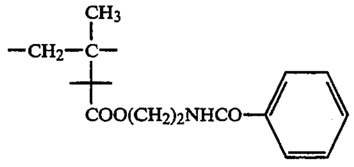 | 90/10 |

Example Q-28–Q-35

A solution of monomers listed in the table 4 (the total weight was 100 g), 3 g of thiosalicylic acid, 160 g of toluene and 40 g of methanol was allowed to rise to 60° C. with stirring in a stream of nitrogen. 2 g of azobisisovaleronytrile (A.I.V.N) was added thereto, and reacted for 4 hours. Then, 0.8 g of A.I.V.N. was further added thereto, and reacted for 4 hours. Weight-average molecular weight (Mw) of each of the resultant polymers (Polymer (Q-28) to (Q-35)) was in the range of $5\times10^3$ to $8\times10^3$.

TABLE 4

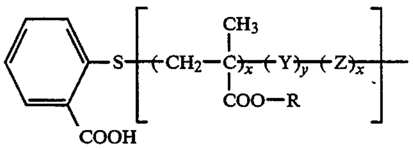

| Example | —R | —Y— | —Z— | (x/y/z) ratio by weight |
|---|---|---|---|---|
| Q-28 | $-CH_2C_6H_5$ | 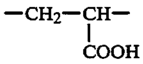 | 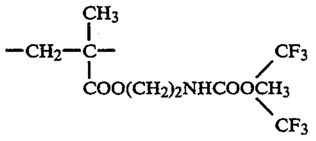 | 92/3/5 |
| Q-29 | $-CH_3$ | 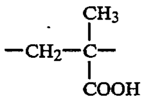 | 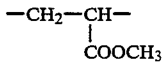 | 83/2/15 |
| Q-30 | 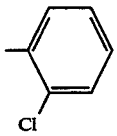 | 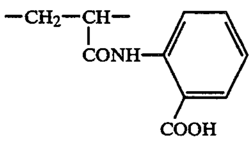 | 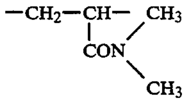 | 94/3/3 |
| Q-31 | 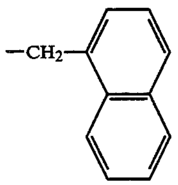 | 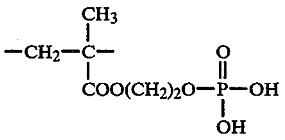 | 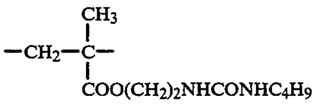 | 93.5/1.5/5 |
| Q-32 | $-CH_2C_6H_5$ | 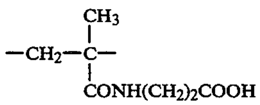 | 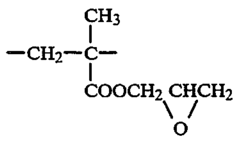 | 87/3/10 |

TABLE 4-continued

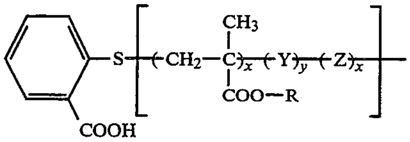

| Example | —R | —Y— | —Z— | (x/y/z) ratio by weight |
|---|---|---|---|---|
| Q-33 | $-CH_2C_6H_5$ | 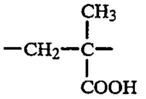 | 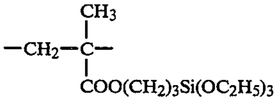 | 82/2/15 |
| Q-34 | 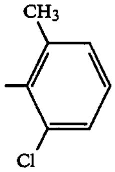 |  | 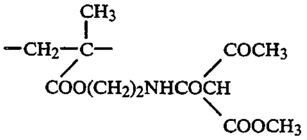 | 87.5/2.5/10 |
| Q-35 | 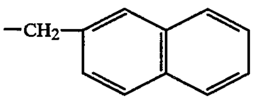 | 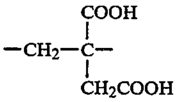 | 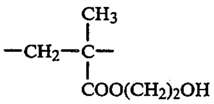 | 84/1.0/10 |

Example Q-36

A solution of 99.5 g of 1-naphthylmethacrylate, 0.5 g of methacrylic acid, 150 g of toluene and 50 g of isopropanol was heated to 80° C. in aostream of nitrogen. 5.0 g of 4,4'-azobis(4-cyano) valeric acid (A.C.V) was added thereto, and stirred for 5 hours. Then, 1 g of A.C.V. was further added thereto, and stirred for 3 hours. Weight-average molecular weight (Mw) of the resultant polymer (Polymer (Q-36)) was $7.5\times10^3$.

Polymer (Q-36)

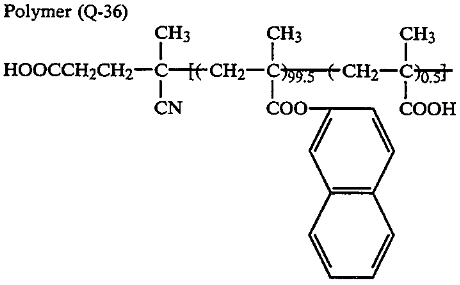

Example Q-37

A solution of 50 g of methylmethacrylate and 150 g of methylene chloride was cooled to −20° C. in a stream of nitrogen. 1.0 g of 10% solution of 1,1-diphenylhexyl lithium in hexane which was prepared just before using was added thereto, and stirred for 5 hours. Then, carbon dioxide was streamed at the flow rate of 10 ml/cc with stirring for 10 minutes. Then, cooling was stopped, and the reaction mixture was allowed to rise to a room temperature with stirring. Then, the reaction mixture was added to a solution of 50 cc of 1N hydrochloric acid in 1 l of methanol to precipitate polymer, and the resultant white powder was collected. The powder was washed with water until the used water became neutral, dried in vacuum. The yield of the resultant polymer (Polymer (Q-37)) was 18 g, Mw thereof was $6.5\times10^3$.

Polymer (Q-37)

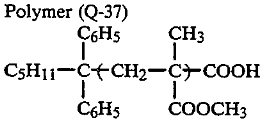

Example Q-38

A solution of 96 g of benzylmethacrylate, 4 g of thioglycolic acid and 200 g of toluene was heated to 75° C. in a stream of nitrogen. 1.0 g of A.C.V was added, and reacted for 6 hours. Then, 0.4 g of A.C.V. was further added thereto, and reacted for 3 hours. Weight-average molecular weight (Mw) of the resultant polymer (Polymer (Q38)) was $7.8\times10^3$.

Polymer (Q-38)

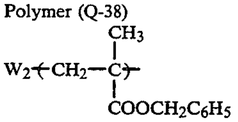

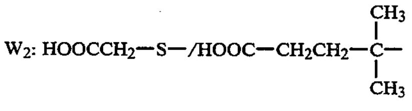 = 4/1 (ratio by weight)

Example Q-39

A solution of 100 g of benzylmethacrylate and 200 g of tetrahydrofuran was degassed in a stream of nitrogen sufficiently, and cooled to −78° C. 3.2 g of 1,1-diphenylbutyllithium was added, and reacted for 12 hours. Then, to the resultant mixture, a solution of 60 g of methylmethacrylate, 6 g of triphenyl methylmethacrylate and 5 g of tetrahydrofuran which had been degassed in a stream of nitrogen sufficiently was added, and reacted for 8 hours. After cooling the mixture to 0° C., 10 ml of methanol was added thereto, and reacted for 30 minutes. Then, the polymerization was stopped. The resultant polymer solution was allowed to rise to 30° C. with stirring. Then, 3 ml of a 30% solution of hydrochloric acid in ethanol was added thereto, and stirred for an hour. Then, the resultant mixture was evaporated to an half amount thereof under reduced pressure, and added to 1 l of petroleum ether to precipitate the resultant polymer.

The resultant precipitate was collected, and dried under reduced pressure. The yield of the resultant polymer (Polymer (Q-39)) was 72 g, Mw thereof was $9\times10^3$.

Polymer (Q-39)

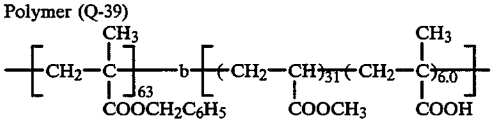

(ratio by weight)
b: block type linkage
(hereinafter it represents the same meaning)

Example Q-40

A solution of 70 g of methyl methacrylate, 30 g of methylacrylate, 3.5 g of (tetraphenylporphinate)aluminum methyl and 80 g of methylene chloride was allowed to rise to 30° C. The resultant reaction mixture was irradiated with light from 300 W-xenon lamp through a glass filter from the distance of 25 cm, and reacted for 30 hours. Then, 60 g of methylacrylate and 3.2 g of benzylmethacrylate was added thereto, and the reaction mixture was irradiated for 8 hours in the same manner as explained above. Then, 3 g of methanol was added to the reaction mixture. The reaction mixture was stirred for 30 minutes, and the reaction was ceased. Then, Pd-C was added thereto, and the resultant mixture was subjected to the catalytic reduction for an hour at 25° C. The resultant mixture was added to 500 ml of petroleum ether to precipitate the resultant polymer after the insoluble material was collected by filtration, reprecipitated in 500 ml of petroleum ether, and then collected by filtration and dried. The yield of the resultant polymer (Polymer (Q-40)) was 95 g, Mw thereof was $9.5\times10^3$.

Polymer (Q-40)

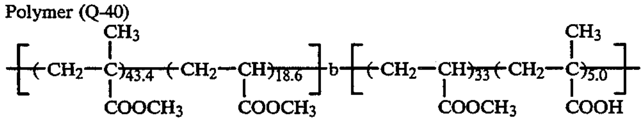

Example Q-41

A solution of 100 g of phenyl methacrylate and 200 g of toluene was degassed in a stream of nitrogen sufficiently, and cooled to −78° C. 5.0 g of 1,1-diphenyl-3-methylpentyllithiumwas added, and reacted for 8 hours. Then, to the resultant mixture, a solution of 60 g of benzyl methacrylate and 4.6 g of 4-vinylphenyloxytrimethylsilane was added thereto, stirred for 8 hours, and 3 g of methanol was added thereto, and stirred for 30 minutes.

Then, 10 g of a 30% solution of hydrochloric acid in ethanol was added thereto, and the resultant mixture was stirred at 25° C. for an hour, and added to 1 l of methanol to precipitate the resultant polymer. The resultant precipitate was collected, washed by 300 ml of methanol two times, and dried. The yield of the resultant polymer (Polymer (Q-41)) was 100 g, Mw thereof was $1.0\times10^4$.

Polymer (Q-41)

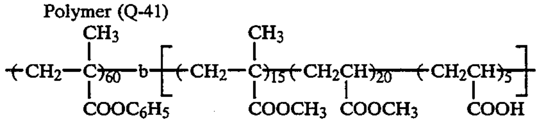

Example Q-42

A mixture of 67 g of 2-chlorophenyl methacrylate and 9.6 g of benzyl N,N-diethyl dithiocarbamate was fed to a vessel and sealed in a stream of nitrogen, heated to 50° C., and then, irradiated with light from 400 W-high pressure mercury vapor lamp through a glass filter from the distance of 10 cm for 8 hours to be photopolymerized. 32 g of methylacrylate, 1 g of acrylic acid and 180 g of methylethylketone were added to the resultant reaction mixture. Then, the vessel was purged with nitrogen, and the irradiation was conducted again for 10 hours. The resultant reaction mixture was added to 1 l of a solution (hexane/ethanol:3/1(v/v)) to precipitate the resultant polymer, and it was collected and dried. The yield of the resultant polymer (Polymer (Q-42)) was 73 g, Mw thereof was $8\times10^3$.

Polymer (Q-42)

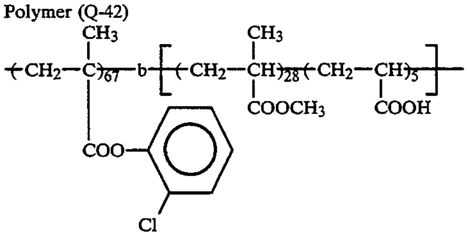

Example Q-43

A mixture of 75 g of 2,6-dichlorophenyl methacrylate and 6.5 g of benzylisopropyl xanthate and 150 g of tetrahydrofuran was fed to a vessel and sealed in a stream of nitrogen, and then, heated to 50° C. Then, it was irradiated with light from 400 W-high pressure mercury vapor lamp through a glass filter from the distance of 10 cm for 8 hours to be photopolymerized. 22 g of methylacrylate was added thereto. The vessel was purged with nitrogen, and the irradiation was conducted again for 10 hours. Then, 3 g of 2-(2'-carboxylethyl) carbonyloxyethyl methacrylate was added thereto. The vessel was purged with nitrogen, and the irradiation was conducted again for 8 hours. The resultant mixture was added to 2 l of methanol to precipitate the resultant polymer, and it was collected as a powder, and dried. The yield of the resultant polymer (Polymer (Q-43)) was 63 g, Mw thereof was $8\times10^3$.

Polymer (Q-43)

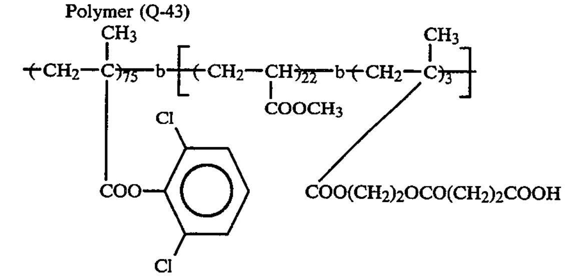

Example Q-44

A solution of 80 g of ethylacrylate, 20 g of methacrylic acid, 5 g of 2-mercaptoethanol and 200 g of tetrahydrofuran was heated to 60° C. with stirring in a stream of nitrogen. 1.0 g of 2,2'-azobisisovaleronytrile (A.I.V.N) was added thereto, and reacted for 4 hours. Then, 0.5 g of A.I.V.N. was further added thereto, and reacted for 4 hours.

After removing the precipitated crystalline, the filtrate was evaporated under reduced pressure at 25° C. to remove solvents. Weight-average molecular weight (Mw) of each of the resultant polymers (polymer initiator) was $3.5\times10^3$.

The polymer initiator

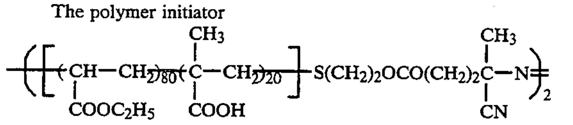

A solution of 70 g of 2-chloro-6-methylphenylmethacrylate and 170 g of toluene was heated to 85° C. with stirring in a stream of nitrogen. 30 g of the polymer initiator obtained above was dissolved in 30 g of toluene and purged with nitrogen, and the solution was added to the above solution and reacted for 8 hours. The resultant polymer was reprecipitated in 2 l of methanol, collected as a powder, and dried. The yield of the resultant polymer (Polymer (Q-44)) was 65 g, Mw thereof was $8\times10^3$.

Polymer (Q-44)

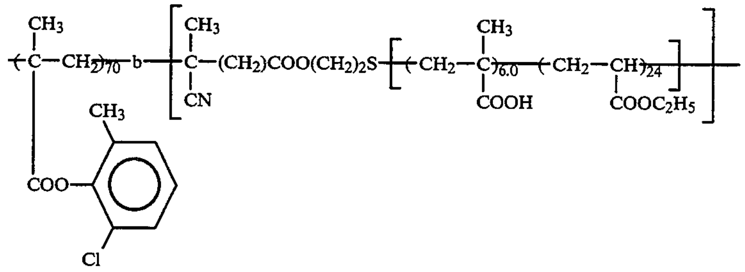

The resultant reaction mixture was allowed to rise to 20° C. Then, a solution of 22 g of 4,4'-azobis(cyano valetic acid), 12 g of dicyclohexyldicarbodiimide, 0.2 g of 4-(N,N-dimethyl) pyridyl and 30 g of tetrahydrofuran was added dropwise thereto for 1 hour, and stirred for 2 hours. Then, 5 g of 85% aqueous solution of formic acid was added thereto, and stirred for 30 minutes.

Examples Q-45-Q-54

Polymers (Q-45)-(Q-54) listed in Table A were prepared in a similar manner to the method of Example Q-42. Mw of each of the resultant polymers (Polymers (Q-45)-(Q-54))was in the range of $7\times10^3$ to $9\times10^3$.

TABLE A
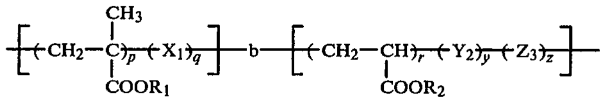
| Example | $R_1$ | $-X_1-$ | $R_2$ | $-Y_2-$ | $-Z_3-$ | p/q/r/y/z ratio by weight |
|---|---|---|---|---|---|---|
| Q-45 | 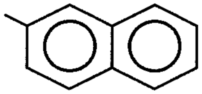 | — | $-CH_3$ | — |  | 65/0/32/0/3 |
| Q-46 | 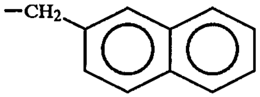 | — | $-C_2H_5$ | — | 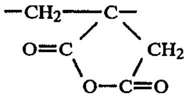 | 72/25/0/3 |
| Q-47 | 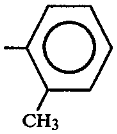 | 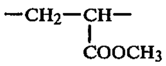 | $-CH_3$ | 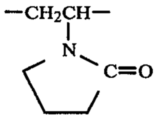 | 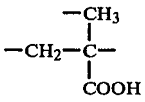 | 66/10/20/2/1 |
| Q-48 | 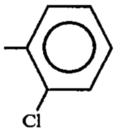 | 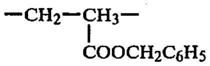 | $-CH_3$ | — | 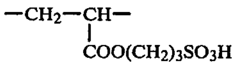 | 74.2/10/15/0/0.8 |
| Q-49 | $-C_3H_7$ | 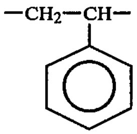 | $-CH_3$ | 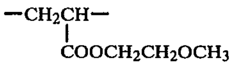 | 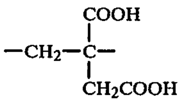 | 61/10/20/8/1.0 |
| Q-50 | 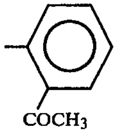 | 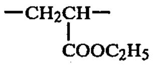 | $-CH_3$ | 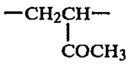 | 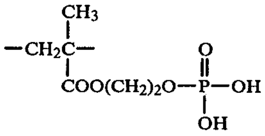 | 69/10/20/8/1.0 |

TABLE A-continued
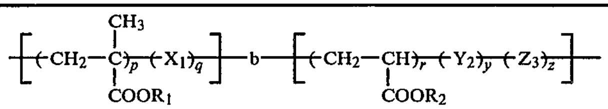
| Example | $R_1$ | $-X_1-$ | $R_2$ | $-Y_2-$ | $-Z_3-$ | p/q/r/y/z ratio by weight |
|---|---|---|---|---|---|---|
| Q-51 | 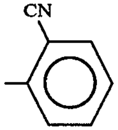 | — | $-C_2H_5$ | — | 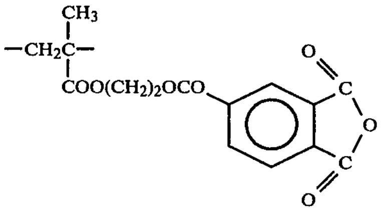 | 81/0/15/0/4 |
| Q-52 | $-C_6H_5$ | 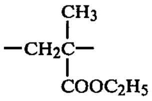 | $-CH_3$ | 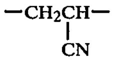 | 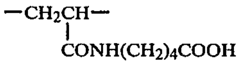 | 30/20/45/3/2 |
| Q-53 | $-CH_2C_6H_5$ | — | $-CH_3$ | 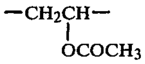 | 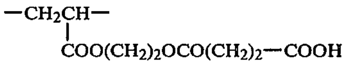 | 75/0/15/6.5/3.5 |
| Q-54 | $-(CH_2)_2C_6H_5$ | — | $-C_2H_5$ | 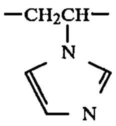 | 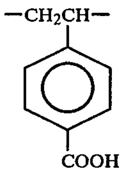 | 80/0/14/4/2 |

Example Q-55

A mixture of 90 g of methyl acrylate, 10 g of acrylic acid and 26.8 g of Initiator (I-10) represented by the following formula was heated to 40° C. in a stream of nitrogen. The resultant mixture was irradiated with light from 400 W-high pressure mercury vapor lamp through a glass filter from the distance of 10 cm for 10 hours to be photopolymerized. The resultant polymer was reprecipitated in 1 l of methanol. Then, the precipitate was collected, and dried. The yield of the resultant polymer was 75 g, Mw thereof measured with GPC method using a polystyrene standard (the same method was correspondingly applied to the following polymers(Q)) was $4\times10^3$.

Initiator (I-10)

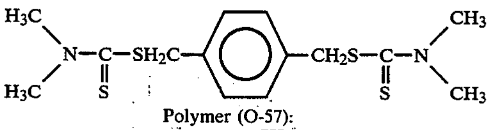

irradiated for 8 hours as the same manner as one of Example Q-39.

Initiator (I-12)

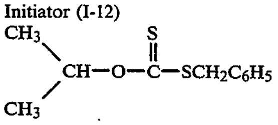

The resultant polymer was reprecipitated in 1 l of methanol, collected by filteration, and dried. 60 g of the polymer obtained above, 30 g of methyl methacrylate, 10 g of methacrylic acid and 100 g of tetrahydrofuran was allowed to rise to 50° C. in a stream of nitrogen. Then, it was irradiated for 10 hours as the same manner as explained above. The resultant polymer was reprecipitated in 1 l of methanol, collected, and dried. 6 g of the polymer (Polymer (Q-57)) was obtained. Mw thereof was $1.2\times10^4$.

Polymer (Q-57):

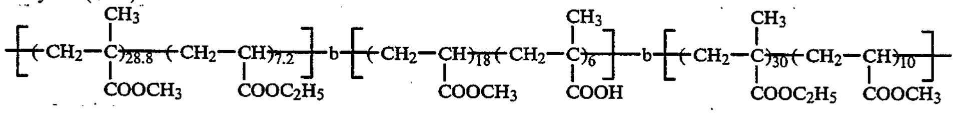

40 g of the polymer, 60 g of benzyl methacrylate and 100 g of tetrahydrofuran was heated to 50° C. in a stream of nitrogen. The irradiation was conducted again for 15 hours. The resultant polymer was reprecipitated in 1.5 l of methanol. The precipitate was collected and dried. The yield of the resultant polymer (Polymer (Q-55)) was 75 g, Mw thereof was $9\times10^3$.

Polymer (Q-55)

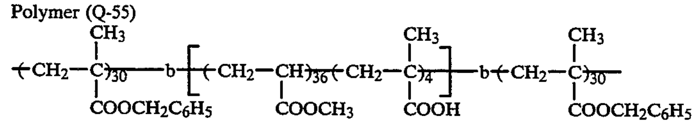

Example Q-56

The procedures of Example Q-55 were repeated except that 43.6 g of Initiator (I-11) was substituted for 26.8 g of Initiator (I-10). The yield of the resultant polymer (Polymer (Q-56)) was 70 g, Mw thereof was $8.5\times10^3$.

Initiator (I-11)

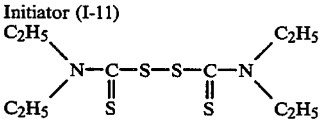

Polymer (Q-56)

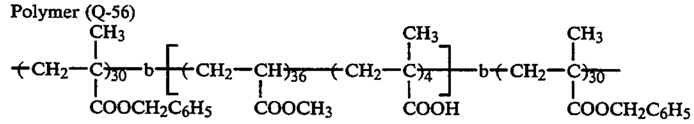

Example Q-57

A solution of 80 g of methyl methacrylate, 20 g of ethyl acrylate, 39.0 g of Initiator (I-12) represented by the following formula and 150 g of tetrahydrofuran was heated to 50° C. in a stream of nitrogen. Then, it was

Example Q-58

A solution of 50 g of methyl methacrylate and 100 g of tetrahydrofuran was degassed in a stream of nitrogen sufficiently, and cooled to −78° C. 7.2 g of 1,1-diphenylpentyllithium was added, and reacted for 12 hours. Then, a solution of 28 g of methyl acrylate, 6 g of triphenylmethyl methacrylate and 50 g of tetrahydrofran which had been degassed in a stream of nitrogen sufficiently was added thereto, and reacted for 8 hours.

Then, a solution of 50 g of methyl methacrylate and 50 g of tetrahydrofuran was degassed in a stream of nitrogen sufficiently, added to the solution, and reacted for 10 hours.

The resultant mixture was allowed to rise to 0° C., and 10 ml of methanol was added thereto, and reacted for 30 minutes. Then, the polymerization was ceased.

The resultant polymer solution was allowed to rise to 30° C. with stirring, and 3 ml of 30% solution of hydrochloric acid in ethanol was added and stirred for one hour. Then, the resultant mixture was evaporated to an half amount thereof under reduced pressure, and added to 1 l of methanol to precipitate the resultant polymer. The precipitate was collected, and dried under reduced pressure. The yield of the resultant polymer (Polymer (Q-58)) was 65 g, Mw thereof was $8\times10^3$.

Polymer (Q-58)

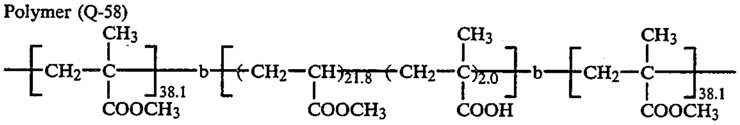

Example Q-59

A solution of 100 g of phenyl methacrylate, 1.5 g of (tetraphenylporphinate)aluminum methyl and 200 g of methylene chloride was allowed to rise to 30° C. in a stream of nitrogen. The resultant reaction mixture was irradiated with light from 300 W-xenon lamp through a glass filter from the distance of 25 cm, and reacted for 12 hours. Then, 40 g of ethyl acrylate and 9.2 g of benzyl methacrylate were added thereto, and the reaction mixture was irradiated for 10 hours in the same manner as explained above. 100 g of phenyl methacrylate was added thereto, and irradiated for 12 hours in the same manner as explained above. Then, 3 g of methanol was added to the reaction mixture and stirred for 30 minutes, and then the reaction was ceased. Then, Pd-C was added thereto, and the resultant mixture was subjected to a catalytic reduction at 25° C. for an hour. The resultant polymer was reprecipitated in 2 l of methanol after the insoluble material was collected by filtration and dried. The yield of the resultant polymer (Polymer (Q-59)) was 160 g, Mw thereof was $9.5\times10^3$.

Polymer (Q-59)

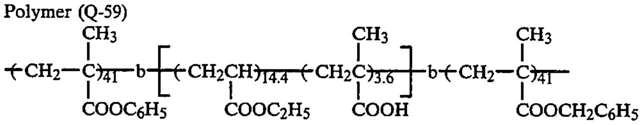

Examples Q-60–Q-69

Polymers (Q-60)–(Q-69) listed in Table B were prepared in a similar manner to the method of Example Q-56. Mw of each of resultant polymers (Polymers (Q-60)–(Q-69)) was in the range of $8\times10^3$ to $1\times10^4$.

TABLE B
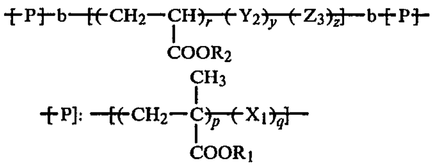
| Example | $R_1$ | $-X_1-$ | $R_2$ | $-Y_2-$ | $-Z_3-$ | p/q/r/y/z ratio by weight |
|---|---|---|---|---|---|---|
| Q-60 | 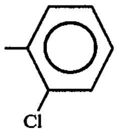 | — | $-CH_3$ | — | 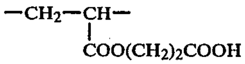 | 32.5/0/32/0/3 |
| Q-61 | 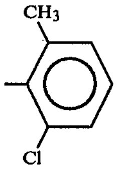 | — | $-C_2H_5$ | — | 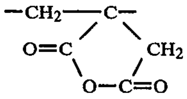 | 36/12.5/0/3 |
| Q-62 | 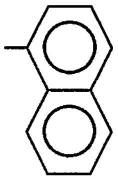 | 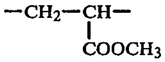 | $-CH_3$ | 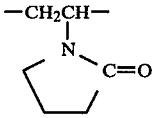 | 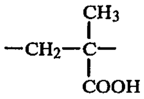 | 33/5/17/3/4 |
| Q-63 | $-CH_2C_6H_5$ | 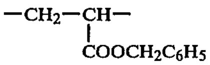 | $-CH_3$ | — |  | 37.1/5/13/0/2 |
| Q-64 | $-(CH_2)_2-C_6H_5$ | 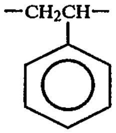 | $-CH_3$ | 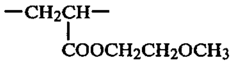 | 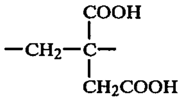 | 30.5/5/20/6/2.0 |

TABLE B-continued
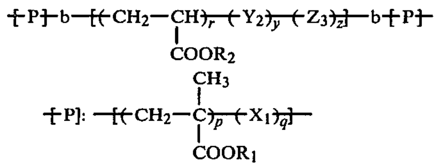
| Example | $R_1$ | $-X_1-$ | $R_2$ | $-Y_2-$ | $-Z_3-$ | p/q/r/y/z ratio by weight |
|---|---|---|---|---|---|---|
| Q-65 | 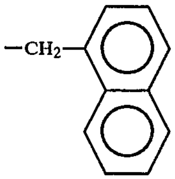 | — | $-CH_3$ | 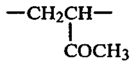 | 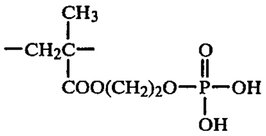 | 30/5/19/7.0/3.0 |
| Q-66 | 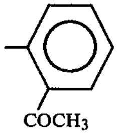 | 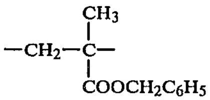 | $-C_2H_5$ | — | 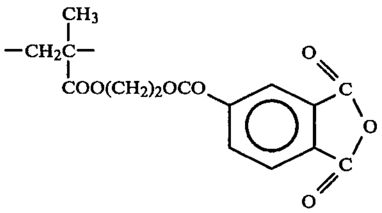 | 40.5/0/15/0/4 |
| Q-67 | $-C_6H_5$ | 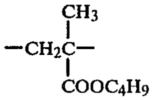 | $-CH_3$ | 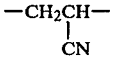 | 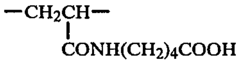 | 20/5/42/3/5 |
| Q-68 | $-CH_2C_6H_5$ | — | $-CH_3$ | 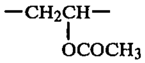 | 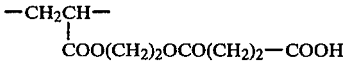 | 37.5/0/15/6.5/3.5 |
| Q-69 | 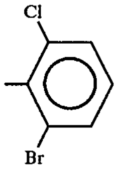 | — | $-C_2H_5$ | 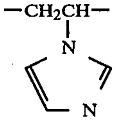 | 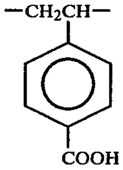 | 40/0/13/2/5 |

Examples Q-70 to Q-73

The procedures of Example Q-55 were repeated except that $1.5\times10^{-1}$ mol of each of initiators in the table C was substituted for 26.8 g of Initiator (I-10), The polymers having the same composition as one of the polymer (Q-55) were obtained, Mw of each of resultant polymers (Polymers (Q-70)-(Q-73)) was in the range of $6\times10^3$ to $9\times10^3$.

TABLE C

| Example | Initiator |
|---|---|
| Q-70 | 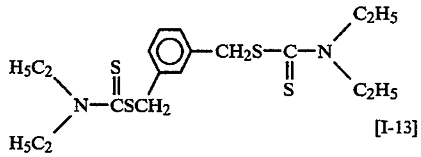 [I-13] |
| Q-71 | 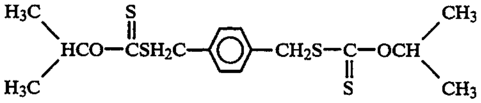 [I-14] |
| Q-72 | 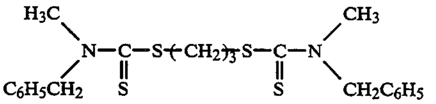 [I-15] |

TABLE C-continued

| Example | Initiator |
|---|---|
| Q-73 | 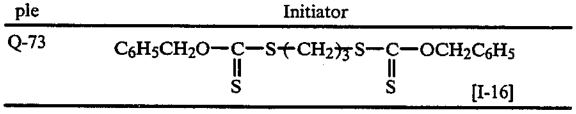 [I-16] |

Examples Q-74 to Q-80

A solution of 80 g of benzyl methacrylate, 20 g of acrylic acid and 22.6 g of Initiator (I-17) was heated to 40° C. in a stream of nitrogen, irradiated for 5 hours in the same manner as explained in Example Q-39. The resultant polymer was dissolved in 200 g of tetrahydrofuran, reprecipitated in 1.0 l of methanol, collected by filtration and dried.

Initiator (I-17)

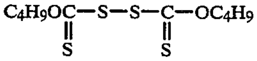

A solution of 20 g of the polymer, the monomer corresponding to the units listed in Table D and 100 g of tetrahydrofuran was irradiated for 15 hours in the same manner as explained above. The resultant polymer was reprecipitated in 1.5 l of methanol, collected by filtration and dried. Mw of each of resultant polymers (Polymers (Q-74)-(Q-80)) was in the range of $8\times10^3$ to $1\times10^4$. (Yield: 60 to 70 g)

TABLE D

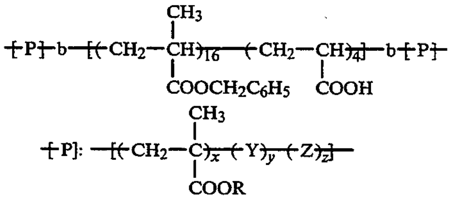

| Example | —R | —Y— | —Z— | x/y/z ratio by weight |
|---|---|---|---|---|
| Q-74 | $-CH_3$ | — | — | 40/0/0 |
| Q-75 | $-CH_2C_6H_5$ | 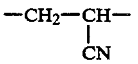 | — | 38/2/0 |
| Q-76 | 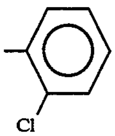 | 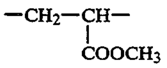 | 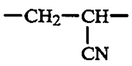 | 29/10/1 |
| Q-77 | 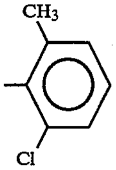 |  | — | 37/3/0 |
| Q-78 | $-CH_2C_6H_5$ | 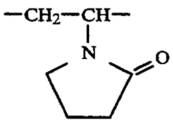 | — | 39/1.0/0 |

TABLE D-continued

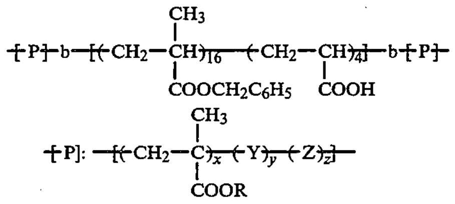

| Example | —R | —Y— | —Z— | x/y/z ratio by weight |
|---|---|---|---|---|
| Q-79 | 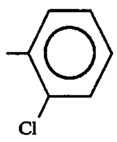 | — | — | 40/0/0 |
| Q-80 | 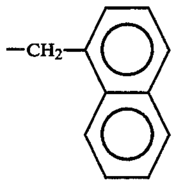 | 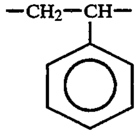 | 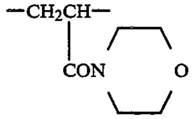 | 30/7.5/2.5 |

[Example 1]

A mixture of 1.5 g of metal-free X-form phthalocyanine (available from DAINIPPON INK AND CHEMICALS, INC.), 8.5 g of Polymer (R-1) represented by the following formula, 1.5 g of Polymer (Q-5), 0.3 g of Polymer (P-104) of the present invention, 0.15 g of Compound A represented by the following formula and 80 g of tetrahydrofuran was charged together with glass beads in a 500 ml glass container. The mixture was dispersed by a paint shaker (available from TOYO SEIKI SEISAKUSHO) for 60 minutes and then the glass beads were separated by filtration to prepare a dispersion for a photoconductive layer.

The dispersion was coated with a wire bar on a base for a paper master having 0.2 mm thickness subjected to both of a treatment for electrical conductivity and a treatment for solvent resistance. After being dried by air to be tack-free, the coating was dried in a circulating oven at 110° C. for 20 seconds and then heated to 140° C. for 1 hour to obtain a photoconductive layer having 8 $\mu$m thickness.

Polymer (R-1)

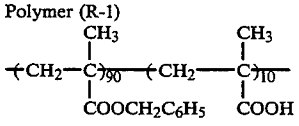

$\overline{Mw}$ 6.5 × $10^4$

The numbers of the repeating units in the formula represent a ratio by weight.

Compound A

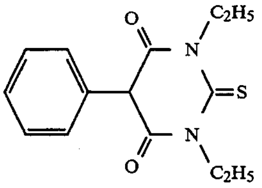

A thermoplastic resin solution having the following contents was then prepared to form a transfer layer (or a transfer removable layer or a removable layer) on the photoconductive layer.

| | |
|---|---|
| Poly(vinyl acetate/crotonic acid) (95/5, Mw 5 × $10^4$) | 3 g |
| 28% Aqueous Ammonia | 1 g |
| Ethanol | 97 g |

After the above solution was coated with a wire bar on the photoconductive layer, the coating was dried in an oven at 120° C. for 20 seconds to prepare an electrophotographic material for color proofing, comprising a transfer layer having 1.3 $\mu$m thickness.

[Comparative Example A1]

An electrophotographic material for color proofing was prepared in the same manner as that of Example 1 except that 0.3 g of a random copolymer (RP-1) was used instead of 0.3 g of Polymer (P-104).

Random copolymer (RP-1)

-continued

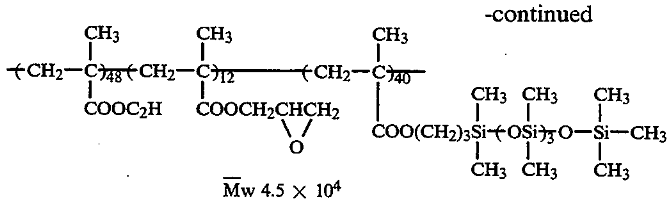

$\overline{M}w$ 4.5 × $10^4$

[Comparative Example B1]

An electrophotographic material for color proofing was prepared in the same manner as that of Example 1 except that 10 g of Polymer (R-1) was used instead of 8.5 g of Polymer (R-1) and 1.5 g of Polymer (Q-1).

[Test Example]

The electrostatic properties, transfer properties and image reproducibilities of the electrophotographic materials for color proofing obtained in Example 1 and Comparative Examples A1 and B1 were evaluated. The results are summarised in Table 5 below.

TABLE 5

| | Example 1 | Comparative Example A1 | Comparative Example B1 |
|---|---|---|---|
| Electrostatic properties$^{1)}$ | | | |
| $V_{10}$ (−V) | | | |
| I (20° C., 65% RH) | 550 | 545 | 530 |
| II (30° C., 80% RH) | 530 | 525 | 505 |
| D.R.R (%) | | | |
| I (20° C., 65% RH) | 85 | 85 | 80 |
| II (30° C., 80% RH) | 80 | 80 | 70 |
| $E^{1/10}$ (erg/cm$^2$) | | | |
| I (20° C., 65% RH) | 28 | 29 | 38 |
| II (30° C., 80% RH) | 31 | 31 | 42 |
| Transfer property$^{2)}$ | ○ very good | X severe transfer defect | ○ very good |
| Image reproducibility$^{3)}$ | | | |
| I (20° C., 65% RH) | ○ very good | XX severe image defect | ○ very good |
| II (30° C., 80% RH) | ○ very good | XX severe image defect | X~Δ low density fine lines and fine characters disappeared |

The properties shown in Table 5 were evaluated as follows.

1) Electrostatic properties

Each of the electrophotographic materials for color proofing was corona discharged at −6 kV for 20 seconds by means of a paper analyzer (Paper Analyzer SP-428, Kawaguchi Electric Co.,Ltd.) in a darkroom at 20° C. (65% RH) and left for 10 seconds and the surface potential was determined ($V_{10}$). Then, the material was further left in dark for 120 seconds and again the potential was determined ($V_{130}$) to obtain a dark decay retention rate (D.R.R.) in %, which means a potential retention rate after the 120 second-dark decay was allowed, according to the equation, D.R.R. (%)=($V_{130}/V_{10}$)×100.

Further, the surface of the photoconductive layer in contact with the transfer layer was charged by corona discharge to −500 V, then the material was irradiated with monocolor light having a wavelength of 780 nm, and the time required for 1/10 decay of the surface potential ($V_{10}$) was determined. Based on the obtained time, exposure, $E_{1/10}$, was calculated in term of erg/cm$^2$.

Also under the condition of the temperature of 30° C. and 80% RH, the properties were evaluated in the same manner as described above. Hereinafter, the conditions of 20° C., 65% RH and 30° C., 80% RH are referred to as Conditions I and II respectively.

2) Transfer property

A sheet of coated paper was laid on the electrophotographic material having a transfer layer and then transferred at a speed of 5 mm/sec between a pair of hollow metal heat rollers coated with a silicone rubber layer and having an infrared lamp heater therein.

The surface temperatures of the rollers, the upper one and the lower one, were maintained at 120° C., the rollers were arranged so as to obtain the nip pressure of 5 kgf/cm$^2$, and the conveyor speed was controlled at 5 mm/sec.

After being cooled to room temperature as the coated paper was laid on the material, the paper was separated from the electrophotographic material. The quality of the image transferred to the coated paper was visually evaluated.

3) Image reproducibility

An image was formed on each of the electrophotographic materials for color proofing under the conditions, Condition (I) or (II), and the image reproducibility of the color proof after the transfer was evaluated.

Each of the electrophotographic materials was charged by corona discharge to +450 volts in dark. The charged electrophotographic material was imagewise exposed to light by a Ga—A1—As semiconductor laser (oscillation wavelength 780 nm) having 5mW of output power with 30 erg/cm$^3$ of irradiation measured on the electrophotographic material in a pitch of 25 μm at a scanning speed of 300 cm/sec in a mode of negative mirror image, based on the information about yellow color among informations about yellow, magenta, cyan and black, which were recorded in a hard disk of a color scanner system as digital image data which were obtained by reading an original using the color scanner system and conducting color separation and correction regarding some color reproductions specific to the system. Subsequently, the exposed electrophotographic material was reversally developed using a yellow liquid developer for a signature system (available from Eastman Kodak) 75-fold (by weight) diluted with Isoper H (available from Esso Standard Oil Co.) by a developing apparatus having a pair of plane developing electrodes under the application of +400 volts of bias voltage to electrically deposit toners on the exposed areas of the electrophotographic material and then the developed electrophotographic material was rinsed in a bath of Isoper H to remove contamination in the non-image areas.

The above procedure was repeated using each information of magenta, cyan and black instead of the information of yellow.

The image formed on the obtained electrophotographic material after image-form production was fixed using a heat roller.

Subsequently, coated paper (regular printing paper) was laid on the electrophotographic material having fixed image and then transferred at a speed of 10 mm/sec between a pair of rubber rollers which were in contact each other under a pressure of 15 $kgf/cm^2$ and whose surfaces were constantly maintained at 120° C.

After being cooled to room temperature, the coated paper was separated from the electrophotographic material. Image formed on the coated paper was visually evaluated regarding fog and image quality.

As shown in Table 5, the materials of Example 1 (the present invention) and Comparative Example A1 showed good electrostatic properties regardless of the variation of the conditions.

However, the electrostatic properties, especially the dark decay retention rate (D.R.R.) and the photosensitivity ($E_{1/10}$), of the material obtained in Comparative Example B1, which comprised only the conventional polymer as the binder resin, were deteriorated.

It is considered that the above difference is due to the fact that, in the electrophotographic material for color proofing of the present invention, the polymer (Q) sufficiently adsorb the photoconductive compound and enables uniform dispersion of the photoconductive compound and thereby ensures a condition which allows the sufficient and uniform interaction between the chemical sensitizer, Compound (A), and the photoconductive compound.

Further, the transfer layers of the materials obtained in Example 1 and Comparative Example B1, which utilizes the polymer (Q) of the present invention, were completely transferred to the receptive materials, whereas the material for color proofing of Comparative Example A1 could not successfully peeled off from the coated paper and the transfer layer or the photoconductive layer was broken.

It is considered that the above difference is due to the fact that, in the electrophotographic material for color proofing of the present invention and Comparative Example B1, the polymer (P), which is the fluorine atom-containing copolymer, in the photoconductive layer migrates and is concentrated on the surface of the layer at the time of the formation of the photoconductive layer and then forms a cured film through chemical bondings between the polymer chains by a crosslinking agent to form a definite interface of the layers, whereas such a definite interface is not formed in the material of Comparative Example A1, which utilizes a conventional random copolymer.

In addition, the electrophotographic material for color proofing of the present invention could provide the color proof with a good color image regardless of the change of environmental conditions, while the material of Comparative Example A1 could not provide a sufficient image because of the bad transfer property and the of the material of Comparative Example B1 resulted in extremely deteriorated image reproducibility under high humidity.

Further, the peeling property of the photoconductive layers formed in, Example 1 and Comparative Example A1 were examined by determining tack strength of these photoconductive layers according to JISZ0237-1980, "Adhesion Tape or Sheet Test Method" before the formation of the transfer layer. As a result, tack strength of the photoconductive layer of 6 g.f for the material of Example 1 and 330 g.f for the material of Comparative Example A1 were obtained.

As described above, the electrophotographic material for color proofing of the present invention alone showed excellent properties.

[Example 2 ]

A mixture of 200 g of photoconductive zinc oxide, 10 g of Polymer (Q-1), 40 g of Polymer (R-2) represented by the following formula, 8 g of Polymer (P-103) of the present invention, 0.018 g of Dye (D-1) represented by the following formula, 0.20 g of N-hydroxysuccinimide and 300 g of toluene was charged in a homogenizer (Nihon Seiki Co. ,Ltd. ) and dispersed for 10 minutes at $9\times10^3$ rpm.

To this dispersion, 0.3 g of phthalic anhydride and 0.01 g of o-chlorophenol were added and dispersed for 1 minute at $1\times10^3$ rpm.

The dispersion was coated with a wire bar on a base for a paper master having 0.2 mm thickness subjected to both of a treatment for electrical conductivity and a treatment for solvent resistance. After being dried by air to be tack-free, the coating was dried in a circulating oven at 90° C. for an hour to obtain a photosensitive layer having 10 μm thickness.

Polymer (R-2)

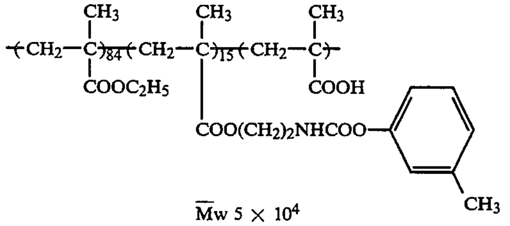

$\overline{M}w$ 5 × $10^4$

Dye (D-1)

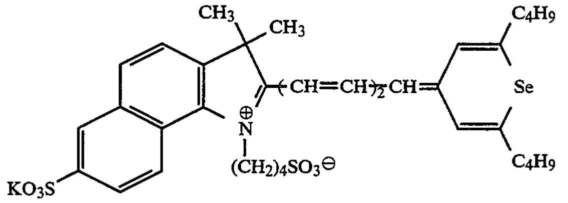

The same thermoplastic resin solution as that of Example 1 was prepared, coated on the photosensitive layer and dried to form a transfer layer on the photosensitive layer.

[Comparative Example C1]

An electrophotographic material for color proofing was prepared in the same manner as that of Example 2 except that 50 g of Polymer (R-2) alone was used instead of 10 g of Polymer (Q-1) and 40 g of Polymer (R-2).

[Test Example]

Smoothnesses, electrostatic properties, transfer properties and image reproducibilities of the electrophotographic materials for color proofing obtained in Example 2 and Comparative Example C1 were evaluated.

The results are summarised in Table 6 below.

TABLE 6

| | Example 2 | Comparative Example C1 |
|---|---|---|
| Smoothness of the surface[1)] of the photoconductive layer | 1,000 | 850 |
| Electrostatic Properties | | |
| $V_{10}$ (−V) | | |
| I | 630 | 550 |
| II | 600 | 480 |
| D.R.R. (%) | | |
| I | 85 | 75 |
| II | 80 | 40 |
| $E^{1/10}$ (erg/cm$^2$) | | |
| I | 35 | 98 |
| II | 40 | 80 |
| Transfer property | ○ very good | ○ very good |
| Reproducibility[2)] of image | | |
| I | ○ good | Δ~○ a little bit low density fine lines and fine characters slightly disappeared |
| II | ○ good | XX low density background contamination fine lines and fine characters disappeared |

As to the properties shown in Table 6, the electrostatic properties and the transfer properties were evaluated in the same manner as in Example 1, and the smoothness and the image reproducibility Were evaluated as follows.

1) Smoothness of Photoconductive Layer

The smoothness of the electrophotographic materials for color proofing (see/cc) was determined by a Beck smoothness tester (Kumagaya Rikoh Co.,Ltd.) under the condition of 1 cc air volume.

2) Image Reproducibility

Each of the electrophotographic materials was charged by corona discharge to −600 volts in dark. The charged electrophotographic material was imagewise exposed to light by a semiconductor laser (oscillation wavelength 780 nm) with 25 erg/cm$^3$ of irradiation measured on the surface of the electrophotographic material in a mode of positive mirror image, based on the information about yellow color. The residual voltage on the exposed areas was −120 volts. Subsequently, the exposed electrophotographic material was positively developed using a yellow toner for VERSATECK 3000 (color electrostatic plotter available from Xerox Co.) diluted with a 50-fold amount of Isoper H by a developing apparatus having a pair of plane developing electrodes under the application of −200 volts of bias voltage to electrically deposit toners on the unexposed areas of the electrophotographic material and then the developed electrophotographic material was rinsed in a bath of Isoper H to remove background contamination in the non-image areas.

The above procedure was repeated using each information of magenta, cyan and black instead of the information of yellow.

Subsequently, coated paper was laid on the electrophotographic material developed with the four color toners and then transferred at a speed of 6 mm/sec between a pair of rubber rollers which were in contact each other under a pressure of 10 kgf/cm$^2$ and whose surfaces were constantly maintained at 120° C.

After being cooled to room temperature, the coated paper was separated from the electrophotographic material.

As shown in Table 6, the material of Example 2 (the present invention) showed extremely excellent electrostatic properties and when the environmental conditions were changed, the fluctuation of the properties was not so significant. Further, in the practical image formation with this material of the invention, good image reproducibility was obtained as to fine images such as fine lines and fine characters without background contamination. On the other hand, the electrostatic properties of the material obtained in Comparative Example C1 were extremely deteriorated, especially under a high humidity, and practically acceptable image reproducibility was not obtained with this comparative material. That is, the fog of non-imaged areas and the image density were deteriorated and the disappearance of fine lines became significant.

Good transfer properties were obtained in both of the materials, and thus it was found that the peeling properties of the photoconductive layer may be improved by the polymer (P) not only in the photoconductive layer comprising the organic photoconductive compound but also in the layer comprising the inorganic photoconductive compound.

Further, the peeling property of the photoconductive layers formed in Example 2 and Comparative Example C1 were examined by determining tack strength of these photoconductive layers according to JISZ0237-1980, "Adhesion Tape or Sheet Test Method" before the formation of the transfer layer. As a result, tack strength of the photoconductive layer of 8 g.f for the material of Example 2 and 380 g.f for the material of Comparative Example C1 were obtained.

As described above, the electrophotographic material for color proofing of Example 2 showed good transfer property and showed good image reproducibility regardless of the change of the environmental conditions.

[Example 3 ]

5 g of 4,4'-bis(diethylamino)-2,2'-dimethyl triphenylmethane as an organic photoconductive compound, 1 g of Polymer (Q-32), 3 g of Polymer (R-3) represented by the following formula, 0.8 g of Polymer (P-119) of the present invention, 40 mg of Dye (D-2) represented by the following formula and 0.20 g of an anilide compound (B) represented by the. following formula as a chemical sensitizer were dissolved in a mixture of 30 ml of methylene chloride and 30 ml of ethylene chloride to prepare a solution for a photoconductive layer.

The solution was coated with a wire-round rod on an electrically-conductive transparent substrate which comprises a polyethylene terephthalate substrate (100 μm in thickness) having an indium oxide film deposited thereon and has a surface resistance of 10$^3$ Ω to form a photoconductive layer having about 4 μm thickness.

Polymer (R-3)

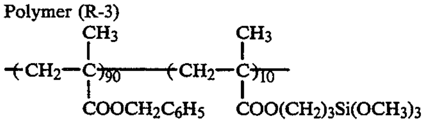

$\overline{M}$w 6 × 10$^4$

-continued

Dye (D-2)

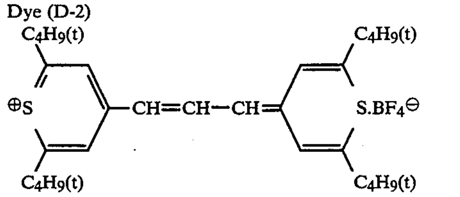

Anilide Compound (B)

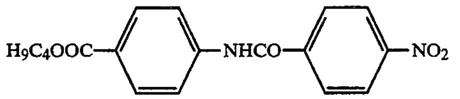

The results obtained in an adhesion test with an adhesive-backed tape, which was carried out to confirm the partial presence of the polymer (P) at the surface of the photoconductive layer, revealed that the adhesion of the photoconductive layer of the material of the invention was one-seventieth compared with a photoconductive layer formed in the same manner as in Example 3 except that Polymer (R-3) was used instead of Polymer (P-119) in the same amount.

The same thermoplastic resin solution as that of Example 1 was prepared, coated on the photoconductive layer and dried to form a transfer layer on the photoconductive layer.

An adhesive-backed tape was attached to the surface of the removable layer and peeled off. As a result, only the transfer layer was easily separated from the photosensitive layer.

The image quality and the transfer properties of the electrophotographic material thus obtained were evaluated in the same manner as that of Example 1 except that a He—Ne laser having an oscillation wavelength of 630 nm was used instead of the semiconductor laser having an oscillation wavelength of 780 nm.

A clear color copy image without fog was obtained on coated paper after transfer. The image had sufficient strength.

[Example 4]

A mixture of 5 g of bis-azo pigment represented by the following formula, 95 g of tetrahydrofuran, 1.5 g of Polymer (Q-17) and a solution of 3.5 g of polyester resin, Byron 200 (available from TOYOBO CO., LTD) and 30 g of tetrahydrofuran was sufficiently ground in a ball mill. Then, the mixture was drawn and 520 g of tetrahydrofuran were added thereto while stirring. The obtained dispersion was coated with a wire-wound rod on the same electrically-conductive transparent substrate as that used in Example 1 to form a charge generation layer having about 0.7 μm thickness.

Bis-azo Pigment

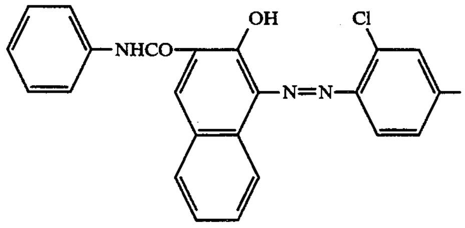

-continued

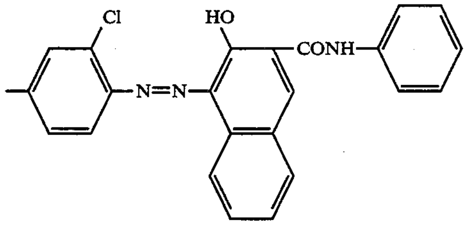

Subsequently, a solution consisting of 20 g of a hydrazone compound represented by the following formula, 2 g of Polymer (P-102), 20 g of polycarbonate resin Lexan 121 (available from GE Co.), 0.04 g of isophorone diisocyanate, 0.001 g of tetrabutoxy titanate and 160 g of tetrahydrofuran was coated with a wire-wound rod on the charge generation layer, dried at 60° C. for 30 seconds, and heated at 120° C. for 1 hour to form a charge transport layer having thickness of about 18 μm. Thus, the obtained electrophotographic material comprising the two functional layers of the charge generation layer and the charge transport layer.

Hydrazone Compound

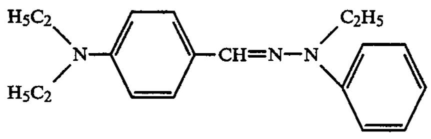

The same thermoplastic resin solution as that of Example 1 was prepared, coated on the photoconductive layer and dried to form a transfer layer on the photoconductive layer.

An adhesive-backed tape was attached to the surface of the transfer layer and peeled off. As a result, only the transfer layer was easily separated from the photoconductive layer.

The image quality and the transfer properties of the electrophotographic material thus obtained were evaluated in the same manner as that of Example 1 except that a He—Ne laser having an oscillation wavelength of 630 nm was used instead of the semiconductor laser having an oscillation wavelength of 780 nm.

A clear color copy image without fog was obtained on coated paper after transfer. The image had sufficient strength.

[Examples 5 to 7]

Electrophotographic materials for color proofing were prepared in the same manner as that of Example 1 except that 0.3 g of Polymer (P) in Table 7 was used instead of 0.3 g of Polymer (P-104).

The electrostatic properties, transfer properties and image reproducibilities of the resultant electrophotographic materials for color proofing were evaluated in the same manners as those of Example 1. The results are summarised in Table 7 below.

TABLE 7

| Examples | Example 5 | Example 6 | Example 7 |
|---|---|---|---|
| Polymer (P) | (P-209) | (P-308) | (P-421) |
| Electrostatic properties | | | |
| $V_{10}$ (−V) | | | |
| I | 555 | 550 | 550 |
| II | 535 | 535 | 530 |

TABLE 7-continued

| Examples | Example 5 | Example 6 | Example 7 |
|---|---|---|---|
| D.R.R (%) | | | |
| I | 86 | 85 | 86 |
| II | 82 | 81 | 81 |
| $E^{1/10}$ (erg/cm$^2$) | | | |
| I | 28 | 27 | 28 |
| II | 31 | 30 | 30 |
| Transfer property | ○ very good | ○ very good | ○ very good |
| Image reproducibility | | | |
| I | ○ good | ○ good | ○ good |
| II | ○ good | ○ good | ○ good |

As shown in Table 7, all of the materials of Examples 5 to 7 showed good electrostatic properties, transfer properties and image reproducibilities at levels comparable to those of the material obtained in Example 1.

Tack strength of each of the materials of Examples 5 to 7 was in the range of 5 to 8 g. f. Namely, they showed a good peeling property.

The electrophotographic material prepared in the same manner as in Example 1 except that Polymer (R-1) was used instead of Polymer (P-104) in the same amount showed inferior transfer property. Namely, the photoconductive layer of the material could not be successfully peeled off from the transfer layer.

The electrophotographic materials for color proofing were prepared in the same manner as that of Example 1 except that 10 g of Polymer (R-1) was used instead of 8.5 g of Polymer (R-1) and 1.5 g of Polymer (Q-5), and each of the polymers (p) used in Examples 5 to 7 was used instead of Polymer (P-104). The electrostatic properties of the resultant electrophotographic materials were extremely deteriorated when environmental conditions were changed, especially to a high temperature and a high humidity, and practically acceptable image reproducibility was not obtained with the materials. That is, the fog of non-imaged areas and the image density were deteriorated and the disappearance of fine lines and fine characters became significant.

Accordingly, the results of the above test examples showed that the electrophotographic materials of the present invention can provide extremely excellent color proofs.

[Examples 8 to 27]

Electrophotographic materials for color proofing were prepared in the same manner as that of Example 1 except that 1.5 g of Polymer (Q) shown in Table 8 was used instead of 1.5 g of Polymer (Q-5).

TABLE 8

| Example | Polymer(Q) |
|---|---|
| 8 | Q-1 |
| 9 | Q-2 |
| 10 | Q-3 |
| 11 | Q-4 |
| 12 | Q-6 |
| 13 | Q-7 |
| 14 | Q-8 |
| 15 | Q-9 |
| 16 | Q-11 |
| 17 | Q-12 |
| 18 | Q-13 |
| 19 | Q-14 |
| 20 | Q-15 |
| 21 | Q-18 |
| 22 | Q-21 |

TABLE 8-continued

| Example | Polymer(Q) |
|---|---|
| 23 | Q-22 |
| 24 | Q-29 |
| 25 | Q-31 |
| 26 | Q-48 |
| 27 | Q-50 |

The image quality and the transfer properties of each of the electrophotographic materials thus obtained were evaluated in dark in the same manner as that of Example 1. Clear color copy images without background contamination were obtained on coated paper after transfer. The images had sufficient strength.

[Examples 28 to 50]

Electrophotographic materials for color proofing were prepared in the same manner as that of Example 1 except that 1.5 g of Polymer (Q), 0.3 g of Polymer (P) and cross-linking compounds shown in Table 9 were used instead of 1.5 g of Polymer (Q-5), 0.3 g of Polymer (P-104) and the cross-linking compound used in Example 1.

TABLE 9

| Example | Polymer (Q) | Polymer (P) | Cross-linking compound | |
|---|---|---|---|---|
| 28 | Q-53 | P-202 | gluconic anhydride<br>o-cresol | 0.15 g<br>0.01 g |
| 29 | Q-32 | P-301 | gluconic anhydride<br>o-cresol | 0.15 g<br>0.01 g |
| 30 | Q-78 | P-214 | ethylene glycol diglycidyl ether<br>zinc stearate | 0.03 g<br>0.001 g |
| 31 | Q-33 | P-315 | ethylene glycol diglycidyl ether<br>zinc stearate | 0.03 g<br>0.001 g |
| 32 | Q-60 | P-419 | ethylene glycol diglycidyl ether<br>zinc stearate | 0.03 g<br>0.001 g |
| 33 | Q-34 | P-207 | 1,6-dihexanediamine | 0.20 g |
| 34 | Q-40 | P-423 | gluconic acid<br>phenol | 0.18 g<br>0.002 g |
| 35 | Q-51 | P-421 | phthalic anhydride<br>o-chlorophenol | 0.2 g<br>0.001 g |
| 36 | Q-16 | P-210 | 3-aminopropyltrimethoxy silane | 0.1 g |
| 37 | Q-33 | P-321 | 3-aminopropyltrimethoxy silane | 0.1 g |
| 38 | Q-66 | P-417 | 3-aminopropyltrimethoxy silane | 0.1 g |
| 39 | Q-76 | P-212 | propylene glycol<br>tetrabutoxytitanate | 0.8 g<br>0.001 g |
| 40 | Q-19 | P-323 | propylene glycol<br>tetrabutoxytitanate | 0.8 g<br>0.001 g |
| 41 | Q-27 | P-213 | trimethylolpropane<br>tin dilaurate dibutoxide | 1.0 g<br>0.001 g |
| 42 | Q-42 | P-125 | trimethylolpropane<br>tin dilaurate dibutoxide | 1.0 g<br>0.001 g |
| 43 | Q-37 | P-215 | phthalic anhydride<br>cobalt acetylacetonate | 0.3 g<br>0.001 g |
| 44 | Q-62 | P-329 | phthalic anhydride<br>cobalt acetylacetonate | 0.3 g<br>0.001 g |
| 45 | Q-67 | P-421 | phthalic anhydride<br>cobalt acetylacetonate | 0.3 g<br>0.001 g |
| 46 | Q-64 | P-322 | propylene glycol diglycidyl ether<br>o-chlorophenol | 0.05 g<br>0.002 g |
| 47 | Q-80 | P-222 | $ROOCNH(CH_2)_6NHCOOR$<br>tetrapropoxytitanate | 0.2 g<br>0.001 g |
| 48 | Q-72 | P-122 | $ROOCNH(CH_2)_6NHCOOR$<br>tetrapropoxytitanate | 0.2 g<br>0.001 g |
| 49 | Q-73 | P-335 | γ-glycidepropyl trimethoxysilane | 0.1 g |
| 50 | Q-35 | P-118 | γ-glycidepropyl | 0.1 g |

TABLE 9-continued

| Example | Polymer (Q) | Polymer (P) | Cross-linking compound |
|---|---|---|---|
| | | | trimethoxysilane |

In Table 9, R represents an m-methylphenyl group.

The image quality and the transfer properties of each of the electrophotographic material thus obtained were evaluated in the same manner as that of Example 1.

Clear color copy images without background contamination were obtained on coated paper after transfer. The images had sufficient strength.

[Examples 51 to 58]

Electrophotographic materials for color proofing were prepared in the same manner as that of Example 1 except that 2 g of Polymer (Q), 9 g of Polymer (R) and 0.3 g of Polymer (P) were used.

TABLE 10

| Example | Polymer (Q) | Polymer (R) | Polymer (P) | Cross-linking compound | |
|---|---|---|---|---|---|
| 51 | Q-30 | R-4 | P-429 | benzoyl peroxide | 0.008 g |
| 52 | Q-24 | R-5 | P-116 | 1,4-butanediol | 0.3 g |
| | | | | tin dilaurate dibutoxide | 0.001 g |
| 53 | Q-17 | R-6 | P-428 | ethyleneglycol dimethacrylate | 2.0 g |
| | | | | 2,2'-azobis(isovalero nytrile) | 0.03 g |
| 54 | Q-71 | R-6 | P-325 | ethyleneglycol dimethacrylate | 2.0 g |
| | | | | 2,2'-azobis(isovalero nytrile) | 0.03 g |
| 55 | Q-68 | R-7 | P-129 | divinyl adipate | 2.2 g |
| | | | | 2,2'-azobis(isovalero nytrile | 0.01 g |
| 56 | Q-12 | R-7 | P-336 | divinyl adipate | 2.2 g |
| | | | | 2,2'-azobis(isovalero nytrile) | 0.01 g |
| 57 | Q-63 | R-8 | P-422 | block isocyanate Aditol VXL 81 (manufactured by Hoechst) | 3 g |
| | | | | butyl titanate dimer | 0.02 g |
| 58 | Q-22 | R-8 | P-126 | block isocyanate Aditol VXL 81 (manufactured by Hoechst) | 3 g |
| | | | | butyl titanate dimer | 0.02 g |

Polymers (R-4) to (R-8) are represented by the following formulae.

(R-4)

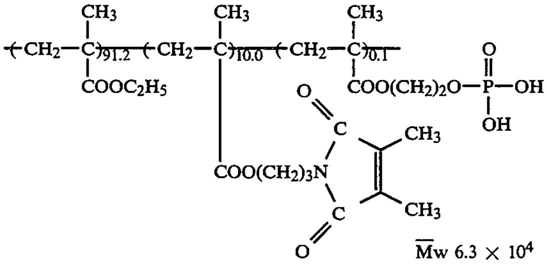

Mw 6.3 × 10^4

(R-5)

-continued

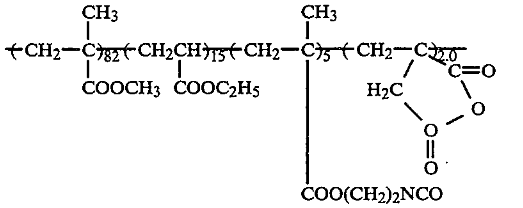

Mw 7.5 × 10^4

(R-6)

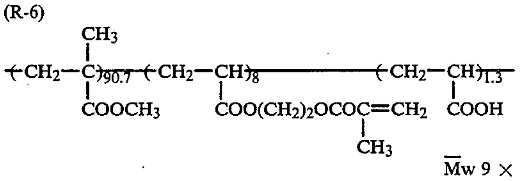

Mw 9 × 10^4

(R-7)

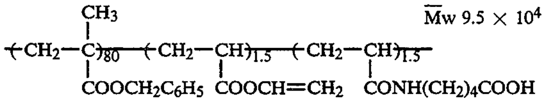

Mw 9.5 × 10^4

(R-8)

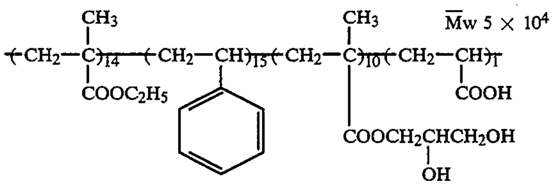

Mw 5 × 10^4

Transfer layers were formed on the above-obtained photoconductive layers in the same manner as that of Example 1 to obtain electrophotographic materials for color proofing. When color proofs were prepared by using these materials, clear copy images were obtained without background contamination.

[Examples 59 to 66]

Electrophotographic materials for color proofing were prepared in the same manner as that of Example 1 except that polymers and solvents shown in Table 11 were used instead of poly(vinyl acetate/crotonic acid)(95/5, ratio by weight).

TABLE 11

| Example | Thermoplastic resins | Solvent for Coating |
|---|---|---|
| 59 | Cellulose acetate butyrate: Cellidor Bsp (manufactured by Bayer AG) | Ethyl acetate |
| 60 | Polyvinyl butyral resin: ESLECK (manufactured by Sekisui Chemical Co., Ltd) | Ethanol |
| 61 | Cellulose propionate: CELLIDORIA (manufactured by DAICEL CHEMICAL INDUSTRIES, LTD) | Ethyl acetate |
| 62 | Poly(vinyl acetate) | Methyl ethyl ketone |
| 63 | Poly(vinyl acetate/crotonic acid) (molar ratio 95/5) and Cellidor Bsp (ratio by weight 8/2) | Ethanol solution containing 1% Aqueous Ammonia |
| 64 | Methylmethacrylate/methylacrylate copolymer (ratio by weight 6/4) | Tetrahydrofuran |
| 65 | Styrene/butadiene copolymer (Sorprene 1205) (manufactured by Asahi Chemical | Toluene |

TABLE 11-continued

| Example | Thermoplastic resins | Solvent for Coating |
|---|---|---|
| | Industry Co., Ltd.) | |
| 66 | Poly(vinyl acetate)/ poly(ethylmethacrylate) (ratio by weight 6/4) | Methylethylketone |

Electrostatic properties, transfer properties and image reproducibilities of the obtained materials were evaluated in the same manners as those of Example 1. All of the materials showed those properties at levels comparable to those of the material obtained in Example 1.

What is claimed is:

1. An electrophotographic material for color proofing which comprises a substrate, a photoconductive layer and a transfer layer in this order, and is used for preparing a color proof in a process wherein at least one color toner image is electrophotographically formed on the transfer layer and then transferred together with said transfer layer to a sheet material to prepare the color proof, wherein said photoconductive layer comprises a polymer (P) selected from the group consisting of the following polymers ($P_1$), ($P_2$), ($P_3$) and ($P_4$); a polymer (Q) selected from the group consisting of the following polymers ($Q_1$) and ($Q_2$); and a polymer (R) containing at least one unit having photo and/or thermosetting group(s), the polymer (P) is present at least in the region near the surface facing said transfer layer, the polymer (P) comprises at least one polymer segment (X) containing not less than 50% by weight of units having fluorine atom(s) and/or silicon atom(s) and at least one polymer segment (Y) containing units having photosetting and/or thermosetting group(s), wherein segment (X) is oriented toward the transfer layer and segment (Y) is oriented toward the inside of the photoconductive layer, and the surface of said photoconductive layer which contacts with the transfer layer has tack strength of not more than 150 gram•force, which is measured by Pressure Sensitive Tape and Sheet Test of JIS Z0237-1980, the polymer ($P_1$):

a linear block copolymer which contains at least one polymer segment (X) containing not less than 50% by weight of units having fluorine atom(s) and/or silicon atom(s) and at least one polymer segment (Y) containing units having photosetting and/or thermosetting group(s);

the polymer ($P_2$):

a star type copolymer which contains at least three AB type block copolymer chains consisting of a polymer segment (X) containing not less than 50% by weight of units having fluorine atom(s) and/or silicon atom(s) and a polymer segment (Y) containing units having photosetting and/or thermosetting group(s), and said block copolymer chains are bonded through an organic group;

the polymer ($P_3$):

a graft copolymer which contains at least one polymer segment (X) containing not less than 50% by weight of units having fluorine atom(s) and/or silicon atom(s) and at least one polymer segment (Y) containing units having photosetting and/or thermosetting group(s);

the polymer ($P_4$):

an AB type or ABA type block copolymer which contains at least one polymer segment (X) containing not less than 50% by weight of units having fluorine atom(s) and/or silicon atom(s) and at least one polymer segment (Y) containing units having photosetting and/or thermosetting group(s), wherein at least one said polymer segment (X) is the following graft type polymer segment (X'), at least one said polymer segment (Y) is the following graft type polymer segment (Y'), or at least one said polymer segment (X) is the following graft type polymer segment (X') and at least one said polymer segment (Y) is the following graft type polymer segment (Y'):

the graft type polymer segment (X'): a polymer segment which has a weight-average molecular weight of $1\times10^3\sim2\times10^4$, and contains at least one macromonomer segment ($M_A$) which contains not less than 50% by weight of units having fluorine atom(s) and/or silicon atom(s);

the graft type polymer segment (Y'): a polymer segment which has a weight-average molecular weight of $1\times10^3\sim2\times10^4$, and contains at least one macromonomer segment ($M_B$) which does not contain units having fluorine atom(s) and/or silicon atom(s);

the polymer ($Q_1$):

a homopolymer or a random copolymer which has a weight-average molecular weight of $1\times10^3\sim2\times10^4$; contains not less than 30% by weight of units represented by the formula I $$—CH(a_1)—C(a_2)(COOR_3)—$$

wherein $a_1$ and $a_2$ each represents independently a hydrogen atom, a halogen atom, a cyano group or a hydrocarbon group, $R_3$ represents a hydrocarbon group; and contains at least one polar group selected from the group consisting of $—PO_3H_2$, $—SO_3H$, —COOH, $—PO(OH)(R_1)$ wherein $R_1$ is a hydrocarbon group or $—OR_2$ ($R_2$ is a hydrocarbon group), and a residue of a cyclic anhydride;

the polymer ($Q_2$):

a linear block copolymer which has a weight-average molecular weight of $1\times10^3\sim2\times10^4$; and contains at least one segment (M) containing not less than 30% by weight of units of said formula I and at least one segment (N) having at least one polar group selected from the group consisting of $—PO_3H_2$, $—SO_3H$, —COOH, $—PO(OH)(R_1)$ wherein $R_1$ is a hydrocarbon group or $—OR_2$ ($R_2$ is a hydrocarbon group), and a residue of a cyclic anhydride.

2. The electrophotographic material for color proofing of claim 1 wherein said polymer (P) is the polymer ($P_1$), and said polymer (Q) is the polymer ($Q_1$).

3. The electrophotographic material for color proofing of claim 1 wherein said polymer (P) is the polymer ($P_2$), and said polymer (Q) is the polymer ($Q_1$).

4. The electrophotographic material for color proofing of claim 1 wherein said polymer (P) is the polymer ($P_3$), and said polymer (Q) is the polymer ($Q_1$).

5. The electrophotographic material for color proofing of claim 1 wherein said polymer (P) is the polymer ($P_4$), and said polymer (Q) is the polymer ($Q_1$).

6. The electrophotographic material for color proofing of claim 1 wherein said polymer (P) is the polymer ($P_1$), and said polymer (Q) is the polymer ($Q_2$).

7. The electrophotographic material for color proofing of claim 1 wherein said polymer (P) is the polymer ($P_2$), and said polymer (Q) is the polymer ($Q_2$).

8. The electrophotographic material for color proofing of claim 1 wherein said polymer (P) is the polymer ($P_3$), and said polymer (Q) is the polymer ($Q_2$).

9. The electrophotographic material for color proofing of claim 1 wherein said polymer (P) is the polymer ($P_4$), and said polymer (Q) is the polymer ($Q_2$).

10. The electrophotographic material for color proofing of claim 1 wherein said polymer (p) is contained in a layer which contacts with the transfer layer in an amount of 1 to 30% by weight based on the total weight of the layer.

11. The electrophotographic material for color proofing of claim 1, wherein said photoconductive layer contains a photoconductive compound and said polymer (Q) is contained in said photoconductive layer in an amount of 1 to 100 parts per 100 parts by weight of the photoconductive compound.

12. The electrophotographic materials for color proofing of claim 1 wherein said polymer (R) is contained in a layer which contacts with the transfer layer in an amount of 5 to 99.1% by weight based on the total weight of the layer.

13. A process for forming a color proof wherein at least one color toner image is electrophotographically formed on an electrophotographic material for color proofing which comprises a substrate, a photoconductive layer and a transfer layer in this order, and then transferred together with said transfer layer to a sheet material to prepare the color proof, wherein said photoconductive layer comprises a polymer (P) selected from the group consisting of the following polymers ($P_1$), ($P_2$), ($P_3$) and ($P_4$); a polymer (Q) selected from the group consisting of the following polymers ($Q_1$) and ($Q_2$); and a polymer (R) containing at least one unit having photo and/or thermosetting group(s), the polymer (P) is present at least in the region near the surface facing said transfer layer, the polymer (P) comprises at least one polymer segment (X) containing not less than 50% by weight of units having fluorine atom(s) and/or silicon atom(s) and at least one polymer segment (Y) containing units having photosetting and/or thermosetting group(s), wherein segment (X) is oriented toward the transfer layer and segment (Y) is oriented toward the inside of the photoconductive layer, and the surface of said photoconductive layer which contacts with the transfer layer has tack strength of not more than 150 gram•force, which is measured by Pressure Sensitive Tape and Sheet Test of JIS Z0237-1980, the polymer ($P_1$):

a linear block copolymer which contains at least one polymer segment (X) containing not less than 50% by weight of units having fluorine atom(s) and/or silicon atom(s) and at least one polymer segment (Y) containing units having photosetting and/or thermosetting group(s);

the polymer ($P_2$):

a star type copolymer which contains at least three AB type block copolymer chains consisting of a polymer segment (X) containing not less than 50% by weight of units having fluorine atom(s) and/or silicon atom(s) and a polymer segment (Y) containing units having photosetting and/or thermosetting group(s), and said block copolymer chains are bonded through an organic group;

the polymer ($P_3$):

a graft copolymer which contains at least one polymer segment (X) containing not less than 50% by weight of units having fluorine atom(s) and/or silicon atom(s) and at least one polymer segment (Y) containing units having photosetting and/or thermosetting group(s);

the polymer ($P_4$):

an AB type or ABA type block copolymer which contains at least one polymer segment (X) containing not less than 50% by weight of units having fluorine atom(s) and/or silicon atom(s) and at least one polymer segment (Y) containing units having photosetting and/or thermosetting group(s), wherein at least one said polymer segment (X) is the following graft type polymer segment (X'), at least one said polymer segment (Y) is the following graft type polymer segment (Y'), or at least one said polymer segment (X) is the following graft type polymer segment (X') and at least one said polymer segment (Y) is the following graft type polymer segment (Y'):

the graft type polymer segment (X'): a polymer segment which has a weight-average molecular weight of $1\times10^3\sim2\times10^4$, and contains at least one macromonomer segment ($M_A$) which contains not less than 50% by weight of units having fluorine atom(s) and/or silicon atom(s);

the graft type polymer segment (Y'): a polymer segment which has a weight-average molecular weight of $1\times10^3\sim2\times10^4$, and contains at least one macromonomer segment ($M_B$) which does not contain units having fluorine atom(s) and/or silicon atom(s);

the polymer ($Q_1$):

a homopolymer or a random copolymer which has a weight-average molecular weight of $1\times10^3\sim2\times10^4$; contains not less than 30% by weight of units represented by the formula I $$—CH(a_1)—C(a_2)(COOR_3)—$$

wherein $a_1$ and $a_2$ each represents independently a hydrogen atom, a halogen atom, a cyano group or a hydrocarbon group, $R_3$ represents a hydrocarbon group; and contains at least one polar group selected from the group consisting of $—PO_3H_2$, $—SO_3H$, —COOH, $—PO(OH)(R_1)$ wherein $R_1$ is a hydrocarbon group or $—OR_2$ ($R_2$ is a hydrocarbon group), and a residue of a cyclic anhydride;

the polymer ($Q_2$):

a linear block copolymer which has a weight-average molecular weight of $1\times10^3\sim2\times10^4$; and contains at least one segment (M) containing not less than 30% by weight of units of said formula I and at least one segment (N) having at least one polar group selected from the group consisting of $—PO_3H_2$, $—SO_3H$, —COOH, $—PO(OH)(R_1)$ wherein $R_1$ is a hydrocarbon group or $—OR_2$ ($R_2$ is a hydrocarbon group), and a residue of a cyclic anhydride.

14. The electrophotographic material for color proofing of claim 1, wherein said organic group has a molecular weight of not more than 1,000.

15. The process of claim 13, wherein said organic group has a molecular weight of not more than 1,000.

16. The process of claim 13, wherein said exposure is conducted based on digital information using a laser beam.

17. The process of claim 13, wherein said photoconductive layer further contains a photosetting agent or a thermosetting agent or both.

* * * * *